(12) United States Patent
Kim et al.

(10) Patent No.: US 12,295,229 B2
(45) Date of Patent: May 6, 2025

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: KyungMin Kim, Paju-si (KR); EunJi Park, Paju-si (KR); YoungIn Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 799 days.

(21) Appl. No.: 17/565,365

(22) Filed: Dec. 29, 2021

(65) Prior Publication Data

US 2022/0208946 A1   Jun. 30, 2022

(30) Foreign Application Priority Data

Dec. 31, 2020  (KR) .................. 10-2020-0189778

(51) Int. Cl.
*H10K 59/131* (2023.01)
*H01L 25/065* (2023.01)
*H01L 25/18* (2023.01)
*H10K 77/10* (2023.01)

(52) U.S. Cl.
CPC ...... *H10K 59/1315* (2023.02); *H01L 25/0655* (2013.01); *H01L 25/18* (2013.01); *H10K 77/111* (2023.02)

(58) Field of Classification Search
CPC .............. H10K 59/1315; H10K 77/111; H01L 25/0655; H01L 25/18

USPC .......................................................... 257/72
See application file for complete search history.

(56) References Cited

U.S. PATENT DOCUMENTS

| | | | |
|---|---|---|---|
| 2013/0093654 A1* | 4/2013 | Park | H10K 59/131 345/82 |
| 2021/0202675 A1* | 7/2021 | Jang | H10K 59/122 |
| 2021/0202686 A1* | 7/2021 | Jeon | H10K 50/19 |

FOREIGN PATENT DOCUMENTS

| | | |
|---|---|---|
| CN | 1734542 A | 2/2006 |
| CN | 103456258 A | 12/2013 |
| CN | 108028264 A | 5/2018 |
| CN | 110828511 A | 2/2020 |
| KR | 20150060009 A | 6/2015 |

\* cited by examiner

*Primary Examiner* — Xia L Cross
(74) *Attorney, Agent, or Firm* — Seed IP Law Group LLP

(57) ABSTRACT

A light emitting display apparatus includes a display area including pixels in first to $m^{th}$ horizontal lines parallel to a first direction over a first substrate, gate lines at the first to $m^{th}$ horizontal lines of the display area, gate control lines between the plurality of pixels, and a gate driving circuit including first to $m^{th}$ stage circuit parts at the display area and coupled to the gate lines and the gate control lines. Each of the first to $m^{th}$ stage circuit parts includes a plurality of branch circuits dispersively between the pixels along the first direction and coupled to the gate control lines, and a branch network coupled to the plurality of branch circuits. Each of the branch network of the first stage circuit unit and the $m^{th}$ stage circuit unit is disposed between two adjacent pixels along the second direction.

20 Claims, 15 Drawing Sheets

LIGHT EMITTING DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2020-0189778 filed on Dec. 31, 2020, which is hereby incorporated by reference as if fully set forth herein.

BACKGROUND

Technical Field

The present disclosure relates to a light emitting display apparatus and a multi-screen display apparatus including the same.

Description of the Related Art

Light emitting display apparatuses are equipped in home appliances or electronic devices such as televisions (TVs), monitors, notebook computers, smartphones, tablet personal computers (PCs), electronic pads, wearable devices, watch phones, portable information devices, navigation devices, and vehicle control display apparatus, and are used as a screen for displaying an image.

Light emitting display apparatuses include a light emitting display panel which includes a plurality of pixels each including a thin film transistor (TFT) connected to a data line and a gate line, a data driving circuit which supplies a data voltage to the data line, and a gate driving circuit which supplies a gate signal to the gate line.

Recently, light emitting display apparatuses having a gate-in panel (GIP) structure are being used where a gate driving circuit is embedded into a non-display area of a display panel simultaneously with a process of manufacturing a TFT of each pixel, for simplifying a configuration of a circuit element, decreasing the manufacturing cost, and reducing a bezel width.

A gate driving circuit having the GIP structure includes a plurality of stages for supplying a gate signal to a plurality of gate lines. The stages operate dependently based on signals supplied through a plurality of gate shift clock lines and a gate start signal line provided in the light emitting display panel.

A light emitting display panel including a gate driving circuit having a GIP structure includes a bezel area due to a gate driving circuit disposed in the non-display region. A light emitting display apparatus of the related art needs a bezel or a mechanism for covering a bezel area of a light emitting display panel.

Recently, multi-screen display apparatuses have been commercialized where a large screen is implemented by arranging the display apparatuses as a lattice type.

However, in a multi-screen display apparatus of the related art, a boundary portion such as a seam is formed between adjacent light emitting display apparatuses due to a bezel area or a bezel of each of a plurality of light emitting display apparatuses. The boundary portion may cause a sense of disconnection (or discontinuity) of an image when one image is being displayed on a total screen of the multi-screen light emitting display apparatus, and due to this, the immersion of a viewer watching the image may be reduced.

BRIEF SUMMARY

Accordingly, the present disclosure is directed to providing a light emitting display apparatus and a multi-screen display apparatus including the same that substantially obviate one or more problems due to limitations and disadvantages of the related art.

Embodiments of the present disclosure are directed to providing a light emitting display apparatus having a zero-bezel width and a multi-screen display apparatus including the same.

Embodiments of the present disclosure are directed to providing a light emitting display apparatus, which has a zero-bezel width and is prevented an operation defect of a gate driving circuit, and a multi-screen display apparatus including the display apparatus.

Embodiments of the present disclosure are directed to providing a light emitting display apparatus, which improves the luminance uniformity of a display area and a multi-screen display apparatus including the display apparatus.

Additional advantages and features of the disclosure will be set forth in part in the description which follows and in part will become apparent to those having ordinary skill in the art upon examination of the following or may be learned from practice of the disclosure.

The technical features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a light emitting display apparatus includes a display area including a plurality of pixels disposed in first to $m^{th}$ horizontal lines parallel to a first direction over a first substrate; a plurality of gate lines disposed at the first to $m^{th}$ horizontal lines of the display area in parallel with the first direction; a plurality of gate control lines disposed between the plurality of pixels along a second direction crossing the first direction; and a gate driving circuit including first to $m^{th}$ stage circuit parts disposed at the display area and selectively coupled to the plurality of gate lines and the plurality of gate control lines, wherein each of the first to $m^{th}$ stage circuit parts includes: a plurality of branch circuits dispersively disposed between the plurality of pixels along the first direction and selectively coupled to the plurality of gate control lines; and a branch network selectively coupled to the plurality of branch circuits, and each of the branch network of the first stage circuit part and the branch network of the $m^{th}$ stage circuit part is disposed between two adjacent pixels along the second direction.

In another embodiment of the present disclosure, a multi-screen display apparatus includes a plurality of display devices disposed along at least one direction of a first direction and a second direction crossing the first direction, each of the plurality of display devices includes a light emitting display apparatus, and the light emitting display apparatus includes a display area including a plurality of pixels disposed in first to $m^{th}$ horizontal lines parallel to the first direction over a first substrate; a plurality of gate lines disposed at the first to $m^{th}$ horizontal lines of the display area in parallel with the first direction; a plurality of gate control lines disposed between the plurality of pixels along the second direction; and a gate driving circuit including first to $m^{th}$ stage circuit parts disposed at the display area and selectively coupled to the plurality of gate lines and the plurality of gate control lines, wherein each of the first to $m^{th}$ stage circuit parts includes: a plurality of branch circuits dispersively disposed between the plurality of pixels along the first direction and selectively coupled to the plurality of gate control lines; and a branch network selectively coupled to the plurality of branch circuits, and each of the branch network of the first stage circuit part and the branch network of the $m^{th}$ stage circuit part is disposed between two adjacent pixels along the second direction.

Some embodiments of the present disclosure may provide a light emitting display apparatus and a multi-screen display apparatus including the same, which have a zeroized bezel width.

Some embodiments of the present disclosure may provide a light emitting display apparatus and a multi-screen display apparatus including the same, which has a zero-bezel width and where an operation defect of a gate driving circuit is prevented.

Some embodiments of the present disclosure may provide a light emitting display apparatus and a multi-screen display apparatus including the same, where a luminance uniformity of a display area is improved.

Some embodiments of the present disclosure may provide a light emitting display apparatus and a multi-screen display apparatus including the same, which display an image without a sense of discontinuity, in displaying one image on a whole screen.

It is to be understood that both the foregoing general description and the following detailed description of the present disclosure are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
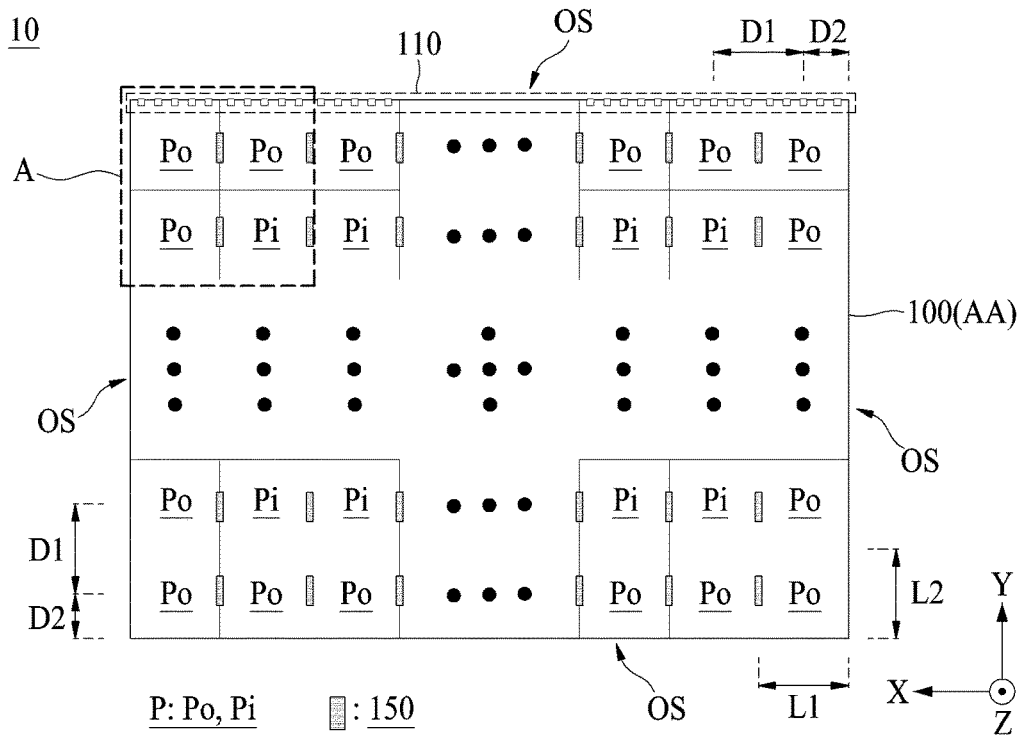
FIG. 1 is a plan view illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure the technical features of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a plan view illustrating a light emitting display apparatus according to an embodiment of the present disclosure.

Referring to FIG. 1, the light emitting display apparatus (or a light emitting display panel) 10 according to an embodiments of the present disclosure may include a first substrate 100 including a display area AA, a plurality of pixels P in the display area AA of the first substrate 100, a first pad part 110, and a gate driving circuit 150 within the display area AA.

The first substrate 100 may be referred to as a first substrate, a base substrate, or a pixel array substrate. For example, the first substrate 100 may be a glass substrate, or may be a thin glass substrate or a plastic substrate, which is bendable or flexible.

The display area AA of the first substrate 100 may be an area which displays an image and may be referred to as an active portion, an active area, a display portion, or a display screen. A size of the display area AA may be the same as or substantially the same as the first substrate 100 (or the light emitting display apparatus or the display panel). For example, a size of the display area AA may be the same as a total size of the first surface of the first substrate 100. Therefore, the display area AA may be implemented (or disposed) on the whole front surface of the first substrate 100, and thus, the first substrate 100 may not include an opaque non-display area which is provided along a periphery portion (or an edge portion) of the first surface to surround all of the display area AA. Accordingly, a whole front surface of the light emitting display apparatus may implement the display area AA.

An end portion (or an outermost portion) of the display area AA may overlap or may be substantially aligned with the outer surface OS of the first substrate 100. For example, with respect to a thickness direction Z of the light emitting display apparatus, a lateral surface (or an end line) of the display area AA may be substantially aligned at a vertical extension line vertically extending from the outer surface OS of the first substrate 100. The lateral surface of the display area AA may not be surrounded by a separate mechanism and may only be abutting ambient air. For example, all lateral surfaces of the display area AA may be provided in a structure which directly contacts air without being surrounded by a separate mechanism. Therefore, the outer surface OS of the first substrate 100 corresponding to the end portion of the display area AA may be surrounded by only air (or abutting ambient air), and thus, the light emitting display apparatus according to an embodiments of the present disclosure may have an air-bezel structure or a non-bezel structure (or a zeroized bezel) where the end portion (or lateral surface) of the display area AA is surrounded by air instead of an opaque non-display area.

The plurality of pixels P may be arranged (or disposed) at the display area AA of the first substrate 100 to have the first interval D1 along a first direction X and a second direction Y. For example, the first direction X may traverse (or overlap or cross) the second direction Y. The first direction X may be a widthwise direction, a horizontal direction, or a first length direction (for example, a widthwise length direction) of the first substrate 100 or the light emitting display apparatus. The second direction Y may be a lengthwise direction or a vertical direction of the first substrate 100 or the light emitting display apparatus. It should be understood that "cross" or "crossing" includes within it the meaning of being perpendicular to or substantially perpendicular to. For example, the first direction X may be perpendicular to the second direction Y, or may be substantially perpendicular to the second direction Y, as illustrated in FIG. 1. It can also be crossing a different angle other than perpendicular.

Each of the plurality of pixels P may be implemented on a plurality of pixel areas defined (e.g., positioned) on the display area AA of the first substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels (or pixel areas) P may all have the same size.

Two pixels P adjacent to each other along the first direction X and the second direction Y may have the same first interval D1 within an error range of a manufacturing process. The first interval D1 may be a pitch (or a pixel pitch) between two adjacent pixels P. For example, the first length L1 or the second length L2 of the pixel P may be referred to as the pixel pitch. For example, the first interval D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P according to an embodiment of the present disclosure may be include a circuit layer including a pixel circuit implemented in the pixel area of the first substrate 100, and a light emitting device layer disposed at the circuit layer and coupled to the pixel circuit. The pixel circuit outputs a data current corresponding to the data signal in response to the data signal and the scan signal supplied from the pixel driving lines disposed in the pixel area. The light emitting device layer may include a light emitting layer that emits light by the data current supplied from the pixel circuit. The pixel driving lines, the pixel circuit, and the light emitting device layer will be described below.

The plurality of pixels P may be divided (or classified) into outermost pixels Po and internal pixels (or inner pixels) Pi.

The outermost pixels Po may be pixels disposed closest to the outer surface OS of the first substrate 100 of the plurality of pixels P.

A second interval D2 between a center portion of each of the outermost pixels Po and the outer surface OS of the first substrate 100 may be half or less of the first interval D1. For example, the second interval D2 may be a distance (or a length) between a center portion of the outermost pixel Po and the outer surface OS of the first substrate 100. For example, the second interval D2 may be a shortest distance (or a shortest length) between a center portion of the outermost pixel Po and the outer surface OS of the first substrate 100.

When the second interval D2 is greater than half of the first interval D1, the first substrate 100 may have a greater size than the display area AA by a difference area between half of the first interval D1 and the second interval D2, and thus, an area between the end of the outermost pixel Po and the outer surface OS of the first substrate 100 may be configured as a non-display area surrounding all of the display area AA. For example, when the second interval D2 is greater than half of the first interval D1, the first substrate 100 may necessarily include a bezel area based on a non-display area surrounding all of the display area AA. On the other hand, when the second interval D2 is half or less of the first interval D1, the end of each of the outermost pixels Po may be aligned (or disposed) with the outer surface OS of the first substrate 100, or the end portion of the display area AA may be aligned (or disposed) with the outer surface OS of the first substrate 100, and thus, the display area AA may be implemented (or disposed) on the whole front surface of the first substrate 100.

The internal pixels Pi may be pixels other than the outermost pixels Po of the plurality of pixels P, or may be pixels surrounding by the outermost pixels Po of the plurality of pixels P. The internal pixels (or second pixels) Pi may be implemented to have a configuration or a structure, which differs from the outermost pixels (or first pixels) Po.

The first pad part 110 may be a first pad part or a front pad part. The first pad part 110 may include a plurality of first pads to receive a data signal, a gate control signal, a pixel driving power, a reference voltage, and a pixel common voltage, or the like from the driving circuit part.

The first pad part 110 may be included within the outmost pixels Po disposed at a first periphery portion of the first surface of the first substrate 100 parallel to the first direction X. That is, the outermost pixels Po disposed at the first periphery portion of the first substrate 100 may include at least one of the plurality of first pads. Therefore, the plurality of first pads may be disposed or included within the display area AA, and thus, a non-display area (or a bezel area) based on the first pad part 110 may not be formed or may not be on the first substrate 100. Therefore, the outermost pixel (or first pixels) Po may include the first pad part 110, and thus, may be implemented to have a configuration or a structure, which differs from the internal pixel (or second pixels) Pi including no the first pad part 110.

For example, when the first pad part 110 is not provided within the outermost pixels Po and is disposed between the outermost pixels Po and the outer surface OS of the first substrate 100, the first substrate 100 may include a non-display area (or a non-display portion) corresponding to an area where the first pad part 110 is provided, and due to the non-display area, the second interval D2 between the outermost pixels Po and the outer surface OS of the first substrate 100 may be greater than half of the first interval D1, all of the first substrate 100 may not be implemented as the display area AA, and a separate bezel (or a separate structure) for covering the non-display area may be needed. On the other hand, the first pad part 110 according to an embodiments of the present disclosure may be disposed between the outermost pixels Po and the outer surface OS of the first substrate 100 to be included within the outermost pixels Po, and thus, a non-display area (or a bezel area) based on the first pad part 110 may not be formed or may not be between the outermost pixels Po and the outer surface OS of the first substrate 100.

The first pad part 110 according to an embodiment of the present disclosure may include a plurality of pixel driving power pads, a plurality of data pads, a plurality of reference voltage pads, and a plurality of pixel common voltage pads, but embodiments of the present disclosure are not limited thereto.

The gate driving circuit 150 may be disposed in the display area AA to supply a scan signal (or a gate signal) to the pixels P disposed on the first substrate 100. The gate driving circuit 150 may simultaneously supply the scan signal to pixels P disposed in a horizontal line parallel to the first direction X. For example, the gate driving circuit 150 may supply at least one scan signal to pixels P disposed in one horizontal line through at least one gate line GL.

The gate driving circuit 150 according to an embodiment of the present disclosure may be implemented with a shift register including a plurality of stage circuit parts. That is, the light emitting display apparatus according to an embodiments of the present disclosure may include a shift register which is disposed in the display area AA of the first substrate 100 to supply the scan signal to the pixel P.

Figure 2A:
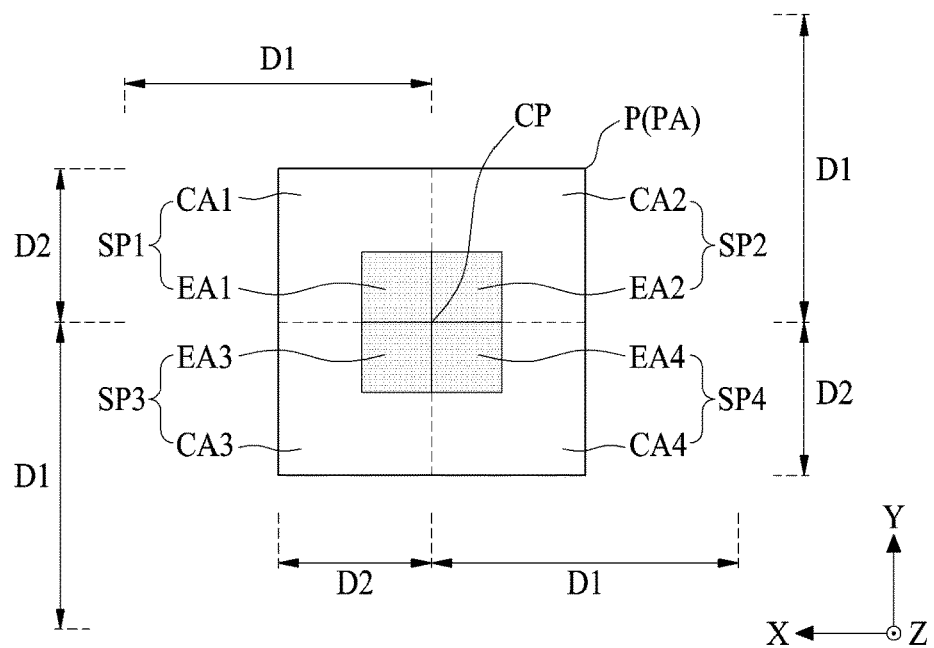
FIG. 2A is a diagram illustrating one pixel according to an embodiment of the present disclosure illustrated in FIG. 1.
Figure 2B:
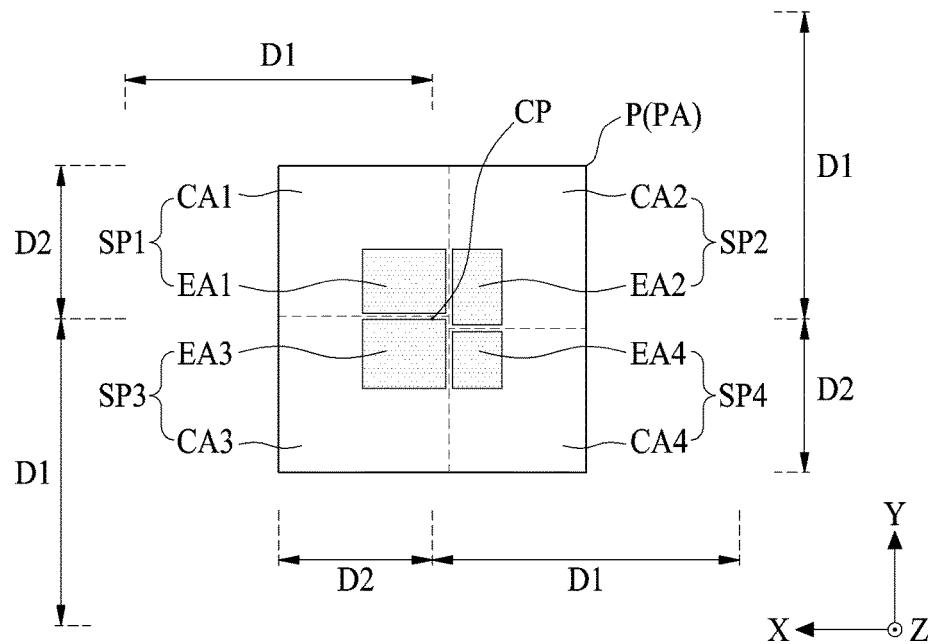
FIG. 2B is a diagram illustrating one pixel according to another embodiment of the present disclosure illustrated in FIG. 1.
Figure 2C:
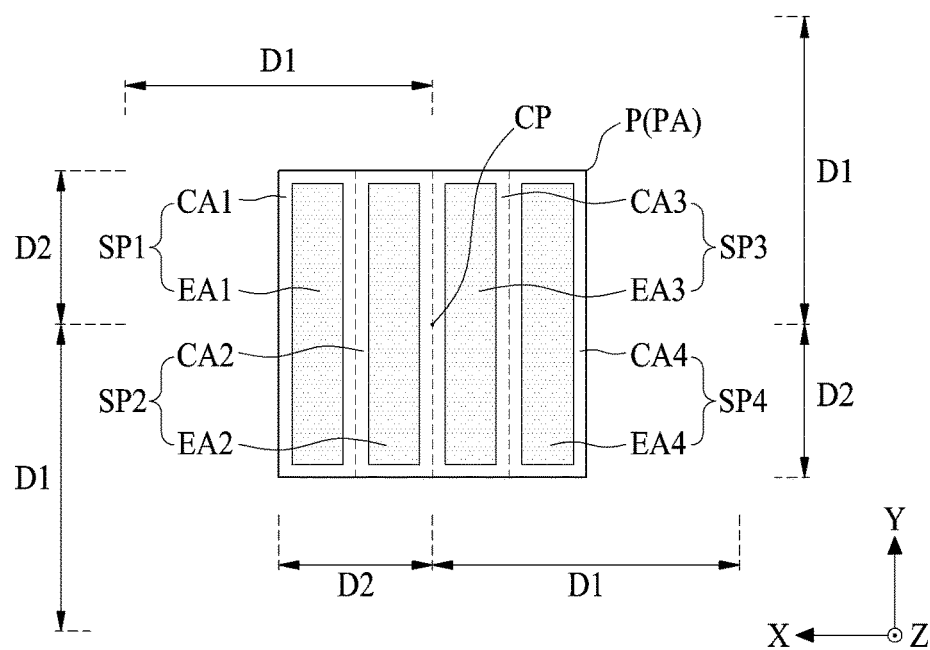
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 according to an embodiment of the present disclosure may be disposed in a 2×2 form or a quad structure. The first to fourth subpixels SP1 to SP4 may each include a plurality of emission areas EA1 to EA4 and a plurality of circuit areas CA1 to CA4. For example, the emission areas EA1 to EA4 may be referred to as an opening area, an opening portion, or an emission portion.

The emission areas EA1 to EA4 of each of the first to fourth subpixels SP1 to SP4 may have a uniform quad structure to have a square shape having the same size (or same area). According to an embodiment of the present disclosure, each of the emission areas EA1 to EA4 having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment of the present disclosure, each of the emission areas EA1 to EA4 having a uniform quad structure may be disposed at the center portion CP of the corresponding subpixel area to have a size which is less than each of four equal division regions of the pixel P.

Referring to FIGS. 1 and 2B, each of the first to fourth subpixels SP1 to SP4 according to another embodiment of the present disclosure may have a non-uniform quad structure having different sizes. For example, each of the emission areas EA1 to EA4 of each of the first to fourth subpixels SP1 to SP4 may have a non-uniform quad structure having different sizes.

A size of each of the first to fourth subpixels SP1 to SP4 having a non-uniform quad structure may be set based on a resolution, emission efficiency, or image quality. According to another embodiment of the present disclosure, when the emission areas EA1 to EA4 have a non-uniform quad structure, of the emission areas EA1 to EA4 of the first to fourth subpixels SP1 to SP4, the emission area EA4 of the fourth subpixel SP4 may have a smallest size, and the emission area EA3 of the third subpixel SP3 may have a largest size. For example, each of the emission areas EA1 to EA4 of each of the first to fourth subpixels SP1 to SP4 having a non-uniform quad structure may be disposed to be concentrated around (or near) the center portion CP of the pixel P.

Referring to FIGS. 1 and 2C, each of the first to fourth subpixels SP1 to SP4 according to another embodiment of the present disclosure may have a 1×4 form or a uniform stripe structure. For example, the emission areas EA1 to EA4 of the first to fourth subpixels SP1 to SP4 may have a 1×4 form or a uniform stripe structure.

The emission areas EA1 to EA4 of the first to fourth subpixels SP1 to SP4 having the uniform stripe structure may each have a rectangular shape which includes a short side parallel to the first direction X and a long side parallel to the second direction Y.

According to an embodiment of the present disclosure, each of the emission areas EA1 to EA4 having the uniform stripe structure may be disposed close to a center portion CP of the pixel P within a corresponding subpixel area to have a size which is less than each of four equal division regions of the pixel P or may be disposed to be concentrated at the center portion of the pixel P.

According to another embodiment of the present disclosure, each of the emission areas EA1 to EA4 having the uniform stripe structure may be disposed at center portion CP of the corresponding subpixel area to have a size which is less than each of four equal division regions of the pixel P.

According to another embodiment of the present disclosure, each of the emission areas EA1 to EA4 having the uniform stripe structure may be disposed at the whole corresponding subpixel area to have the same size as each of four equal division regions of the pixel P.

Alternatively, each of the emission areas EA1 to EA4 of each of the first to fourth subpixels SP1 to SP4 may have a non-uniform stripe structure having different sizes. According to an embodiment of the present disclosure, when the emission areas EA1 to EA4 have a non-uniform stripe structure, of the emission areas EA1 to EA4 of the first to fourth subpixels SP1 to SP4, the emission area EA4 of the fourth subpixel SP4 may have a smallest size, and the emission area EA3 of the third subpixel SP3 may have a largest size, but embodiments of the present disclosure are not limited thereto.

Referring to FIGS. 2A and 2B, the circuit areas CA1 to CA4 of each of the first to fourth subpixels SP1 to SP4 may be disposed around (or near) a corresponding emission area of the emission areas EA1 to EA4. Each of the circuit areas CA1 to CA4 may include a pixel circuit and pixel driving lines for emitting a corresponding subpixel of the first to fourth subpixels SP1 to SP4. For example, the circuit areas CA1 to CA4 may be referred to as a non-emission area, a non-opening area, a non-emission portion, a non-opening portion, or a periphery portion.

Alternatively, in order to increase an aperture ratio of the subpixels SP1 to SP4 corresponding to sizes of the emission areas EA1 to EA4 or decrease the pixel pitch D1 as a resolution of the pixel P is higher, the emission areas EA1 to EA4 of the first to fourth subpixels SP1 to SP4 may extend to the circuit areas CA1 to CA4 to overlap some or all of the circuit areas CA1 to CA4. For example, since the emission areas EA1 to EA4 of the first to fourth subpixels SP1 to SP4 have a top emission structure, each of the emission areas EA1 to EA4 may be arranged to overlap the corresponding circuit areas the circuit areas CA1 to CA4. In this case, each of the emission areas EA1 to EA4 may have a size which is equal to or greater than the corresponding circuit areas CA1 to CA4.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. As an embodiment, the first color may be red, the second color may be blue, the third color may be white, and the fourth color may be green. As another embodiment, some of the first to fourth colors may be the same. For example, the first color may be red, the second color may be first green, the third color may be second green, and the fourth color may be blue.

Optionally, a white subpixel implemented to emit white light of the first to fourth subpixels SP1 to SP4 having a uniform stripe structure or a non-uniform stripe structure may be omitted.

Figure 3:
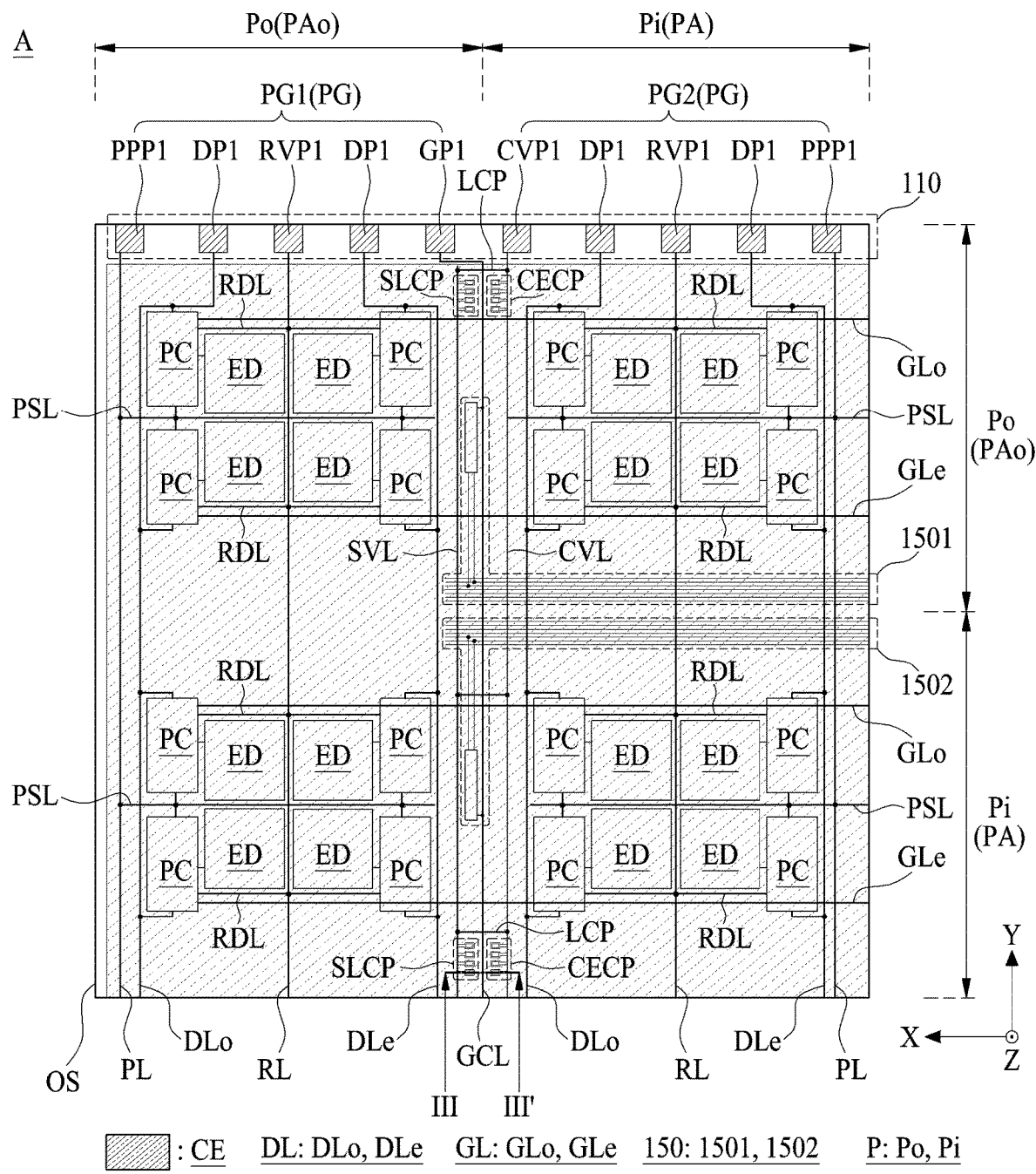
FIG. 3 is an enlarged view of a region 'A' illustrated in FIG. 1.
Figure 4:
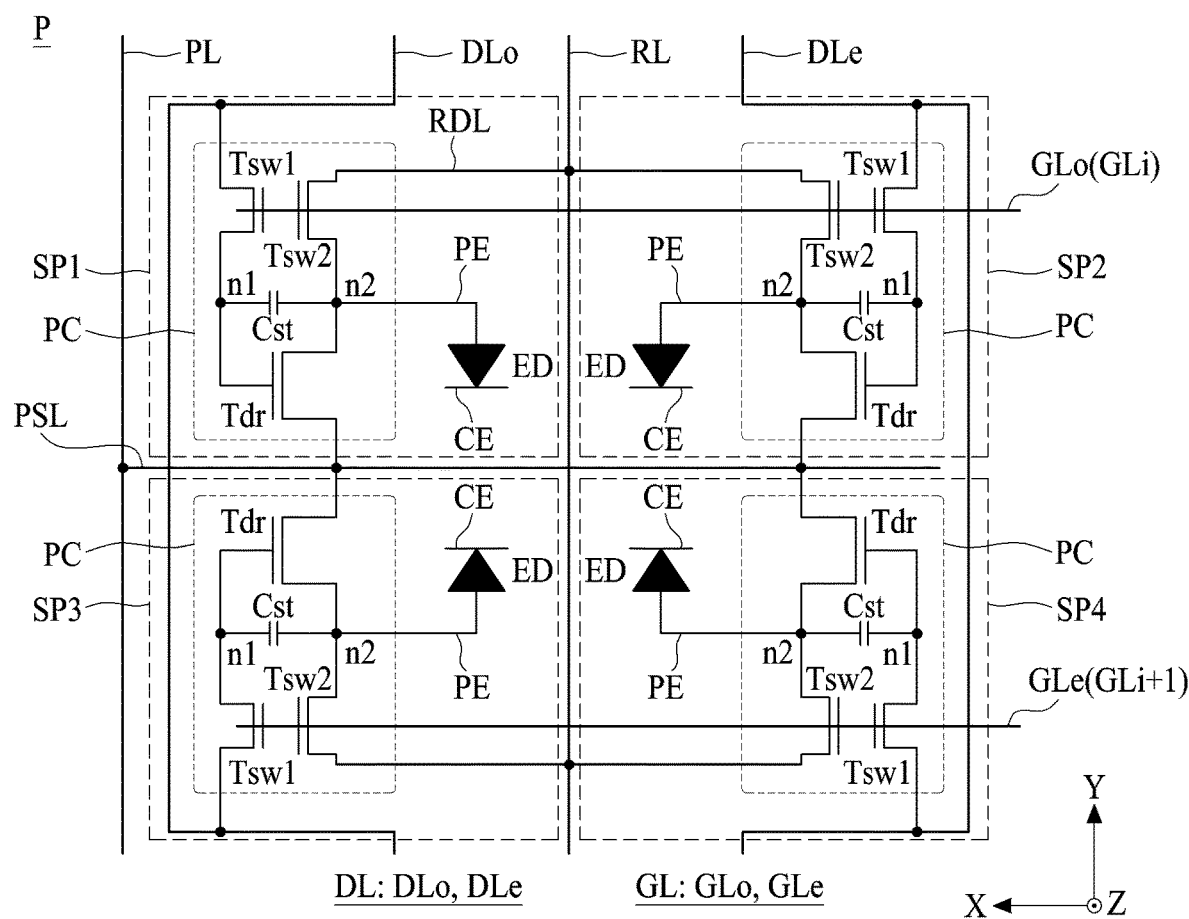
FIG. 4 is an equivalent circuit diagram illustrating one subpixel illustrated in FIGS. 1 and 3.

FIG. 3 is an enlarged view of a region 'A' illustrated in FIG. 1, and FIG. 4 is an equivalent circuit diagram illustrating one subpixel illustrated in FIGS. 1 and 3.

Referring to FIGS. 1, 3, and 4, a first substrate 100 according to an embodiment of the present disclosure may include pixel driving lines DL, GL, PL, CVL, RL, and GCL, a plurality of pixels P, a common electrode CE, a plurality of common electrode connection portions CECP, and a first pad part 110.

In the Figures, where a reference number or letter is provided after which another reference number or letter is provided in parenthesis, this has the meaning that the number and/or letter in parenthesis is the general category or group of the item and the first number prior to it is a specific example of that item within the group. For example, the indication in FIG. 3 of PG1(PG) indicates that PG1, the first pad group, is a specific item within the broad pad group, PG. Similarly, in FIG. 5, the notation 150$m$(150) indicates that each of the circuits 1501, 1502, . . . 1511, 1512 etc. is driving circuit within the broad group of driving circuits 150. Similar meanings apply to similar notations in the Figures and these are provided as examples to illustrate the meaning.

In a somewhat similar fashion, the legend below a particular figure provides a general group and is followed by a colon and then a list of items in that group as shown in the figure. For example, the notation P: Po, Pi below FIG. 1 indicates that P is the general group of a pixel and Po and Pi are specific items within that group of Pixels P. Also, below FIG. 3, the notations DL: DLo and DLe and GL: GLo and GLe indicate that each of these are specific items within the general group of data lines DL and gate lines GL, respectively. Similar meanings apply to similar notations in the Figures and these are provided as examples to illustrate the meaning.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and gate control lines GCL.

The plurality of data lines DL may extend long along a second direction Y and may be disposed spaced apart from one another by a predetermined or selected interval in a display area AA of the first substrate 100 along the first direction X. For example, in the plurality of data lines DL, an odd-numbered data line DLo may be disposed at a first periphery portion of each of a plurality of pixel areas PA arranged at the first substrate 100 along the second direction Y, and an even-numbered data line DLe may be disposed at a second periphery portion of each of the plurality of pixel areas PA arranged at the first substrate 100 along the second direction Y, but embodiments of the present disclosure are not limited thereto.

The plurality of gate lines GL may extend long along the first direction X and may be disposed spaced apart from one another by a predetermined or selected interval in the display area AA of the first substrate 100 along the second direction Y. For example, each of the plurality of gate lines GL may be disposed at each of the first to $m^{th}$ horizontal lines of the display area AA to be parallel to the first direction X. For example, an odd-numbered gate line GLo of the plurality of gate lines GL may be disposed at a third periphery portion of each of the plurality of pixel areas PA arranged on the first substrate 100 along the first direction X. An even-numbered gate line GLe of the plurality of gate lines GL may be disposed at a fourth periphery portion of each of the plurality of pixel areas PA arranged at the first substrate 100 along the first direction X, but embodiments of the present disclosure are not limited thereto.

The plurality of pixel driving power lines PL may extend long along the second direction Y and may be disposed spaced apart from one another by a predetermined or selected interval in the display area AA of the first substrate 100 along the first direction X. For example, in the plurality of pixel driving power lines PL, an odd-numbered pixel driving power line PL may be disposed at a first periphery portion of an odd-numbered pixel area PA with respect to the first direction X, and an even-numbered pixel driving power line PL may be disposed at a second periphery portion of an even-numbered pixel area PA with respect to the first direction X, but embodiments of the present disclosure are not limited thereto.

Two adjacent pixel driving power lines PL of the plurality of pixel driving power lines PL may be coupled to a plurality of power sharing lines PSL disposed in each of the pixel areas PA arranged along the second direction Y. For example, the plurality of pixel driving power lines PL may be electrically coupled to one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may be prevented or minimized or reduced. Accordingly, the light emitting display apparatus according to an embodiments of the present disclosure may prevent or minimize or reduce the degradation in image quality caused by a deviation of the pixel driving power supplied to each of the pixels P arranged at the display area AA.

Each of the plurality of power sharing lines PSL may branch from an adjacent pixel driving power line PL in parallel with the first direction X and may be disposed in a middle region of each pixel area PA, but embodiments of the present disclosure are not limited thereto.

The plurality of pixel common voltage lines CVL may extend long along the second direction Y and may be disposed spaced apart from one another by a predetermined or selected interval in the display area AA of the first substrate 100 along the first direction X. For example, each of the plurality of pixel common voltage lines CVL may be disposed at a first periphery portion of an even-numbered pixel area PA with respect to the first direction X.

The plurality of reference voltage lines RL may extend long along the second direction Y and may be disposed spaced apart from one another by a predetermined or selected interval in the display area AA of the first substrate 100 along the first direction X. Each of the plurality of reference voltage lines RL may be disposed in a center region of each of the pixel areas PA arranged along the second direction Y.

Each of the plurality of reference voltage lines RL may be shared by two adjacent subpixels ((SP1, SP2) (SP3, SP4)) along the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) along the first direction X in each pixel area PA and may be electrically coupled to the two adjacent subpixels ((SP1, SP2) (SP3, SP4)).

Each of the plurality of gate control lines GCL may extend long along the second direction Y and may be disposed spaced apart from one another by a predetermined or selected interval in the display area AA of the first substrate 100 along the first direction X. For example, each of the plurality of gate control lines GCL may be disposed at between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4.

Each of the first to fourth subpixels SP1 to SP4 may include a pixel circuit PC and a light emitting device layer.

The pixel circuit PC according to an embodiment of the present disclosure may be disposed in a circuit area of the pixel area PA and may be coupled to a gate line GLo or GLe adjacent thereto, a data line DLo or DLe adjacent thereto, and the pixel driving power line PL. For example, a pixel circuit PC disposed in a subpixel SP1 may be coupled to an odd-numbered data line DLo and an odd-numbered gate line GLo, a pixel circuit PC disposed in a second subpixel SP2 may be coupled to an even-numbered data line DLe and an odd-numbered gate line GLo, a pixel circuit PC disposed in a third subpixel SP3 may be coupled to an odd-numbered data line DLo and an even-numbered gate line GLe, and a pixel circuit PC disposed in a fourth subpixel SP4 may be coupled to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment of the present disclosure may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GL (GLo or GLe) a first source/drain electrode coupled to a corresponding data line DL (DLo or DLe), and a second source/drain electrode coupled to a gate node n1 of the driving TFT Tdr. The first switching TFT Tsw1 may be turned on by a scan signal supplied through corresponding gate line GL (GLo or GLe) and may transfer a data signal, supplied through corresponding data line DL (DLo or DLe), to the gate electrode n1 of the driving TFT Tdr.

The second switching TFT Tsw2 may include a gate electrode coupled to a corresponding gate line GL (GLo or GLe) a first source/drain electrode coupled to a source node n2 of the driving TFT Tdr, and a second source/drain electrode coupled to a corresponding reference voltage line RL. The second switching TFT Tsw2 may be turned on by a scan signal supplied through the corresponding gate line GL (GLo or GLe) and may transfer a reference voltage, supplied through the corresponding reference line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr. The storage capacitor Cst according to an embodiment of the present disclosure may include a first capacitor electrode coupled to the gate node n1 of the driving TFT Tdr, a second capacitor electrode coupled to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) coupled to the second source/drain electrode of the first switching TFT Tsw1 and the first capacitor electrode of the storage capacitor Cst in common, a first source/drain electrode (or the source node n2) coupled to the first source/drain electrode of the second switching TFT Tsw2, the second capacitor electrode of the storage capacitor Cst, and a pixel electrode PE of the light emitting device layer in common, and a second source/drain electrode (or a drain node) coupled to a corresponding pixel driving power line PL. The driving TFT Tdr may be turned on based on a voltage of the storage capacitor Cst and may control the amount of current flowing from the pixel driving power line PL to the light emitting device layer.

The light emitting device layer may be disposed in an emission area EA of the pixel area PA and electrically coupled to the pixel circuit PC.

The light emitting device layer according to an embodiment of the present disclosure may a pixel electrode PE electrically coupled to the pixel circuit PC, a common electrode CE electrically coupled to the pixel common voltage line CVL, and a self-emitting device ED interposed between the pixel electrode PE and the common electrode CE.

The pixel electrode PE may be referred to as an anode electrode, a reflective electrode, a lower electrode, an anode, or a first electrode, of the self-emitting device ED.

The pixel electrode PE may overlap an emission area EA of each of the plurality of subpixels SP. The pixel electrode PE may be patterned in an island shape and disposed in each subpixel SP, and may be electrically coupled to the first source/drain electrode of the driving TFT Tdr of a corresponding pixel circuit PC. One side of the pixel electrode PE may extend onto the first source/drain electrode of the driving TFT Tdr disposed at a circuit area CA from an emission area EA of the subpixel area and may be electrically coupled to the first source/drain electrode of the driving TFT Tdr through a contact hole provided at the planarization layer over the driving TFT Tdr.

The self-emitting device ED may be disposed over the pixel electrode PE and may directly contact the pixel electrode PE. The self-emitting device ED may be a common layer or a common device layer which is formed in common in each of a plurality of subpixels SP so as not to be distinguished by subpixel SP units. The self-emitting device ED may react on a current flowing between the pixel electrode PE and the common electrode CE to emit white light or blue light.

The common electrode CE may be disposed over the display area AA of the first substrate 100 and may be electrically coupled to the self-emitting device ED each of the plurality of pixels P. For example, the common electrode CE may be disposed over the remaining display area AA of the first substrate 100 except for the first pad part 110 of the first substrate 100.

Each of the plurality of common electrode connection portions CECP may be disposed between the plurality of pixels P respectively overlapping the plurality of pixel common voltage lines CVL and may electrically couple the common electrode CE to each of the plurality of pixel common voltage lines CVL. With respect to the first direction X and the second direction Y, each of the plurality of common electrode connection portions CECP according to an embodiment of the present disclosure may be electrically coupled to each of the plurality of pixel common voltage lines CVL at a portion between two adjacent pixels P and may be electrically coupled to a portion of the common electrode CE, and thus, may electrically couple the common electrode CE to each of the plurality of pixel common voltage lines CVL. For example, the common electrode CE may be coupled to each of the plurality of common electrode connection portions CECP by a side contact structure corresponding to an undercut structure.

With respect to the first direction X and the second direction Y, each of the plurality of common electrode connection portions CECP may be disposed a portion between two pixel groups to electrically couple the common electrode CE to each of the plurality of pixel common voltage lines CVL, and thus, may prevent or minimize or reduce the voltage drop (IR drop) of the pixel common voltage caused by a surface resistance of the common electrode CE. Accordingly, the light emitting display apparatus according to an embodiments of the present disclosure may prevent or minimize or reduce the degradation in image quality caused by a deviation of the pixel common voltage supplied to each of the pixels P arranged in the display area AA.

The first pad part 110 may be disposed at a first periphery portion of the first surface of the first substrate 100 parallel to the first direction X. The first pad part 110 may be disposed at a third periphery portion of each of outermost pixel areas PAo disposed at the first periphery portion of the first substrate 100. With respect to the second direction Y, an end portion of the first pad part 110 may overlap or may be aligned with an end portion of each of the outermost pixel areas PAo. Therefore, the first pad part 110 may be included (or disposed) in each of the outermost pixel areas PAo disposed at the first periphery portion of the first substrate 100, and thus, a non-display area (or a bezel area) based on the first pad part 110 may not be formed or may not be in the first substrate 100.

The first pad part 110 may include a plurality of first pads which are disposed in parallel with one another along the first direction X at the first periphery portion of the first substrate 100. The plurality of first pads may be divided (or classified) into a first data pads DP1, a first gate pads GP1, a first pixel driving power pads PPP1, a first reference voltage pads RVP1, and a first pixel common voltage pads CVP1.

Each of the first data pads DP1 may be individually (or a one-to-one relationship) coupled to one side of each of the plurality of data lines DLo and DLe disposed at the first substrate 100.

Each of the first gate pads GP1 may be individually (or a one-to-one relationship) coupled to one side of each of the gate control lines GCL disposed at the first substrate 100. The first gate pads GP1 according to an embodiment of the present disclosure may be divided (or classified) into a first start signal pad, a plurality of first shift clock pads, a plurality of first carry clock pads, at least one first gate driving power pad, and at least one first gate common power pad. The first gate pads GP1 according to an embodiment of the present disclosure may be further divided (or classified) into a first forward driving signal pad, a first backward driving signal pad, a first external sensing line selection signal pad, a first external sensing reset signal pad, and a first external sensing control signal pad.

Each of the first pixel driving voltage pads PPP1 may be individually (or a one-to-one relationship) coupled to one side end of each of the plurality of pixel driving power lines PL disposed at the first substrate 100.

Each of the first reference voltage pads RVP1 may be individually (or a one-to-one relationship) coupled to one side end of each of the plurality of reference voltage lines RL disposed at the first substrate 100.

Each of the first pixel common voltage pads CVP1 may be individually (or a one-to-one relationship) coupled to one side end of each of the plurality of pixel common voltage lines CVL disposed at the first substrate 100.

The first pad part 110 according to an embodiment of the present disclosure may include a plurality of pad groups PG which are arranged in the order of a first pixel driving power pad PPP1, a first data pad DP1, a first reference voltage pad RVP1, a first data pad DP1, a first gate pad GP1, a first pixel common voltage pad CVP1, a first data pad DP1, a first reference voltage pad RVP1, a first data pad DP1, and a first pixel driving power pad PPP1 along the first direction X. Each of the plurality of pad groups PG may be coupled to two adjacent pixels P disposed along the first direction X. For example, the plurality of pad groups PG may include a first pad group PG1 including one first pixel driving power pad PPP1, one first data pad DP1, one first reference voltage pad RVP1, one first data pad DP1, and one first gate pad GP1 continuously disposed in an odd-numbered pixel area PA along the first direction X, and a second pad group PG2 including one first pixel common voltage pad CVP1, one first data pad DP1, one first reference voltage pad RVP1, one first data pad DP1, and one first pixel driving power pad PPP1 continuously disposed in an even-numbered pixel area PA along the first direction X.

The first substrate 100 according to an embodiments of the present disclosure may further include a plurality of secondary voltage lines SVL and a plurality of secondary line connection portions SLCP. For example, the secondary voltage lines may be referred to as an additional voltage lines or an auxiliary voltage lines, or the like. For example, the secondary line connection portion may be referred to as an additional line connection portion or an auxiliary line connection portion, or the like.

Each of the plurality of secondary voltage lines SVL may extend long along the second direction Y and may be disposed adjacent to a corresponding pixel common voltage line CVL of the plurality of pixel common voltage lines CVL. For example, the one secondary voltage line SVL may be disposed in parallel with the pixel common voltage line CVL with the gate control line GCL therebetween.

Each of the plurality of secondary voltage lines SVL according to an embodiments of the present disclosure may be electrically coupled to an adjacent pixel common voltage line CVL without being electrically coupled to the pixel common voltage pad CVP1 and may be supplied with a pixel common voltage through the adjacent pixel common voltage line CVL. To this end, the first substrate 100 according to an embodiments of the present disclosure may further include a plurality of line connection patterns LCP which electrically couple a pixel common voltage line CVL and a secondary voltage lines SVL adjacent to each other.

Each of the plurality of line connection patterns LCP may be disposed at the first substrate 100 so that the line connection pattern LCP and a pixel common voltage line CVL and a secondary voltage lines SVL adjacent to each other overlap or intersect with each other and may electrically couple a pixel common voltage line CVL and a secondary voltage lines SVL adjacent to each other by using a line jumping structure. For example, one side of each of the plurality of line connection patterns LCP may be electrically coupled to a portion of the secondary voltage lines SVL through a first line contact hole formed at an insulation layer over the secondary voltage lines SVL, and the other side of each of the plurality of line connection patterns LCP may be electrically coupled to a portion of the pixel common voltage line CVL through a second line contact hole formed at the insulation layer over the pixel common voltage line CVL.

Each of the plurality of secondary line connection portions SLCP may electrically couple the common electrode CE to each of the plurality of secondary voltage lines SVL at between the plurality of pixels P overlapping each of the plurality of secondary voltage lines SVL. With respect to the second direction Y, each of the plurality of secondary line connection portions SLCP according to an embodiment of the present disclosure may be electrically coupled to each of the plurality of secondary voltage lines SVL at a portion between two adjacent pixels P, and may be electrically coupled to a portion of the common electrode CE, and thus, may electrically couple the common electrode CE to each of the plurality of secondary voltage lines SVL. Therefore, the common electrode CE may be additionally coupled to each of the plurality of secondary voltage lines SVL through the secondary line connection portions SLCP. Accordingly, the light emitting display apparatus according to an embodiment of the present disclosure may prevent or minimize or reduce the degradation in image quality caused by a deviation of the pixel common voltage supplied to each of the pixels P arranged in the display area AA. Also, in the light emitting display apparatus according to an embodiments of the present disclosure, although the pixel common voltage pad CVP coupled to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

According to an embodiment of the present disclosure, the plurality of secondary line connection portions SLCP may be implemented or formed in a symmetric structure with each of the plurality of common electrode connection portions CECP with respect to the gate control line GCL. For example, with respect the first direction X, adjacent common electrode connection portions CECP and secondary line connection portions SLCP may be implemented or formed in a symmetric structure with respect to a boundary portion between two adjacent pixels P along the first direction X. Therefore, each of the plurality of pixels P disposed in the display area AA may include at least one of the common electrode connection portions CECP and the secondary line connection portions SLCP. For example, each of pixels P disposed in each of a first pixel column and a last pixel column parallel to the second direction Y may include only the secondary line connection portion SLCP. Also, each of pixels P disposed in the other pixel columns except the first pixel column and the last pixel column may include the common electrode connection portions CECP and the secondary line connection portion SLCP.

Figure 5:
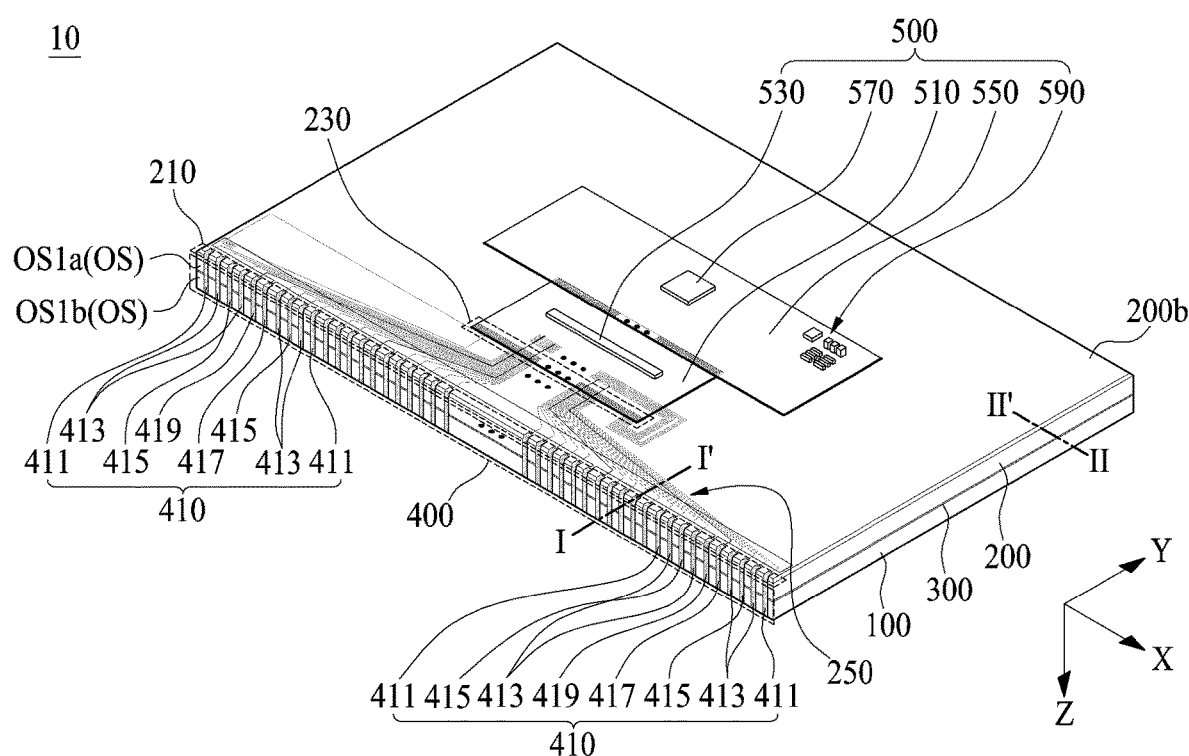
FIG. 5 is a diagram illustrating a rear surface of a light emitting display apparatus according to an embodiment of the present disclosure.
Figure 6:
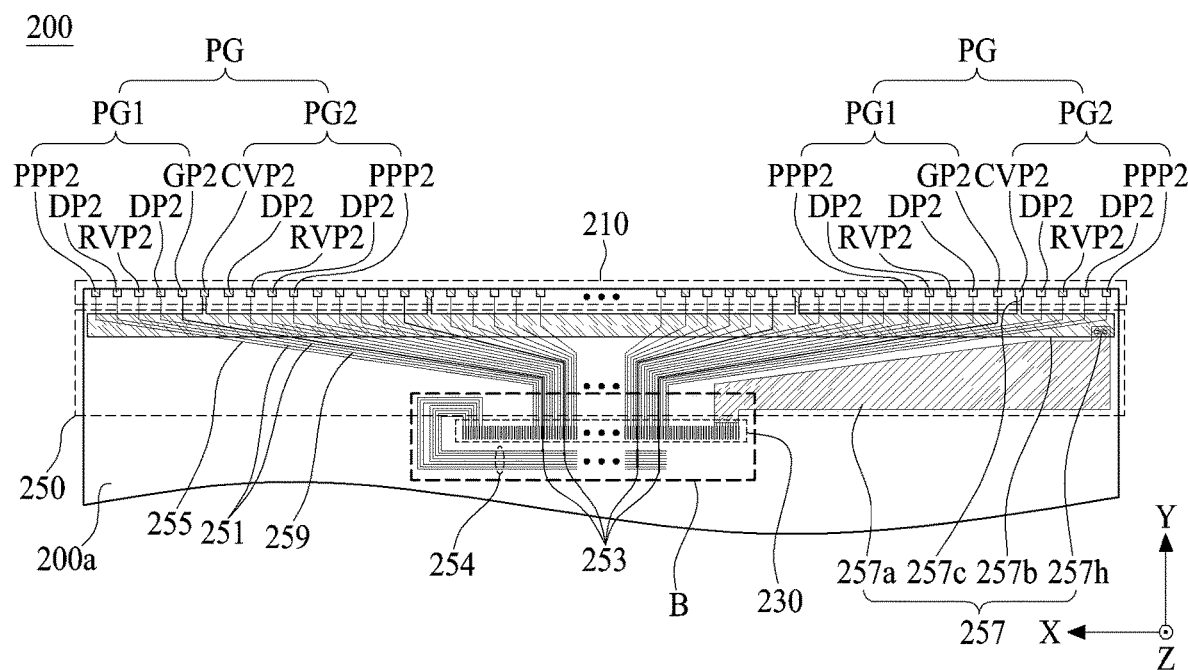
FIG. 6 is a diagram illustrating a second pad part, a third pad part, and a link line portion illustrated in FIG. 5.
Figure 7:
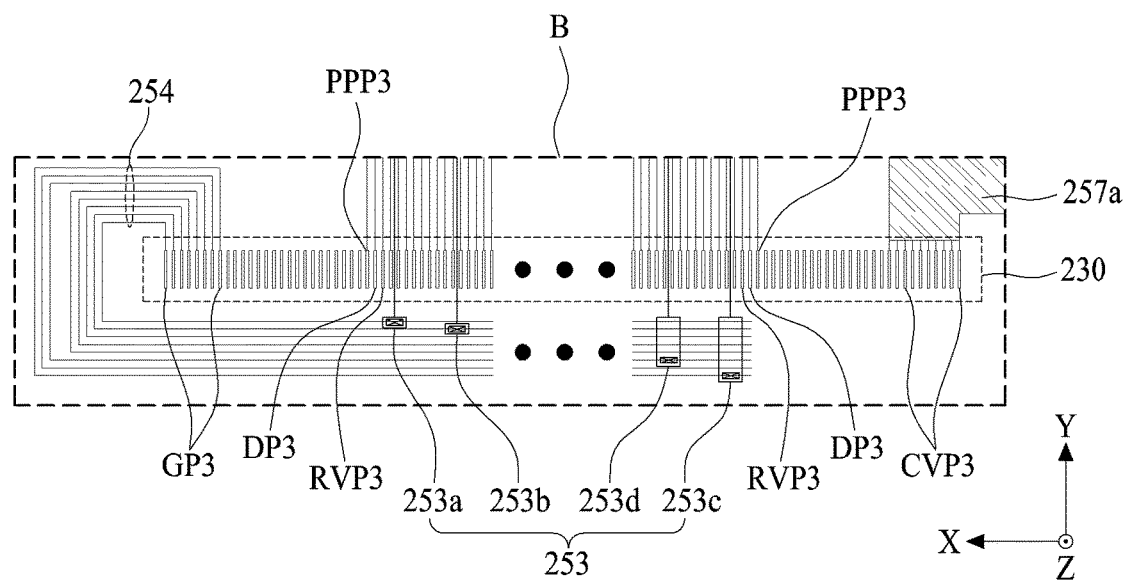
FIG. 7 is an enlarged view of a region 'B' illustrated in FIG. 6.

FIG. 5 is a diagram illustrating a rear surface of a light emitting display apparatus according to an embodiment of the present disclosure, FIG. 6 is a diagram illustrating a second pad part, a third pad part, and a link line portion illustrated in FIG. 5, and FIG. 7 is an enlarged view of a region 'B' illustrated in FIG. 6. FIGS. 5 to 7 illustrates an embodiment where a wiring substrate is additionally provided in the light emitting display apparatus illustrated in FIGS. 1 to 4.

Referring to FIGS. 3, and 5 to 7, the light emitting display apparatus according to an embodiment of the present disclosure may include a first substrate 100, a second substrate 200, a coupling member 300, and a routing portion 400.

The first substrate 100 may be referred to as a display substrate, a pixel array substrate, an upper substrate, a front substrate, or a base substrate. The first substrate 100 may be a glass substrate, or may be a thin glass substrate or a plastic substrate, which is bendable or flexible.

The first substrate 100 may be the substrate 100 including the gate driving circuit 150 within the plurality of pixels P, the first pad part 110, and the display area AA illustrated in FIGS. 1 to 4, and thus, their repetitive descriptions may be omitted.

The second substrate 200 may be referred to as a wiring substrate, a line substrate, a link substrate, a lower substrate, a rear substrate, or link glass. The second substrate 200 may be a glass substrate, or may be a thin glass substrate or a plastic substrate, which is bendable or flexible. For example, the second substrate 200 may include the same material as the first substrate 100. A size of the second substrate 200 may be the same as or substantially the same as the first substrate 100, but embodiments of the present disclosure are not limited thereto, the size of the second substrate 200 may have a smaller than the first substrate 100. For example, the second substrate 200 may be configured to have the same size as the first substrate 100 in order to maintain or secure the stiffness of the first substrate 100.

The second substrate 200 may include a second pad part 210, at least one third pad part 230, and a link line portion 250.

The second pad part 210 may be disposed at one periphery portion (or a first rear periphery portion) of a rear surface 200b of the second substrate 200 overlapping the first pad part 110 disposed on a front surface of the first substrate 100.

The second pad part 210 may include a plurality of second pads which are disposed in parallel at a first periphery portion of the second substrate 200 along the first direction X.

The plurality of second pads according to an embodiment of the present disclosure may be divided (or classified) into a plurality of second pixel driving power pads PPP2 respectively overlapping the first pixel driving power pads PPP1, a plurality of second data pads DP2 respectively overlapping the first data pads DP1, a plurality of second reference voltage pads RVP2 respectively overlapping the first reference voltage pads RVP1, a plurality of second gate pads GP2 respectively overlapping the first gate pads GP1, and a plurality of second pixel common voltage pads CVP2 respectively overlapping the first pixel common voltage pads CVP1.

The plurality of second gate pads GP2 according to an embodiment of the present disclosure may be divided (or classified) into a second start signal pad, a plurality of second shift clock pads, a plurality of second carry clock pads, at least one second gate driving power pad, and at least one second gate common power pad. The plurality of second gate pads GP2 according to an embodiment of the present disclosure may be divided (or classified) into a second forward driving signal pad, a second backward driving signal pad, a second external sensing line selection signal pad, a second external sensing reset signal pad, and a second external sensing control signal pad.

The plurality of second pads according to an embodiment of the present disclosure may be disposed along the first direction X so as to be equal to (or match) an arrangement order of first pads disposed in the first pad part 110. For example, the second pad part 210 may include a plurality of pad groups PG arranged in the order of the second pixel driving power pad PPP2, the second data pad DP2, the second reference voltage pad RVP2, the second data pad DP2, the second gate pad GP2, the second pixel common voltage pad CVP2, the second data pad DP2, the second reference voltage pad RVP2, the second data pad DP2, and the second pixel driving power pad PPP2 along the first direction X. Each of the plurality of pad groups PG may be coupled to two adjacent pixels P arranged along the first direction X. For example, each of the plurality of pad groups PG may include a first pad group PG1, including the second pixel driving power pad PPP2, the second data pad DP2, the second reference voltage pad RVP2, the second data pad DP2, and the second gate pad GP2 which are continuously arranged in an odd-numbered pixel area PA along the first direction X, and a second pad group PG2 including the second pixel common voltage pad CVP2, the second data pad DP2, the second reference voltage pad RVP2, the second data pad DP2, and the second pixel driving power pad PPP2 which are continuously arranged in an even-numbered pixel area PA along the first direction X At least one third pad part 230 may be disposed on the rear surface 200b of the second substrate 200. For example, the at least one third pad part 230 may be disposed at a center portion adjacent to the first periphery portion of the rear surface 200b of the second substrate 200.

The at least one third pad part 230 according to an embodiment of the present disclosure may include a plurality of third pads (or input pads) which are arranged spaced apart from one another by a certain interval along the first direction X. The plurality of third pads may include third pixel driving power pads PPP3, third data pads DP3, third reference voltage pads RVP3, third gate pads GP3, and at least one third pixel common voltage pad CVP3.

The at least one third pad part 230 may include a first region (or a center region) including the third pixel driving power pads PPP3 and the third data pads DP3, a second area (or one area) including the third gate pads GP3, and a third area (or the other area) including the at least one third pixel common voltage pad CVP3. For example, the at least one third pad part 230 may further include a first dummy area which is disposed between the first area and the second area and includes a plurality of dummy pads and a second dummy area which is disposed between the first area and the third area and includes a plurality of dummy pads. For example, the third pixel driving power pads PPP3, the third data pads DP3, and the third reference voltage pads RVP3 disposed in the first area of the at least one third pad part 230 may be arranged in parallel in the same (matching) order as an arrangement order of the second pixel driving power pad PPP2, the second data pad DP2, and the second reference voltage pad RVP2 disposed in the second pad part 210.

The third gate pads GP3 may be disposed in parallel in the second area of the at least one third pad part 230 to have a predetermined or selected interval along the first direction X.

The third gate pads GP3 according to an embodiment of the present disclosure may be divided (or classified) into a third start signal pad, a plurality of third shift clock pads, a plurality of third carry clock pads, at least one third gate driving power pad, and at least one third gate common power pad. The plurality of third gate pads GP3 according to an embodiment of the present disclosure may be further divided (or classified) into a third forward driving signal pad, a third backward driving signal pad, a third external sensing line selection signal pad, a third external sensing reset signal pad, and a third external sensing control signal pad.

The link line portion 250 may be disposed between the second pad part and the at least one third pad part 230. The link line portion 250 may include a plurality of link lines which respectively couple the second pads of the second pad part 210 to the third pads of the at least one third pad part 230 individually (or in a one-to-one relationship).

The plurality of link lines according to an embodiment of the present disclosure may be divided (or classified) into data link lines 251, gate link lines 253, pixel driving power link lines 255, a pixel common power link line 257, and reference voltage link lines 259.

The data link lines 251 may be configured to electrically connect (or couple) the second data pads DP2 to the third data pads DP3 in a one-to-one relationship. The gate link lines 253 may be configured to electrically connect (or couple) the second gate pads GP2 to the third gate pads GP3 in a one-to-one relationship. The pixel driving power link lines 255 may be configured to electrically connect (or couple) the second pixel driving power pads PPP2 to the third pixel driving power pads PPP3 in a one-to-one relationship. The pixel common power link line 257 may be configured to electrically connect (or couple) each of the second pixel driving power pads PPP2 to the at least one third pixel common voltage pad CVP3 in common. The reference voltage link lines 259 may be configured to electrically connect (or couple) the second reference voltage pads RVP2 to the third reference voltage pads RVP3 in a one-to-one relationship.

The third gate link lines 253 according to an embodiment of the present disclosure may be divided (or classified) into a start signal link line 253a, a plurality of shift clock link lines 253b, at least one gate driving power link line 253c, and at least one gate common power link line. The plurality of gate link lines 253 may be further divided (or classified) into link lines for a third forward driving signal pad, a third reverse driving signal, a third external sensing line selection signal, a third external sensing reset signal, and a third external sensing control signal.

The link line portion 250 according to an embodiment of the present disclosure may further include a plurality of gate control signal transfer lines 254.

The gate control signal transfer lines 254 may selectively connect (or couple) the gate link lines 253 to the third gate pads GP3 disposed in the at least one third pad part 230, respectively.

The gate control signal transfer lines 254 may be electrically and respectively connected (or coupled) to the third gate pads GP3, and moreover, may bypass one side of the at least one third pad part 230 and may be selectively and respectively connected (or coupled) to the gate link lines 253. For example, the gate control signal transfer lines 254 and the gate link lines 253 may be disposed on different layers on the rear surface 200b of the second substrate 200, and the other side of each of the gate link lines 253 may be electrically connected (or coupled) to a corresponding gate control signal transfer line through a link contact hole. Optionally, the other side of each of the gate link lines 253 may pass through a region between two adjacent third pads not to overlap the third pad disposed in the at least one third pad part 230 and may be selectively connected (or coupled) to the gate control signal transfer lines 254. In this case, the gate control signal supplied to the gate link lines 253 may be maintained at the original voltage level without varying (or changing) based on a signal supplied to the third pad.

The pixel common power link line 257 according to an embodiment of the present disclosure may include a first common link line 257a, a second common link line 257b, and a plurality of third common link lines 257c.

The first common link line 257a may be commonly connected (or coupled) to the at least one third pixel common power pad CPP3 disposed in the at least one third pad part 230. For example, the first common link line 257a may be disposed at one corner portion of the rear surface 200b of the second substrate 200.

The first common link line 257a may be disposed or formed over the rear surface 200b of the second substrate 200 between the second pad part 210 and the at least one third pad part 230 to have a relatively wide size (or area) so that the voltage drop of the pixel common power applied thereto is reduced or minimized. A size of the first common link line 257a according to an embodiment of the present disclosure may progressively increase in a direction from one side thereof to the other side thereof. For example, a size of the first common link line 257a may progressively increase in a direction from the at least one third pad part 230 to the outer surface OS of the second substrate 200.

In the first common link line 257a according to an embodiment of the present disclosure, one side thereof adjacent to the third pad part 230 may be commonly connected (or coupled) to the at least one third pixel common power pad CPP3 disposed at the at least one third pad part 230, and the other side thereof adjacent to the second pad part 210 may overlap the second common link line 257b. For example, the first common link line 257a may be disposed over the rear surface 200b of the second substrate 200 together with the data link line 251 or the gate link line 253.

The second common link line 257b may be disposed at the first periphery portion of the rear surface 200b of the second substrate 200 to overlap the first periphery portion of the first substrate 100 and to be adjacent to the second pad part 210. The second common link line 257b according to an embodiment of the present disclosure may be disposed in parallel with the first direction X to face all pads disposed at the second pad part 210. For example, the second common link line 257b may have a bar shape having a relatively wide size (or area), for reducing or minimizing the voltage drop of the pixel common voltage applied to the pixel common power link line 257.

The second common link line 257b may overlap each of the plurality of pixel driving power link lines 255, the plurality of data link lines 251, and the plurality of gate link lines 253. For example, the data link lines 251 may be disposed over the gate link lines 253, and the second common link line 257b may be disposed over the pixel driving power link lines 255. Also, the pixel driving power link lines 255 may be disposed on the gate link lines 253 together with the data link lines 251.

One side of the second common link line 257b may be electrically connected (or coupled) to the other side of the first common link line 257a through a link contact hole 257h.

Each of the plurality of third common link lines 257c may be connected to the second common link line 257b in common and may be connected (or coupled) to each of the second pixel common power pads CVP2 in common. Each of the plurality of third common link lines 257c according to an embodiment of the present disclosure may extend (or protrude) in a direction from the other side of the second common link line 257b to the plurality of second pixel common power pads CVP2 disposed at the second pad part 210 and may be electrically connected (or coupled) to a corresponding second pixel common power pad of the plurality of second pixel common power pads CVP2. For example, each of the plurality of third common link lines 257c may be formed together with the second common link line 257b. Also, the plurality of third common link lines 257c and the second common link line 257b may be formed together with the pads of the second pad part 210.

The second substrate 200 may be coupled (or connected) to a second surface of the first substrate 100 by using the coupling member 300. The coupling member 300 may be interposed between the first substrate 100 and the second substrate 200. Thus, the first substrate 100 and the second substrate 200 may be opposite-bonded to each other by the coupling member 300.

The routing portion 400 may be disposed to surround the outer surface OS of the first substrate 100 and the outer surface OS of the second substrate 200. For example, the routing portion 400 may disposed at each of the first outer surface (or one surface) OS1a of the outer surface OS of the first substrate 100 and the first outer surface (or one surface) OS1b of the outer surface OS of the second substrate 200. For example, the routing portion 400 may be referred to as a side wiring portion, an edge wiring portion, a side routing portion, an edge routing portion, a printing line portion, a printing wiring portion, or a wiring portion, or the like.

The routing portion 400 according to an embodiment of the present disclosure may include a plurality of routing lines which are disposed at each of the first outer surface OS1a of the first substrate 100 and the first outer surface OS1b of the second substrate 200.

Each of the plurality of routing lines 410 may be formed to surround the first pad part 110, the first outer surface OS1a of the first substrate 100, the first outer surface OS1b of the second substrate 200, and the second pad part 210, and may be electrically connected (or coupled) to the first pad part 110 and the second pad part 210 in one-to-one relationship. According to an embodiment of the present disclosure, each of the plurality of routing lines 410 may be formed by a printing process using a conductive paste. According to another embodiment of the present disclosure, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

Each of the plurality of routing lines 410 may be electrically connected (or coupled) to each of the first pads 111 of the first pad part 110 and the second pads 211 of the second pad part 210 in one-to-one relationship. For example, each of the plurality of routing lines 410 may be spaced apart from each other along the first direction X.

The plurality of routing lines 410 according to an embodiment of the present disclosure may be divided (classified) into a plurality of pixel power routing lines 411, a plurality of data routing lines 413, a plurality of reference voltage routing lines 415, a plurality of gate routing lines 417, and a plurality of pixel common voltage routing lines 419.

The plurality of pixel power routing lines 411 may be electrically connected (or coupled) to the plurality of first pixel driving power pads PPP1 of the first pad part 110 and the plurality of second pixel driving power pads PPP2 of the second pad part 210 in a one-to-one relationship.

The plurality of data routing lines 413 may be electrically coupled to the plurality of first data pads DP1 of the first pad part 110 and the plurality of second data pads DP2 of the second pad part 210 in a one-to-one relationship.

The plurality of reference voltage routing lines 415 may be electrically connected (or coupled) to the plurality of first reference voltage pads RVP1 of the first pad part 110 and the plurality of second reference voltage pads RVP2 of the second pad part 210 in a one-to-one relationship.

The plurality of data routing lines 417 may be electrically coupled to the plurality of first gate pads GP1 of the first pad part 110 and the plurality of second gate pads GP2 of the second pad part 210 in a one-to-one relationship.

The plurality of pixel common voltage routing lines 419 may be electrically connected (or coupled) to the plurality of first pixel common voltage pads CVP1 of the first pad part 110 and the plurality of second pixel common voltage pads CVP2 of the second pad part 210 in a one-to-one relationship.

The light emitting display apparatus according to an embodiment of the present disclosure may further include a driving circuit part 500.

The driving circuit part 500 may drive (or emit light) the pixels P disposed on the first substrate 100 based on digital video data and a timing synchronization signal supplied from a display driving system to allow the display area AA to display an image corresponding to image data. The driving circuit part 500 may be connected (or coupled) to the at least one third pad part 230 disposed at the rear surface 200b of the second substrate 200 and may output, to the at least one third pad part 230, a data signal, a gate control signal, and a driving power for driving (or emitting light) the pixels P disposed at the first substrate 100.

The driving circuit part 500 according to an embodiment of the present disclosure may include a flexible circuit film 510, a driving integrated circuit (IC) 530, a printed circuit board (PCB) 550, a timing controller 570, and a power circuit 590.

The flexible circuit film 510 may be connected (or coupled) to the at least one third pad part 230 disposed at the rear surface 200b of the second substrate 200.

The driving IC 530 may be mounted on the flexible circuit film 510. The driving IC 530 may receive subpixel data and a data control signal provided from the timing controller 570, and convert the subpixel data into an analog data signal based on the data control signal to supply the analog data signal to a corresponding data line DL. The data signal may be supplied to a corresponding third data pads DP3 in the at least one third pad part 230 through the flexible circuit film 510.

The driving IC 530 may sense a characteristic value of a driving TFT disposed in the subpixel SP through the plurality of reference voltage lines RL (or pixel sensing line) disposed at the substrate 100, generate sensing raw data corresponding to a sensing value for each subpixel, and provide the sensing raw data for each subpixel to the timing controller 570.

The PCB 550 may be coupled to the other side periphery portion of the flexible circuit film 510. The PCB 550 may transfer a signal and power between elements of the driving circuit part 500.

The timing controller 570 may be mounted on the PCB 550 and may receive the digital video data and the timing synchronization signal provided from the display driving system through a user connector disposed on the PCB 550. Alternatively, the timing controller 570 may not be mounted on the PCB 550 and may be implemented in the display driving system or may be mounted on a separate control board connected between the PCB 550 and the display driving system.

The timing controller 570 may align the digital video data based on the timing synchronization signal to generate pixel data matching a pixel arrangement structure disposed in the display area AA and may provide the generated pixel data to the driving IC 530.

The timing controller 570 may generate each of the data control signal and the gate control signal based on the timing synchronization signal, control a driving timing of the driving IC 530 based on the data control signal, and control a driving timing of the gate driving circuit 150 based on the gate control signal. For example, the timing synchronization signal may include a vertical synchronization signal, a horizontal synchronization signal, a data enable signal, and a main clock (or a dot clock).

The data control signal according to an embodiment of the present disclosure may include a source start pulse, a source shift clock, and a source output signal, or the like. The data control signal may be supplied to the driving IC 530 through the flexible circuit film 510.

The gate control signal according to an embodiment of the present disclosure may include a start signal (or a gate start pulse), a plurality of scan clocks where phases thereof are sequentially shifted, and a plurality of carry clocks where phases thereof are sequentially shifted. The gate control signal may further include a forward driving signal and a backward driving signal, or the like. The gate control signal may further include an external sensing line selection signal, an external sensing reset signal, and an external sensing control signal. The gate control signal may be supplied to the gate driving circuit 150 through the flexible circuit film 510, the at least one third pad part 230, the link line part 250, the second pad part 210, the routing portion 400, the first pad part 110, and gate control limes GCL.

The timing controller 570 may drive each of the driving IC 530 and the gate driving circuit 150 based on an external sensing mode during a predetermined or selected external sensing period, generate compensation data of each subpixel for compensating for a characteristic variation of the driving TFT of each subpixel based on the sensing raw data provided from the driving IC 530, and modulate pixel data of each subpixel based on the generated compensation data of each subpixel. For example, the timing controller 570 may drive each of the driving IC 530 and the gate driving circuit 150 based on the external sensing mode for each external sensing period corresponding to a blank period (or a vertical blank period) of the vertical synchronization signal. For example, the external sensing mode may be performed in a process of powering on the display apparatus, a process of powering off the display apparatus, a process of powering off the display apparatus after being driven for a long time, or a blank period of a frame which is set in real time or periodically.

The timing controller 570 according to an embodiment of the present disclosure may store the sensing raw data of each subpixel, provided from the driving IC 530, in a storage circuit based on the external sensing mode. Also, in a display mode, the timing controller 570 may correct pixel data which is to be supplied to each subpixel, based on the sensing raw data stored in the storage circuit and may provide corrected pixel data to the driving IC 530. Here, sensing raw data of each subpixel may include sequential variation information about each of a driving TFT and a self-emitting device, which are disposed in a corresponding subpixel. Therefore, in the external sensing mode, the timing controller 570 may sense a characteristic value (for example, a threshold voltage or mobility) of a driving TFT disposed in each subpixel and based thereon, may correct pixel data which is to be supplied to each subpixel, thereby minimizing or preventing the degradation in image quality caused by a characteristic value deviation of driving TFTs of a plurality of subpixels. The external sensing mode of a display apparatus may be technology known to those skilled in the art, and thus, its repetitive description is omitted. For example, the display apparatus according to an embodiment of the present disclosure may sense a characteristic value of the driving TFT disposed in each subpixel P based on a sensing mode disclosed in Korean Patent Publication No. 10-2016-0093179, 10-2017-0054654, or 10-2018-0002099.

The power circuit 590 may be mounted on the PCB 550 and may generate various source voltages needed for displaying an image on the pixels P by using an input power supplied from the outside to provide the generated source voltage to a corresponding circuit. For example, the power circuit 590 may generate and output a logic source voltage needed for driving of each of the timing controller 570 and the driving IC 530, the plurality of reference gamma voltages provided to the driving IC 530, and at least one gate driving power and at least one gate common power needed for driving of the gate driving circuit 150. Also, the power circuit 590 may generate and output the pixel driving power and the pixel common voltage, but embodiments of the present disclosure are not limited thereto. For example, the driving IC 530 may generate and output the pixel driving power and the pixel common voltage based on the plurality of reference gamma voltages.

Figure 8:
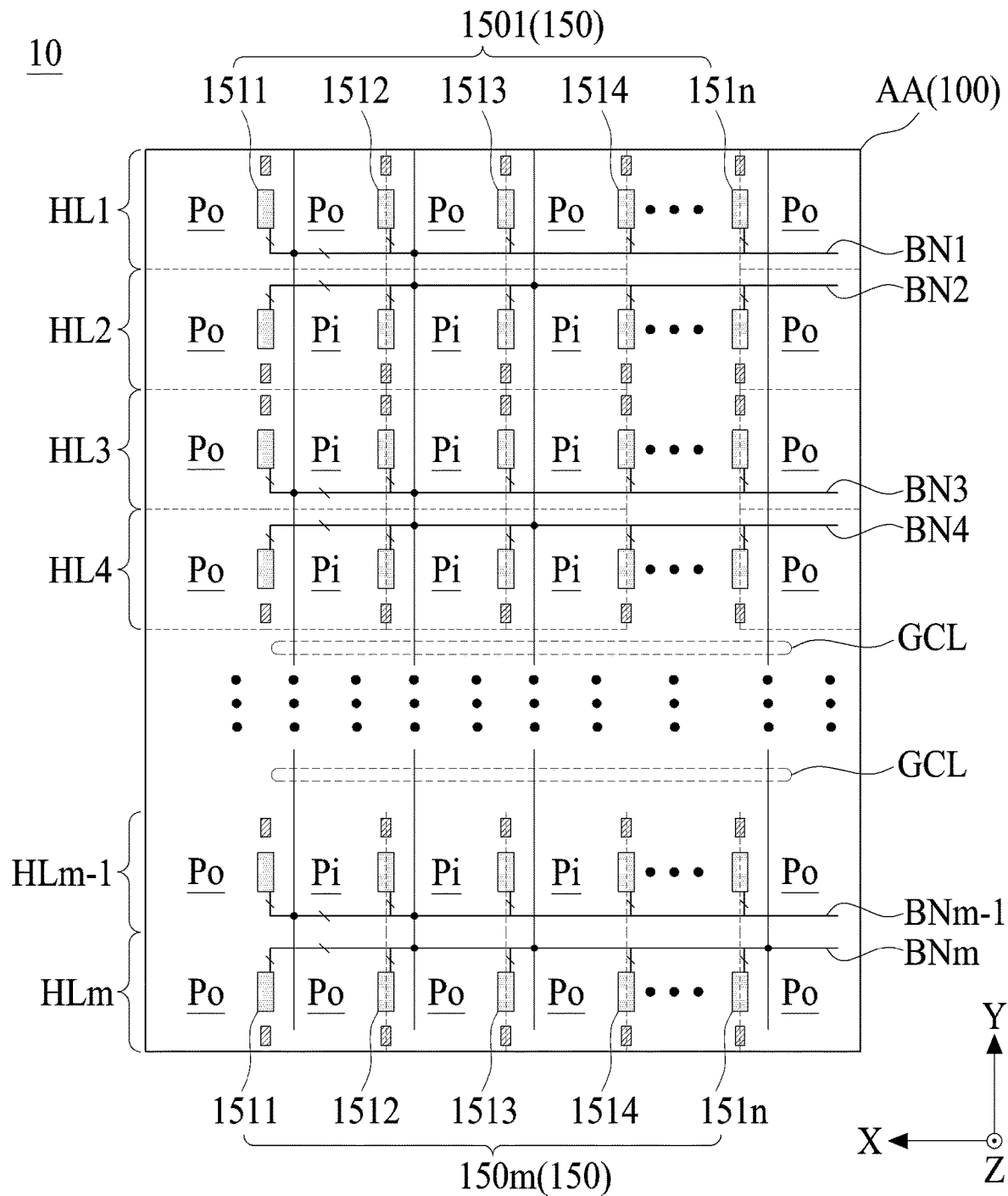
FIG. 8 is a diagram illustrating an arrangement structure of a gate driving circuit and a common electrode connection portion according to an embodiment of the present disclosure.

FIG. 8 is a diagram illustrating an arrangement structure of a gate driving circuit and a common electrode connection portion according to an embodiment of the present disclosure.

Referring to FIG. 8, the gate driving circuit 150 according to another embodiment of the present disclosure may be implemented (or embedded) within the display area AA of the first substrate 100. The gate driving circuit 150 may generate a scan signal based on gate control signals supplied through the first pad part 110 and the gate control lines GCL, and sequentially supply the scan signal to the plurality of gate lines GL.

The gate control lines GCL may extend long along a second direction Y and may be disposed spaced apart from one another by a predetermined or selected interval in a display area AA of the first substrate 100 along the first direction X. For example, the gate control lines GCL may be disposed between at least one or more pixels P along the first direction X.

The gate driving circuit 150 according to an embodiment of the present disclosure may be implemented with a shift register including a plurality of stage circuit portions 1501 to 150m, where m is an integer of 2 or more.

Each of the plurality of stage circuit portions 1501 to 150m may be individually disposed in each horizontal line on a first surface of the first substrate 100 along the first direction X and may be dependently connected (or coupled) to one another along the second direction Y. Each of the plurality of stage circuit portions 1501 to 150m may generate a scan signal in a predetermined or selected order in response to gate control signals supplied through the first pad part 110 and the gate control lines GCL and may supply the scan signal to a corresponding gate line GL.

Each of the plurality of stage circuit portions 1501 to 150m according to an embodiment of the present disclosure may include a plurality of branch circuits 1511 to 151n and a branch network 153. The plurality of branch circuits 1511 to 151n may be dispersively disposed between the plurality of pixels P along the first direction X and selectively coupled to the plurality of gate control lines GCL. It should be understood that the meaning of "dispersively disposed" includes dispersed in one or more directions. The dispersion may be at regular intervals. For example, as illustrated in FIG. 8, the branch circuits 1511 to 151n of the stage circuit portion 1501 are dispersed among the outermost pixels Po at regular intervals along the X-axis direction. As another example, the branch circuits 1511 of the stage circuit portions 1501 to 150m are dispersed among the outermost pixels Po at regular intervals along the Y-axis direction.

Each of the plurality of branch circuits 1511 to 151n may be disposed apart from and in a horizontal line of the horizontal lines HL1 to HLm of the first substrate 100 in the first direction X. Each of the plurality of branch circuits 1511 to 151n may be disposed in a circuit area between two adjacent pixels P or may be disposed in a circuit area between at least two adjacent pixels P, in a horizontal line of the horizontal lines HL1 to HLm of the first substrate 100, but embodiments of the present disclosure are not limited thereto. For example, each of the plurality of branch circuits 1511 to 151n may include at least one thin film transistor (TFT) (or a branch TFT) and may be disposed between at least two pixels P (or a pixel area) in one of the horizontal lines HL1 to HLm of the first substrate 100 in the first direction X.

The plurality of branch circuits 1511 to 151n may be selectively connected (or coupled) to the lines of the gate control lines GCL through the branch network 153 and may be electrically connected (or coupled) to one another through the branch network 153. Each of the plurality of branch circuits 1511 to 151n may generate the scan signal based on a gate control signal supplied through the gate control lines GCL and a voltage of the branch network 153, and may supply the scan signal to a corresponding gate line GL. It should be understood that the meaning of "selectively connected" includes that one element may be coupled to or decoupled from another element by an intervening selecting element. For example, the first branch network BN1 is selectively connected to the first branch circuit 1511 of the first circuit part 1501 by a switch, as shown in FIG. 8. When the switch is closed, the first branch network BN1 is coupled to the first branch circuit 1511, and when the switch is open, the first branch network BN1 is decoupled from the first branch circuit 1511.

Each of the plurality of branch circuits 1511 to 151n may include at least one TFT (or branch TFT) of a plurality of TFTs configuring one stage circuit portion of the stage circuit portions 1501 to 150m. Any one branch circuit of the plurality of branch circuits 1511 to 151n may include a pull-up TFT connected (or coupled) to the gate line GL. The other branch circuit of the plurality of branch circuits 1511 to 151n may include a pull-down TFT connected (or coupled) to the gate line GL.

The branch network 153 may be disposed at each horizontal line HL1 to HLm of the first substrate 100 and may electrically couple the plurality of branch circuits 1511 to 151n to each other.

The branch network 153 disposed in each of the first to $m^{th}$ stage circuit parts 1501 to 150m may be divided (or classified) into the first to $m^{th}$ branch networks BN1 to BNm. For example, m may be a natural number or 4 or more natural numbers.

The first to $m^{th}$ branch networks BN1 to BNm according to an embodiment of the present disclosure may include a plurality of control node lines and a plurality of network line.

The plurality of control node lines may be disposed at each horizontal line HL1 to HLm of the first substrate 100 and may be selectively coupled to the plurality of branch circuits 1511 to 151n in one horizontal line HL1 to HLm.

The plurality of network lines may be selectively coupled to the gate control lines GCL disposed at the first substrate 100 and may be selectively connected (or coupled) to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

Each of the first branch network BN1 and the $m^{th}$ branch network BNm adjacent to an outer surface of the first substrate 100 of the first to $m^{th}$ branch networks BN1 to BNm may be disposed between an inner pixel Pi and an emission area of an outermost pixel Po. For example, in the outermost pixel Po, when a region between the emission area and the outer surface of the first substrate 100 is referred to as an outer periphery region of a horizontal line and a region between the emission area and the inner pixel Pi is referred to as an inner periphery region of a horizontal line, each of the first branch network BN1 and the $m^{th}$ branch network BNm may not be disposed in the outer periphery region of the outermost pixel Po and may be disposed in the inner periphery region. Therefore, a driving defect may occur due to an increase in a capacitance between the common electrode and each of the first branch network BN1 and the $m^{th}$ branch network BNm occurring in the outer periphery region of the outermost pixel Po.

According to an embodiment of the present disclosure, each of the branch network BN1 of the first stage circuit part 1501 and the branch network BNm of the $m^{th}$ stage circuit part 150m may be disposed between two adjacent pixels Po and Pi along the second direction Y. For example, the branch network BN1 of the first stage circuit part 1501 may be disposed between the first horizontal line HL1 and the second horizontal line HL2, and the branch network BNm of the $m^{th}$ stage circuit part 150m may be disposed between the m-$1^{th}$ horizontal line HLm-1 and the $m^{th}$ horizontal line HLm.

According to an embodiment of the present disclosure, the branch networks BN1 to BNm may be disposed between the 4n-$3^{th}$ (where n is a natural number and 4n is equal to or less than m) horizontal line HL4n-3 and the 4n-$2^{th}$ horizontal line HL4n-2 and between the 4n-$1^{th}$ horizontal line HL4n-1 and the 4n$^{th}$ horizontal line HL4n. For example, each of a region between the 4n-$3^{th}$ horizontal line HL4n-3 and the 4n-$2^{th}$ horizontal line HL4n-2 and a region between the 4n-$1^{th}$ horizontal line HL4n-1 and the 4n$^{th}$ horizontal line HL4n of the first to $m^{th}$ horizontal lines HL1 to HLm may be defined as a disposition region of the branch network. Also, a region between the 4n-$2^{th}$ horizontal line HL4n-2 and the 4n-$1^{th}$ horizontal line HL4n-1 of the first to $m^{th}$ horizontal lines HL1 to HLm may be defined as a non-disposition region of the branch network.

According to an embodiment of the present disclosure, the 2k-$1^{th}$ (wherein k is a natural number and 2k is equal to or less than m) branch network BN2k-1 and the 2k$^{th}$ branch network BN2k of the first to $m^{th}$ branch network BN1 to BNm may be disposed between the 2k-$1^{th}$ horizontal line HL2k-1 and the 2k$^{th}$ horizontal line HL2k. For example, with respect to the second direction Y, when each pixel P is divided into an upper region (or one region, or a first region) and a lower region (or the other region, or a second region), the 2k-$1^{th}$ branch network (or an odd-numbered branch network) BN2k-1 disposed in the 2k-$1^{th}$ horizontal line HL2k-1 (or an odd-numbered horizontal line) HL2k-1 may be disposed in a lower region of each pixel P, and the 2k$^{th}$ branch network (or an even-numbered branch network) BN2k disposed in the 2k$^{th}$ horizontal line (or an even-numbered horizontal line) HL2k may be disposed in an upper region of each pixel P. Therefore, the 2k-$1^{th}$ branch network BN2k-1 and the 2k$^{th}$ branch network BN2k may be disposed or configured to be symmetric with respect to a boundary portion of two adjacent pixels P along the second direction Y.

The common electrode connection portion CECP according to an embodiment of the present disclosure may be disposed in a region, where the branch networks BN1 to BNm are not disposed, of a region of each pixel P. For example, with respect to the second direction Y, when the branch networks BN1 to BNm are disposed in the upper region of the pixel P, the common electrode connection portion CECP may be disposed in the lower region of the pixel P. On the other hand, with respect to the second direction Y, when the branch networks BN1 to BNm are disposed in the lower region of the pixel P, the common electrode connection portion CECP may be disposed in the upper region of the pixel P. For example, with respect to the second direction Y, when each of the first to $m^{th}$ horizontal lines HL1 to HLm is divided into an upper region (or one region, or a first region) and a lower region (or the other region, or a second region), the branch networks BN1 to BNm may be disposed in one of the upper region and the lower region, and the common electrode connection portion CECP may be disposed in the other of the upper region and the lower region.

According to an embodiment of the present disclosure, a common electrode connection portion CECP disposed in the 2k-$1^{th}$ horizontal line HL2k-1 of the first to $m^{th}$ horizontal lines HL1 to HLm may be disposed in an upper region of a pixel P, and a common electrode connection portion CECP disposed in the 2k$^{th}$ horizontal line HL2k may be disposed in a lower region of the pixel P. For example, with respect to the second direction Y, a common electrode connection portion CECP disposed in the 4n-$2^{th}$ horizontal line HL4n-2 and a common electrode connection portion CECP disposed in the 4n-$1^{th}$ horizontal line HL4n-1 may be disposed between the 4n-$2^{th}$ horizontal line HL4n-2 and the 4n-$1^{th}$ horizontal line HL4n-1. On the other hand, with respect to the second direction Y, a common electrode connection portion CECP may not be disposed between the 2k-$1^{th}$ horizontal line HL2k-1 and the 2k$^{th}$ horizontal line HL2k, where the branch networks BN1 to BNm are not disposed.

For example, a region between the 4n-2$^{th}$ horizontal line HL4n-2 and the 4n-1$^{th}$ horizontal line HL4n-1 of the first to m$^{th}$ horizontal lines HL1 to HLm may be defined as a disposition region of the common electrode connection portion CECP. Also, each of a region between the 4n-3$^{th}$ horizontal line HL4n-3 and the 4n-2$^{th}$ horizontal line HL4n-2 and a region between the 4n-1$^{th}$ horizontal line HL4n-1 and the 4n$^{th}$ horizontal line HL4n of the first to m$^{th}$ horizontal lines HL1 to HLm may be defined as a non-disposition region of the common electrode connection portion CECP.

According to an embodiment of the present disclosure, the common electrode connection portion CECP may not be disposed in each of the first horizontal line HL1 and the m$^{th}$ horizontal line HLm, in order to simplify a structure of the outermost pixel Po disposed in each of the first horizontal line HL1 and the m$^{th}$ horizontal line HLm of the first to m$^{th}$ horizontal lines HL1 to HLm, but embodiments of the present disclosure are not limited thereto.

The secondary line connection portion SLCP according to an embodiment of the present disclosure may be disposed in parallel with the common electrode connection portion CECP. For example, with respect to the first direction X, adjacent common electrode connection portion CECP and secondary line connection portion SLCP may be implemented or formed in a symmetric structure with respect to a boundary portion between two adjacent pixels P in the first direction X.

According to an embodiment of the present disclosure of the present disclosure, because the gate driving circuit 150 is disposed in the display area AA of the first substrate 100, a second interval D2 between a center portion of an outermost pixel area PAo and outer surfaces OS of the first substrate 100 may be half or less of a first interval (or a pixel pitch) D1 between adjacent pixel areas PA. For example, when the gate driving circuit 150 is not disposed in the display area AA of the first substrate 100 and is disposed at a periphery portion of the first substrate 100, the second interval D2 may be half or less of the first interval D1. Therefore, in the light emitting display apparatus according to an embodiment of the present disclosure, the gate driving circuit 150 may be disposed in the display area AA of the first substrate 100, and thus, the second interval D2 may be implemented to be half or less of the first interval D1.

Moreover, according to the present embodiment of the present disclosure, each of pixel common voltage lines CVL disposed in each pixel P along the second direction Y may be electrically connected (or coupled) to the common electrode through the common electrode connection portion CECP and the second line connection portion SLCP in each pixel P, and thus, a pixel common voltage applied to each pixel P may be uniform, thereby preventing or minimizing a degradation in image quality or luminance non-uniformity caused by the area-based non-uniformity of the pixel common voltage applied to each pixel P.

Figure 9:
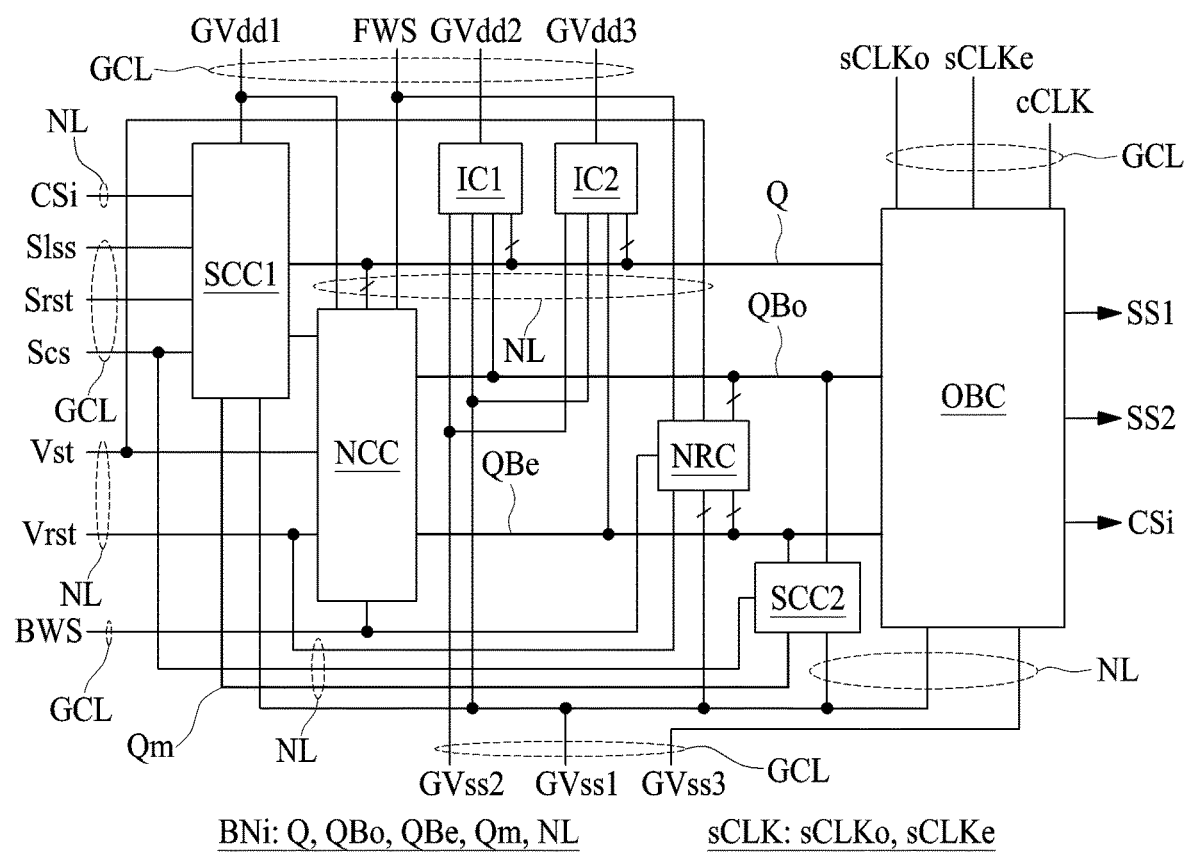
FIG. 9 is a circuit diagram illustrating an $i^{th}$ stage circuit part illustrated in FIG. 8.

FIG. 9 is a circuit diagram illustrating an i$^{th}$ stage circuit part illustrated in FIG. 8.

Referring to FIGS. 3, 8, and 9, an i$^{th}$ stage circuit part 150i according to an embodiment of the present disclosure may output two scan signals SSi and SSi+1 and a carry signal CSi in response to a gate control signal supplied through the first pad part 110 and gate control lines GCL disposed over the first substrate 100.

The gate control signal according to an embodiment of the present disclosure may include a start signal Vst, a plurality of shift clocks including a plurality of scan clocks sCLK and a plurality of carry clocks cCLK, first to third gate driving powers GVdd1, GVdd2, and GVdd3, and first to third gate common powers GVss1, GVss2, and GVss3. In this case, the gate control lines GCL may include a start signal line, a plurality of scan clock lines, a plurality of carry clock lines, first to third gate driving power lines, and first to third second gate common power lines.

The gate control signal according to an embodiment of the present disclosure may include first to j$^{th}$ carry clocks and first to j$^{th}$ scan clocks. For example, j may be 4, but embodiments of the present disclosure are not limited thereto and may be an even number of 6, 8, or 10 or more.

When the gate control signal includes the first to fourth carry clocks, the first carry clock may be applied to a 4n-3$^{th}$ (where n is a natural number and 4n-1 is less than m) stage circuit part, the second carry clock may be applied to a 4n-2$^{th}$ stage circuit part, the third carry clock may be applied to a 4n-1$^{th}$ stage circuit part, and the fourth carry clock may be applied to a 4n$^{th}$ stage circuit part. When the gate control signal includes the first to fourth scan clocks, the first and second scan clocks may be applied to an odd-numbered stage circuit part, and the third and fourth scan clocks may be applied to an even-numbered stage circuit part.

Moreover, the gate control signal according to an embodiment of the present disclosure may further include a forward driving signal FWS and a backward driving signal BWS. In this case, the gate control lines GCL may further include a forward driving signal line and a backward driving signal line.

The gate control signal according to an embodiment of the present disclosure may further include an external sensing line selection signal Slss, an external sensing reset signal Srst, and an external sensing control signal Scs for an external sensing mode. In this case, the gate control lines GCL may further include an external sensing selection signal line, an external sensing reset signal line, and an external sensing control signal line.

The i$^{th}$ stage circuit part 150i according to an embodiment of the present disclosure may include an i$^{th}$ branch network BNi, a node control circuit NCC, a first inverter circuit IC1, a second inverter circuit IC2, a node reset circuit NRC, and an output buffer circuit OBC.

The i$^{th}$ branch network BNi may be implemented to form a circuit connection between the node control circuit NCC, the first inverter circuit IC1, the second inverter circuit IC2, the node reset circuit NRC, and the output buffer circuit OBC and to be selectively connected to the lines of the gate control lines GCL.

The i$^{th}$ branch network BNi may be selectively coupled to the lines of the gate control lines GCL. The it branch network BNi according to an embodiment of the present disclosure may include first to third control node lines Q, QBo, and QBe and the plurality of network line NL.

Each of the first to third control node lines Q, QBo, and QBe may be disposed at an upper edge region (or a lower edge region) of each of the pixel areas arranged at an i$^{th}$ horizontal line of the first substrate 100. Each of the first to third control node lines Q, QBo, and QBe may be disposed in parallel with a first direction X or a gate line GL. For example, each of the first to third control node lines Q, QBo, and QBe may be disposed adjacent to the gate line GL The plurality of network lines NL may be selectively coupled to the lines of the gate control lines GCL and may be selectively coupled to the first to third control node lines Q, QBo, and QBe. Also, the plurality of network lines NL may be selectively coupled between circuits configuring the stage circuit part 150i.

The node control circuit NCC may be implemented to control a voltage of each of the first to third control node lines Q, QBo, and QBe.

The node control circuit NCC according to an embodiment of the present disclosure may be coupled to each of the first to third control node lines Q, QBo, and QBe through the plurality of network lines NL and may be implemented to control the voltage of each of the first to third control node lines Q, QBo, and QBe in response to the start signal Vst, the reset signal Vrst, and the first gate driving power GVdd1 supplied through the plurality of network lines NL. As an embodiment, the start signal Vst may be an i−2$^{th}$ carry signal output from the i−2$^{th}$ stage circuit part. The reset signal Vrst may be an i+2$^{th}$ carry signal output from an i+2$^{th}$ stage circuit part.

According to another embodiment of the present disclosure, the node control circuit NCC may be coupled to each of the first to third control node lines Q, QBo, and QBe through the plurality of network line NL and may control the voltage of each of the first to third control node lines Q, QBo, and QBe in response to the start signal Vst, the reset signal Vrst, the forward driving signal FWS, the backward driving signal BWS, and the first gate driving power GVdd1 supplied through the plurality of network line NL.

As an embodiment, when the forward driving signal FWS has a high voltage level (or a high potential voltage level), the backward driving signal BWS may have a low voltage level (or a low potential voltage level), and when the forward driving signal FWS has a low voltage level (or a low potential voltage level), the backward driving signal BWS may have a high voltage level (or a high potential voltage level). For example, when the forward driving signal FWS has a high voltage level, the gate driving circuit 150 may supply a scan signal up to a last gate line from a first gate line based on forward scan driving, and when the backward driving signal BWS has a high voltage level, the gate driving circuit 150 may supply the scan signal up to the first gate line from the last gate line based on backward scan driving. Herein, a high voltage level may be referred to as a first voltage level, a high potential voltage level, a gate turn-on voltage level, or a transistor on voltage level, and a low voltage level may be referred to as a second voltage level, a low potential voltage level, a gate turn-off voltage level, or a transistor off voltage level.

The first inverter circuit IC1 may control or discharge the voltage of the second control node line QBo based on the voltage of the first control node line Q supplied through the plurality of network line NL. The first inverter circuit IC1 according to an embodiment of the present disclosure may be coupled to the second gate driving power GVdd2, the first control node line Q, the second control node line QBo, the first gate common power GVss1, and the second gate common power GVss2 through the plurality of network line NL. In response to the second gate common power GVss2 and the voltage of the first control node line Q, the first inverter circuit IC1 may supply the first gate common power GVss1 to the second control node line QBo to discharge the voltage of the second control node line QBo.

The second inverter circuit IC2 may control or discharge the voltage of the third control node line QBe based on the voltage of the first control node line Q supplied through the plurality of network line NL. The second inverter circuit IC2 according to an embodiment of the present disclosure may be coupled to the third gate driving power GVdd3, the first control node line Q, the third control node line QBe, the first gate common power GVss1, and the second gate common power GVss2 through the plurality of network line NL. In response to the third gate common power GVss3 and the voltage of the first control node line Q, the second inverter circuit IC2 may supply the first gate common power GVss1 to the third control node line QBe to discharge the voltage of the third control node line QBe.

The second gate driving power GVdd2 and the third gate driving power GVdd3 may have voltage levels which are inverted (or opposite to each other) therebetween. For example, when the second gate driving power GVdd2 has a high voltage level, the third gate driving power GVdd3 may have a low voltage level, and when the second gate driving power GVdd2 has a low voltage level, the third gate driving power GVdd3 may have a high voltage level.

The second gate common power GVss2 and the first gate common power GVss1 may have the same voltage level or different voltage levels.

The node reset circuit NRC may maintain a voltage level of each of the second control node line QBo and the third control node line QBe while the voltage of the first control node line Q has a high voltage level.

The node reset circuit NRC according to an embodiment of the present disclosure may simultaneously reset the voltage of the second control node line QBo and the voltage of the third control node line QBe in response to the start signal Vst and the reset signal Vrst supplied through the plurality of network line NL. As an embodiment, the node reset circuit NRC may supply the first gate common power GVss1 to the second control node line QBo and the third control node line QBe in response to the start signal Vst and the reset signal Vrst, and thus, may maintain the second control node line QBo and the third control node line QBe at a voltage level of the first gate common power GVss1.

According to another embodiment of the present disclosure, the node reset circuit NRC may simultaneously reset the voltage of the second control node line QBo and the voltage of the third control node line QBe in response to the start signal Vst, the reset signal Vrst, the forward driving signal FWS, and the backward driving signal BWS supplied through the plurality of network line NL. As an embodiment, the node reset circuit NRC may supply the first gate common power GVss1 to the second control node line QBo and the third control node line QBe in response to the start signal Vst, the reset signal Vrst, the forward driving signal FWS, and the backward driving signal BWS, and thus, may maintain each of the second control node line QBo and the third control node line QBe at a voltage level of the first gate common power GVss1.

The output buffer circuit OBC may be implemented to sequentially output two scan signals having a gate-on voltage level or to sequentially output two scan signals having a gate-off voltage level in response to the voltage of each of the first to third control node lines Q, QBo, and QBe based on the carry clock cCLK, the scan clock sCLK, the first gate common power GVss1, and the third gate common power GVss3 supplied through the plurality of network line NL.

When the voltage of the first control node line Q has a high voltage level and the voltage of each of the second and third control node lines QBo and QBe has a low voltage level, the output buffer circuit OBC according to an embodiment of the present disclosure may output each of an i$^{th}$ carry signal CSi corresponding to the carry clock cCLK, an i$^{th}$ scan signal SSi corresponding to an odd-numbered scan clock sCLKo, and an i+1$^{th}$ scan signal SSi+1 corresponding to an even-numbered scan clock sCLKe. As an embodiment, the i$^{th}$ carry signal CSi may be supplied as the start signal Vst to the i+2$^{th}$ stage circuit part, the i$^{th}$ scan signal SSi may be supplied to an odd-numbered gate line GLo (or an i$^{th}$ gate line GLi), and the i+1$^{th}$ scan signal SSi+1 may be supplied to an even-numbered gate line GLe (or an i+1$^{th}$ gate line GLi+1).

When the voltage of each of the first and third control node lines Q and QBe has a low voltage level and the voltage of the second control node line QBo has a high voltage level, the output buffer circuit OBC according to an embodiment of the present disclosure may output each of the i$^{th}$ scan signal SSi and the i+1$^{th}$ scan signal SSi+1 each having a gate-off voltage level corresponding to a voltage level of the third gate common power GVss3 and may output the i$^{th}$ carry signal CSi having a gate-off voltage level corresponding to a voltage level of the first gate common power GVss1.

When the voltage of each of the first and second control node lines Q and QBo has a low voltage level and the voltage of the third control node line QBe has a high voltage level, the output buffer circuit OBC according to an embodiment of the present disclosure may output each of the i$^{th}$ scan signal SSi and the i+1$^{th}$ scan signal SSi+1 each having a gate-off voltage level corresponding to a voltage level of the third gate common power GVss3 and may output the i$^{th}$ carry signal CSi having a gate-off voltage level corresponding to a voltage level of the first gate common power GVss1.

The output buffer circuit OBC according to an embodiment of the present disclosure may be disposed in a center region of the i$^{th}$ horizontal line parallel to the first direction X. For example, when the output buffer circuit OBC is disposed adjacent to one end (or the other end) of a horizontal line, a voltage level of the scan signal may decrease in a direction from one end of a gate line to the other end thereof due to a line resistance of a horizontal line, and thus, in order to prevent such a problem, the output buffer circuit OBC should be disposed in the center region of the i$^{th}$ horizontal line parallel to the first direction X, but embodiments of the present disclosure are not limited thereto and may be disposed at one side or the other side of the i$^{th}$ horizontal line when a total length of the gate line is relatively short.

The first to third gate common powers GVss1, GVss2, and GVss3 may have the same voltage level or different voltage levels.

The i$^{th}$ stage circuit part 150i according to an embodiment of the present disclosure may further include a fourth control node line Qm, a first sensing control circuit SCC1, and a second sensing control circuit SCC2.

The fourth control node line Qm may be implemented to be electrically connected between the first sensing control circuit SCC1 and the second sensing control circuit SCC2. The fourth control node line Qm may be included in the i$^{th}$ branch network BNi and may be electrically connected between the first sensing control circuit SCC1 and the second sensing control circuit SCC2 through the plurality of network line NL.

The first sensing control circuit SCC1 may be implemented to control a voltage of each of the first control node line Q and the fourth control node line Qm in response to the i$^{th}$ carry signal CSi, the external sensing line selection signal Slss, the external sensing control signal Scs, the external sensing reset signal Srst, and the first gate driving power GVdd1 supplied through the i$^{th}$ branch network BNi. As an embodiment, the first sensing control circuit SCC1 may charge the first gate driving power GVdd1 into the fourth control node line Qm in response to the i$^{th}$ carry signal CSi having a high voltage level and the external sensing line selection signal Slss having a high voltage level, and then, may control the voltage of the first control node line Q in response to a voltage charged into the fourth control node line Qm, the external sensing control signal Scs having a high voltage level supplied during a fore period of a vertical blank period, and the first gate driving power GVdd1. Therefore, the output buffer circuit OBC may output each of the i$^{th}$ carry signal CSi corresponding to the carry clock cCLK, the i$^{th}$ scan signal SSi corresponding to the odd-numbered scan clock sCLKo, and the i+1$^{th}$ scan signal SSi+1 corresponding to the even-numbered scan clock sCLKe during the vertical blank period based on the voltage of the first control node line Q.

Moreover, the first sensing control circuit SCC1 may discharge the voltage of the first control node line Q in response to the external sensing reset signal Srst supplied through the i$^{th}$ branch network BNi. As an embodiment, the first sensing control circuit SCC1 may supply the first gate common power GVss1 to the first control node line Q to reset or initialize the voltage of the first control node line Q in response to the external sensing reset signal Srst having a high voltage level supplied during a latter period of the vertical blank period.

The second sensing control circuit SCC2 may be implemented to discharge the voltage of each of the second control node line QBo and the third control node line QBe in response to the voltage of the fourth control node line Qm and the external sensing control signal Scs supplied through the i$^{th}$ branch network BNi. As an embodiment, the second sensing control circuit SCC2 may supply the first gate common voltage GVss1 to each of the second control node line QBo and the third control node line QBe to simultaneously discharge the second control node line QBo and the third control node line QBe, in response to the voltage of the fourth control node line Qm having a high voltage level and the external sensing control signal Scs having a high voltage level.

Figure 10:
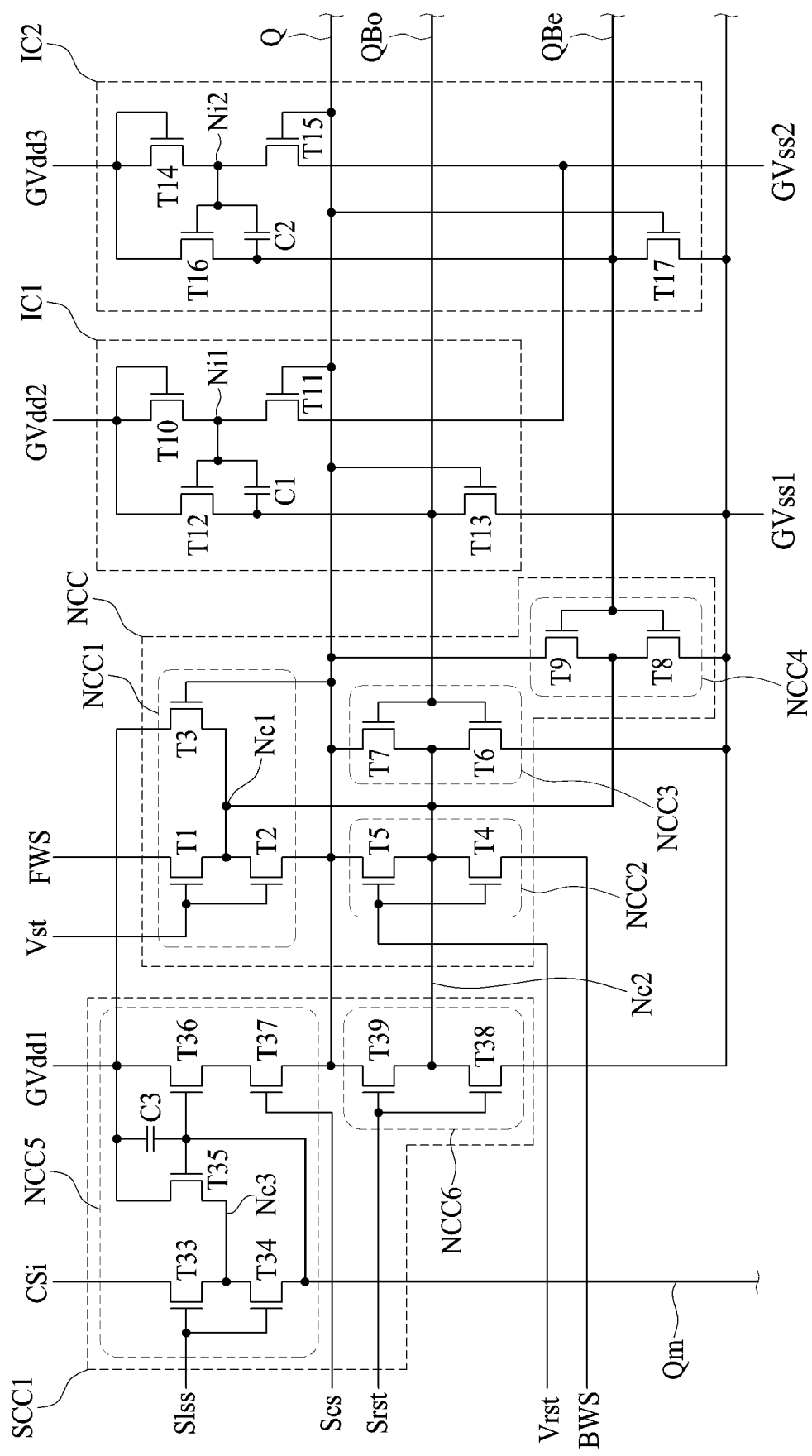
FIG. 10 is a circuit diagram illustrating a node control circuit, a first inverter circuit, a second inverter circuit, and a first sensing control circuit illustrated in FIG. 9.

FIG. 10 is a circuit diagram illustrating the node control circuit, the first inverter circuit, the second inverter circuit, and the first sensing control circuit each illustrated in FIG. 9.

Referring to FIGS. 9 and 10, a node control circuit NCC according to an embodiment of the present disclosure may include first to fourth node control circuits NCC1 to NCC4.

In forward scan driving, the first node control circuit NCC1 may charge a high voltage level of a forward driving signal FWS into a first control node line Q in response to a start signal Vst having a high voltage level and the forward driving signal FWS having a high voltage level. Also, in backward scan driving, the first node control circuit NCC1 may electrically connect a forward driving signal line having a low voltage level to the first control node line Q to discharge a voltage, charged into the first control node line Q, to a low voltage level in response to the start signal Vst having a high voltage level and the forward driving signal FWS having a low voltage level.

The first node control circuit NCC1 according to an embodiment of the present disclosure may include first to third TFTs T1 to T3.

The first TFT T1 may output the forward driving signal FWS to a first connection node Nc1 in response to the start signal Vst. For example, the first TFT T1 may be turned on based on the start signal Vst having a high voltage level and may output the forward driving signal FWS, supplied through the forward driving signal line, to the first connection node Nc1.

The second TFT T2 may electrically connect the first connection node Nc1 to a first control node line Q in response to the start signal Vst. For example, the second TFT T2 may be turned on based on the start signal Vst having a high voltage level and may output the forward driving signal FWS, supplied through the first TFT T1 and the first connection node Nc1, to the first control node line Q.

The third TFT T3 may supply a first gate driving power GVdd1, supplied through a first gate driving power line, to the first connection node Nc1 in response to a voltage of the first control node line Q. For example, the third TFT T3 may be turned on based on the voltage of the first control node line Q having a high voltage level and may transfer the first gate driving power GVdd1 to the first connection node Nc1 between the first TFT T1 and the second TFT T2, thereby preventing the voltage leakage of the first control node line Q. For example, the third TFT T3 may increase a voltage difference between a gate voltage of the second TFT T2 and the voltage of the first connection node Nc1 to turn off the second TFT T2 which has been turned off based on the start signal Vst having a low voltage level, and thus, may prevent the voltage drop of the first control node line Q through the turned-off second TFT T2, thereby stably maintaining the voltage of the first control node line Q.

In backward scan driving, the second node control circuit NCC2 may charge a high voltage level of a backward driving signal BWS into the first control node line Q in response to a reset signal Vrst having a high voltage level and the backward driving signal BWS having a high voltage level. Also, in forward scan driving, the second node control circuit NCC2 may electrically connect a backward driving signal line having a low voltage level to the first control node line Q to discharge a voltage, charged into the first control node line Q, to a low voltage level in response to the reset signal Vrst having a high voltage level and the backward driving signal BWS having a low voltage level.

The second node control circuit NCC2 according to an embodiment of the present disclosure may include a fourth TFT T4 and a fifth TFT T5.

The fourth TFT T4 may output the backward driving signal BWS in response to the reset signal Vrst. For example, the fourth TFT T4 may be turned on based on the reset signal Vrst having a high voltage level and may output the backward driving signal BWS, supplied through a backward driving signal line, to a second connection node Nc2.

The fifth TFT T5 may electrically connect the second connection node Nc2 to the first control node line Q in response to the reset signal Vrst. For example, the fifth TFT T5 may be turned on based on the reset signal Vrst having a high voltage level and may output the backward driving signal BWS, supplied through the fourth TFT T4 and the second connection node Nc2, to the first control node line Q.

The second connection node Nc2 between the fourth TFT T4 and the fifth TFT T5 may be electrically connected to the first connection node Nc1. Therefore, the second connection node Nc2 may be supplied with the first gate driving power GVdd1, supplied through the first gate driving power line, through the third TFT T3 of the first node control circuit NCC1. Therefore, the third TFT T3 of the first node control circuit NCC1 may increase a voltage difference between a gate voltage of the fifth TFT T5 of the second node control circuit NCC2 and the voltage of the second connection node Nc2 to completely turn off the fifth TFT T5 which has been turned off based on the reset signal Vrst having a low voltage level, and thus, may prevent the voltage drop (or the current leakage) of the first control node line Q through the turned-off fifth TFT T5, thereby stably maintaining the voltage of the first control node line Q.

The third node control circuit NCC3 may discharge the voltage of the first control node line Q in response to a voltage of a second control node line QBo. For example, the third node control circuit NCC3 may form a current path between the first control node line Q and a first gate common power line based on a high voltage level of the second control node line QBo to discharge the voltage of the first control node line Q to the first gate common power line.

The third node control circuit NCC3 according to an embodiment of the present disclosure may include a sixth TFT T6 and a seventh TFT T7.

The sixth TFT T6 may supply the second connection node Nc2 with the first gate common power GVss1 supplied through the first gate common power line in response to the voltage of the second control node line QBo. For example, the sixth TFT T6 may be turned on based on a high voltage level of the second control node line QBo and may electrically connect the second connection node Nc2 to the first gate common power line.

The seventh TFT T7 may electrically connect the second connection node Nc2 to the first control node line Q in response to the voltage of the second control node line QBo. For example, the seventh TFT T7 may be turned on based on a high voltage level of the second control node line QBo and may electrically connect the second connection node Nc2 to the first control node line Q.

The seventh TFT T7 may be turned off based on a low voltage level of the second control node line QBo, and a voltage difference between a gate voltage of the turned-off seventh TFT T7 and a voltage of the second connection node Nc2 may increase based on the first gate driving power GVdd1 supplied to the second connection node Nc2 through the third TFT T3 of the first node control circuit NCC1, whereby the seventh TFT T7 turned off based on the low voltage level of the second control node line QBo may be completely turned off based on the first gate driving power GVdd1 supplied to the second connection node Nc2. Accordingly, the voltage drop (or current leakage) of the first control node line Q through the third node control circuit NCC3 may be prevented because the seventh TFT T7 is completely turned off, thereby stably maintaining the voltage of the first control node line Q.

The fourth node control circuit NCC4 may discharge the voltage of the first control node line Q in response to a voltage of a third control node line QBe. For example, the fourth node control circuit NCC4 may form a current path between the first control node line Q and the first gate common power line based on a high voltage level of the third control node line QBe to discharge the voltage of the first control node line Q to the first gate common power line.

The fourth node control circuit NCC4 according to an embodiment of the present disclosure may include an eighth TFT T8 and a ninth TFT T9.

The eighth TFT T8 may supply the second connection node Nc2 with the first gate common power GVss1 supplied through the first gate common power line in response to the voltage of the third control node line QBe. For example, the eighth TFT T8 may be turned on based on a high voltage level of the third control node line QBe and may electrically connect the second connection node Nc2 to the first gate common power line.

The ninth TFT T9 may electrically connect the second connection node Nc2 to the first control node line Q in response to the voltage of the third control node line QBe. For example, the ninth TFT T9 may be turned on based on a high voltage level of the third control node line QBe and may electrically connect the second connection node Nc2 to the first control node line Q.

The ninth TFT T9 may be turned off based on a low voltage level of the third control node line QBe, and a voltage difference between a gate voltage of the turned-off ninth TFT T9 and a voltage of the second connection node Nc2 may increase based on the first gate driving power GVdd1 supplied to the second connection node Nc2 through the third TFT T3 of the first node control circuit NCC1, whereby the ninth TFT T9 turned off based on the low voltage level of the third control node line QBe may be completely turned off based on the first gate driving power GVdd1 supplied to the second connection node Nc2. Accordingly, the voltage drop (or current leakage) of the first control node line Q through the fourth node control circuit NCC4 may be prevented because the ninth TFT T9 is completely turned off, thereby stably maintaining the voltage of the first control node line Q.

The first inverter circuit IC1 may discharge the voltage of the second control node line QBo in response to the voltage of the first control node line Q and a second gate driving power GVdd2. For example, the first inverter circuit IC1 may form a current path between the second control node line QBo and the first gate common power line based on a high voltage level of the first control node line Q to discharge the voltage of the second control node line QBo to the first gate common power line.

The first inverter circuit IC1 according to an embodiment of the present disclosure may include tenth to thirteenth TFTs T10 to T13 and a first capacitor C1.

The tenth TFT T10 may be turned on or off based on the second gate driving power GVdd2 and may output the second gate driving power GVdd2, which has a high voltage level when turned on, to a first internal node Ni1. The tenth TFT T10 according to an embodiment of the present disclosure may be diode-connected between the second gate driving power GVdd2 and the first internal node Ni1.

The eleventh TFT T11 may be turned on or off based on the voltage of the first control node line Q, and when turned on, may discharge a voltage of the first internal node Ni1 to a second gate common power line.

The twelfth TFT T12 may be turned on or off based on the voltage of the first internal node Ni1, and when turned on, may supply the second gate driving power GVdd2 to the second control node line QBo.

The thirteenth TFT T13 may be turned on or off based on the voltage of the first control node line Q, and when turned on, may supply the voltage of the second control node line QBo to the first gate common power line.

The first capacitor C1 may be formed between the first internal node Ni1 and a node (or the second control node line QBo) between the twelfth TFT T12 and the thirteenth TFT T13. For example, the first capacitor C1 may allow bootstrapping to occur in the first internal node Ni1 based on a voltage variation of the second gate driving power GVdd2. Therefore, when a voltage level of the second gate driving power GVdd2 varies, the voltage of the first internal node Ni1 may further vary by a voltage variation of the second gate driving power GVdd2 due to bootstrapping caused by coupling of the first capacitor C1 and the second gate driving power GVdd2, thereby more enhancing an output characteristic of the twelfth TFT T12.

The second inverter circuit IC2 may discharge the voltage of the third control node line QBe in response to the voltage of the first control node line Q and a third gate driving power GVdd3. For example, the second inverter circuit IC2 may form a current path between the third control node line QBe and the first gate common power line based on a high voltage level of the first control node line Q to discharge the voltage of the third control node line QBe to the first gate common power line.

The second inverter circuit IC2 according to an embodiment of the present disclosure may include fourteenth to seventeenth TFTs T14 to T17 and a second capacitor C2.

The fourteenth TFT T14 may be turned on or off based on the third gate driving power GVdd3 and may output the third gate driving power GVdd3, which has a high voltage level when turned on, to a second internal node Ni2. The fourteenth TFT T14 according to an embodiment of the present disclosure may be diode-connected between the third gate driving power GVdd3 and the second internal node Ni2.

The fifteenth TFT T15 may be turned on or off based on the voltage of the first control node line Q, and when turned on, may discharge a voltage of the second internal node Ni2 to the second gate common power line.

The sixteenth TFT T16 may be turned on or off based on the voltage of the second internal node Ni2, and when turned on, may supply the third gate driving power GVdd3 to the third control node line QBe.

The seventeenth TFT T17 may be turned on or off based on the voltage of the first control node line Q, and when turned on, may supply the voltage of the third control node line QBe to the first gate common power line.

The second capacitor C2 may be formed between the second internal node Ni2 and a node (or the third control node line QBe) between the sixteenth TFT T16 and the seventeenth TFT T17. For example, the second capacitor C2 may allow bootstrapping to occur in the second internal node Ni2 based on a voltage variation of the third gate driving power GVdd3. Therefore, when a voltage level of the third gate driving power GVdd3 varies, the voltage of the second internal node Ni2 may further vary by a voltage variation of the third gate driving power GVdd3 due to bootstrapping caused by coupling of the second capacitor C2 and the third gate driving power GVdd3, thereby more enhancing an output characteristic of the sixteenth TFT T16.

The first sensing control circuit SCC1 may be implemented to control a voltage of each of the first control node line Q and the fourth control node line Qm in response to an $i^{th}$ carry signal CSi, an external sensing line selection signal Slss, an external sensing control signal Scs, an external sensing reset signal Srst, and the first gate driving power GVdd1.

The first sensing control circuit SCC1 according to an embodiment of the present disclosure may include a fifth node control circuit NCC5 and a sixth node control circuit NCC6.

The fifth node control circuit NCC5 may control the voltage of each of the first control node line Q and the fourth control node line Qm in response to the $i^{th}$ carry signal CSi, the external sensing line selection signal Slss, the external sensing control signal Scs, and the first gate driving power GVdd1.

The fifth node control circuit NCC5 according to an embodiment of the present disclosure may include thirty-third to thirty-seventh TFT T33 to T37 and a third capacitor C3.

The thirty-third TFT T33 may output the $i^{th}$ carry signal CSi to a third connection node Nc3 in response to the external sensing line selection signal Slss supplied together with the start signal Vst. For example, the thirty-third TFT T33 may be turned on based on the external sensing line selection signal Slss having a high voltage level and may output the $i^{th}$ carry signal CSi to the third connection node Nc3.

The thirty-fourth TFT T34 may electrically connect the third connection node Nc3 to the fourth control node line Qm in response to the external sensing line selection signal Slss. For example, the thirty-fourth TFT T34 may be turned on based on the external sensing line selection signal Slss having a high voltage level and may supply the $i^{th}$ carry signal CSi, supplied through the thirty-third TFT T33 and the third connection node Nc3, to the fourth control node line Qm. The third connection node Nc3 may be a connection line between the thirty-third TFT T33 and the thirty-fourth TFT T34.

The thirty-fifth TFT T35 may supply the first gate driving power GVdd1 to the third connection node Nc3 in response to the voltage of the fourth control node line Qm. For example, the thirty-fifth TFT T35 may be turned on based on the voltage of the fourth control node line Qm having a high voltage level and may supply the first gate driving power GVdd1 to the third connection node Nc3, thereby preventing the voltage leakage of the fourth control node line Qm. For example, the thirty-fifth TFT T35 may increase a voltage difference between a gate voltage of the thirty-fourth TFT T34 and a voltage of the third connection node Nc3, and thus, may completely turn off the thirty-fourth TFT T34 which has been turned off based on the external sensing line selection signal Slss having a low voltage level, thereby preventing the voltage drop (or current leakage) of the fourth control node line Qm through the turned-off thirty-fourth TFT T34 to stably maintain the voltage of the fourth control node line Qm.

The thirty-sixth TFT T36 may output the first gate driving power GVdd1 to the thirty-seventh TFT T37 in response to the voltage of the fourth control node line Qm. For example, the thirty-sixth TFT T36 may be turned on based on the voltage of the fourth control node line Qm having a high voltage level and may supply the first gate driving power GVdd1 to the thirty-seventh TFT T37.

The thirty-seventh TFT T37 may electrically connect the thirty-sixth TFT T36 to the first control node line Q in response to the external sensing control signal Scs. For example, the thirty-seventh TFT T37 may be turned on based on the external sensing control signal Scs having a high voltage level and may supply the first gate driving power GVdd1, supplied through the thirty-sixth TFT T36, to the first control node line Q to charge a voltage level of the first gate driving power GVdd1 into the first control node line Q.

The third capacitor C3 may be formed between the fourth control node line Qm and the first gate driving power line and may store a difference voltage between the fourth control node line Qm and the first gate driving power line. For example, a first electrode of the third capacitor C3 may be electrically connected to the fourth control node line Qm which is connected to a gate electrode of the thirty-fifth TFT T35 and a gate electrode of the thirty-sixth TFT T36 in common, and a second electrode of the third capacitor C3 may be electrically connected to the first gate driving power line. The third capacitor C3 may store the $i^{th}$ carry signal CSi according to the turn-on of the thirty-third, thirty-fourth, and thirty-fifth TFTs T33 to T35, and when the thirty-third, thirty-fourth, and thirty-fifth TFTs T33 to T35 are turned off, the third capacitor C3 may maintain the voltage of the fourth control node line Qm at a high voltage level by using the stored voltage. For example, the third capacitor C3 may maintain the voltage of the fourth control node line Qm at a high voltage level by using the stored voltage during one horizontal period.

The sixth node control circuit NCC6 may discharge the voltage of the first control node line Q in response to the external sensing reset signal Srst. As an embodiment, the sixth node control circuit NCC6 may supply the first gate common power GVss1 to the first control node line Q in response to the external sensing reset signal Srst having a high voltage level, thereby resetting or initializing the voltage of the first control node line Q.

The sixth node control circuit NCC6 according to an embodiment of the present disclosure may include a thirty-eighth TFT T38 and a thirty-ninth TFT T39.

The thirty-eighth TFT T38 may supply the first gate common power GVss1, supplied through the first gate common power line, to the second connection node Nc2 in response to the external sensing reset signal Srst. For example, the thirty-eighth TFT T38 may be turned on based on the external sensing reset signal Srst having a high voltage level and may output the first gate common power GVss1 to the second connection node Nc2.

The thirty-ninth TFT T39 may electrically connect the second connection node Nc2 to the first control node line Q in response to the external sensing reset signal Srst. For example, the thirty-ninth TFT T39 may be turned on based on the external sensing reset signal Srst having a high voltage level and may supply the first gate common power GVss1, supplied through the thirty-eighth TFT T38 and the second connection node Nc2, to the first control node line Q.

The second connection node Nc2 between the thirty-eighth TFT T38 and the thirty-ninth TFT T39 may be electrically connected to the first connection node Nc1. Therefore, the second connection node Nc2 may be supplied with the first gate driving power GVdd1 through the third TFT T3 of the first node control circuit NCC1. Therefore, the third TFT T3 of the first node control circuit NCC1 may increase a voltage difference between a gate voltage of the thirty-ninth TFT T39 of the sixth node control circuit NCC6 and the voltage of the second connection node Nc2 to completely turn off the thirty-ninth TFT T39 which has been turned off based on the external sensing reset signal Srst having a low voltage level, and thus, may prevent the voltage drop (or the current leakage) of the first control node line Q through the turned-off thirty-ninth TFT T39, thereby stably maintaining the voltage of the first control node line Q.

Figure 11:
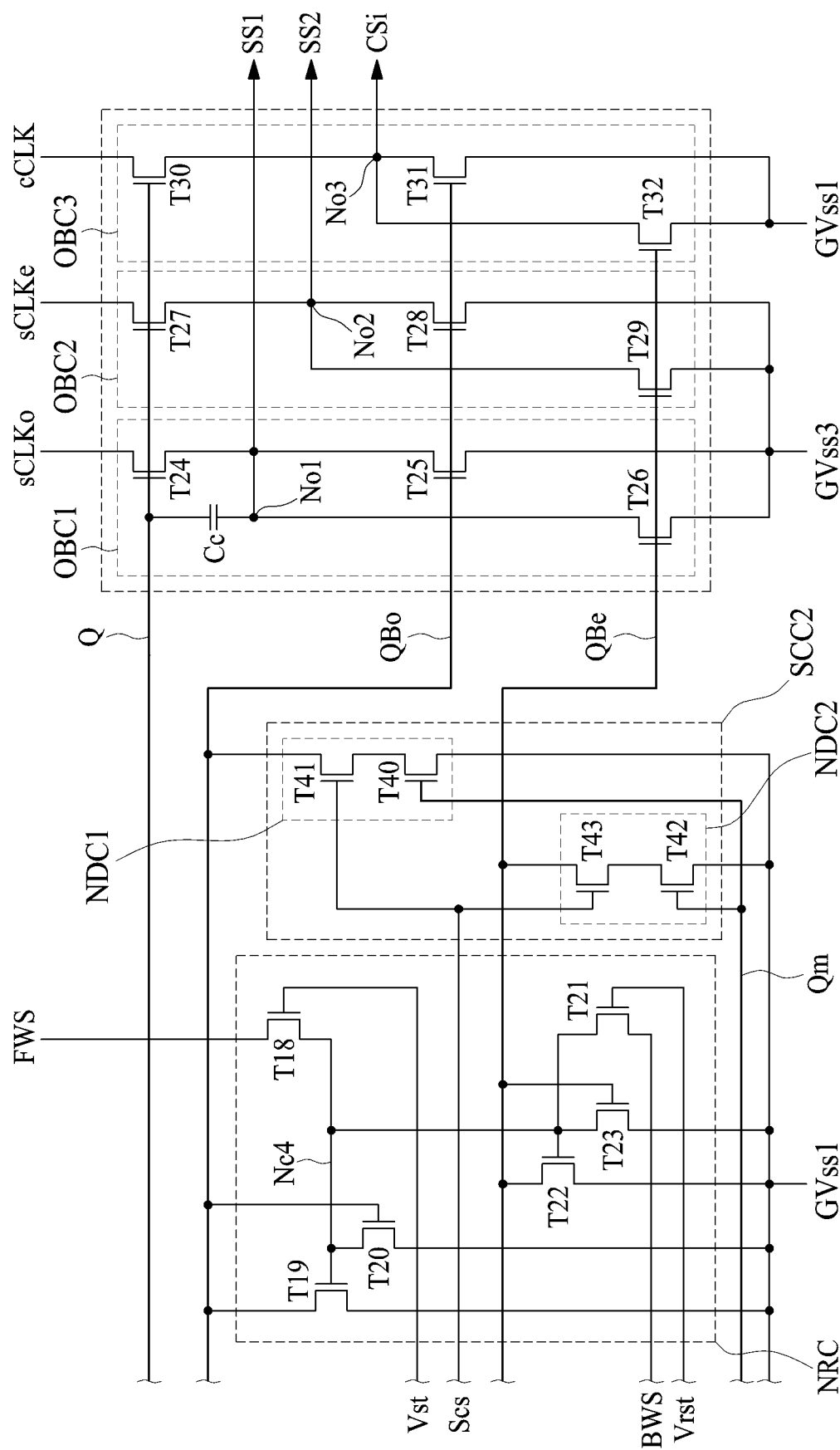
FIG. 11 is a circuit diagram illustrating a noise removal circuit, an output buffer circuit, and a second sensing control circuit illustrated in FIG. 9.

FIG. 11 is a circuit diagram illustrating the node reset circuit, the output buffer circuit, and the second sensing control circuit each illustrated in FIG. 9.

Referring to FIGS. 9 and 11, a node reset circuit NRC according to an embodiment of the present disclosure may maintain a voltage level of each of a second control node line QBo and a third control node line QBe while a voltage of a first control node line Q has a high voltage level.

The node reset circuit NRC according to an embodiment of the present disclosure may include eighteenth to twenty-third TFTs T18 to T23.

The eighteenth TFT T18 may electrically connect a fourth connection node Nc4 to a forward driving signal line in response to a start signal Vst and a forward driving signal FWS. As an embodiment, the eighteenth TFT T18 may be turned on based on the start signal Vst having a high voltage level and may supply the forward driving signal FWS to the fourth connection node Nc4.

The nineteenth TFT T19 may electrically connect a second control node line QBo to a first gate common power line in response to a voltage of a fourth connection node Nc4. As an embodiment, the nineteenth TFT T19 may be turned on based on a voltage of the fourth connection node Nc4 and may form a current path between the second control node line QBo and a first gate common power line to discharge a voltage of the second control node line QBo to the first gate common power line, thereby resetting the voltage of the second control node line QBo to a voltage level of a first gate common power GVss1.

The twentieth TFT T20 may electrically connect the fourth connection node Nc4 to the first gate common power line in response to the voltage of the second control node line QBo. As an embodiment, the twentieth TFT T20 may be turned on based on a high voltage level of the second control node line QBo and may form a current path between the fourth connection node Nc4 and the first gate common power line to discharge a voltage of the fourth connection node Nc4 to the first gate common power line, thereby resetting the voltage of the fourth connection node Nc4 to the voltage level of the first gate common power GVss1. Accordingly, when the voltage of the second control node line QBo has a high voltage level, the twentieth TFT T20 may reset the voltage of the fourth connection node Nc4 to the voltage level of the first gate common power GVss1 to turn off the nineteenth TFT T19, and thus, may prevent the voltage of the second control node line QBo from being discharged to the first gate common power line through the nineteenth TFT T19.

The twenty-first TFT T21 may electrically connect the fourth connection node Nc4 to a backward driving signal line in response to a reset signal Vrst and a backward driving signal BWS. As an embodiment, the twenty-first TFT T21 may be turned on based on the reset signal Vrst having a high voltage level and may supply the backward driving signal BWS having a high voltage level to the fourth connection node Nc4.

The twenty-second TFT T22 may electrically connect the third control node line QBe to the first gate common power line in response to the voltage of the fourth connection node Nc4. As an embodiment, the twenty-second TFT T22 may be turned on based on the voltage of the fourth connection node Nc4 and may form a current path between the third control node line QBe and the first gate common power line to discharge a voltage of the third control node line QBe to the first gate common power line, thereby resetting the voltage of the third control node line QBe to the voltage level of the first gate common power GVss1.

The twenty-third TFT T23 may electrically connect the fourth connection node Nc4 to the first gate common power line in response to the voltage of the third control node line QBe. As an embodiment, the twenty-third TFT T23 may be turned on based on a high voltage level of the third control node line QBe and may form a current path between the fourth connection node Nc4 and the first gate common power line to discharge the voltage of the fourth connection node Nc4 to the first gate common power line, thereby resetting the voltage of the fourth connection node Nc4 to the voltage level of the first gate common power GVss1. Accordingly, when the voltage of the third control node line QBe has a high voltage level, the twenty-third TFT T23 may reset the voltage of the fourth connection node Nc4 to the voltage level of the first gate common power GVss1 to turn off the twenty-second TFT T22, and thus, may prevent the voltage of the third control node line QBe from being discharged to the first gate common power line through the twenty-second TFT T22.

The nineteenth TFT T19 and the twenty-second TFT T22 may be simultaneously turned on or off based on the voltage of the fourth connection node Nc4.

As an embodiment, in forward scan driving of the gate driving circuit 150, the nineteenth TFT T19 and the twenty-second TFT T22 may be simultaneously turned on based on a high voltage level of the forward driving signal FWS supplied to the fourth connection node Nc4 through the eighteenth TFT T18 turned on based on the start signal Vst having a high voltage level and may be simultaneously turned off based on the first gate common power GVss1 supplied to the fourth connection node Nc4 through the twentieth TFT T20 turned on based on a high voltage level of the second control node line QBo or may be simultaneously turned off based on the first gate common power GVss1 supplied to the fourth connection node Nc4 through the twenty-third TFT T23 turned on based on a high voltage level of the third control node line QBe.

As another embodiment, in backward scan driving of the gate driving circuit 150, the nineteenth TFT T19 and the twenty-second TFT T22 may be simultaneously turned on based on a high voltage level of the backward driving signal BWS supplied to the fourth connection node Nc4 through the twenty-first TFT T21 turned on based on the reset signal Vrst having a high voltage level and may be simultaneously turned off based on the first gate common power GVss1 supplied to the fourth connection node Nc4 through the twenty-third TFT T23 turned on based on a high voltage level of the third control node line QBe or may be simultaneously turned off based on the first gate common power GVss1 supplied to the fourth connection node Nc4 through the twentieth TFT T20 turned on based on a high voltage level of the second control node line QBo.

The output buffer circuit OBC may receive a carry clock cCLK, an odd-numbered scan clock sCLKo, an even-numbered scan clock sCLKe, a first gate common power GVss1, the second gate common power GVss2, and a third gate common power GVss3 and may output an $i^{th}$ scan signal SSi, an $i+1^{th}$ scan signal SSi+1, and an $i^{th}$ carry signal CSi based on the carry clock cCLK, the scan clock sCLK, and the third gate common power GVss3 in response to the voltage of each of the first to third control node lines Q, QBo, and QBe. For example, when the voltage of the first control node line Q has a high voltage level, the output buffer circuit OBC may output the $i^{th}$ carry signal CSi corresponding to the carry clock cCLK, the $i^{th}$ scan signal SSi corresponding to the odd-numbered scan clock sCLKo, and the $i+1^{th}$ scan signal SSi+1 corresponding to the even-numbered scan clock sCLKe.

The output buffer circuit OBC according to an embodiment of the present disclosure may include first to third output buffer circuits OBC1 to OBC3.

The first output buffer circuit OBC1 may output the $i^{th}$ scan signal SSi having a voltage level of the odd-numbered scan clock sCLKo or a voltage level of the third gate common power GVss3 based on the voltage of each of the first to third control node lines Q, QBo, and QBe.

The first output buffer circuit OBC1 according to an embodiment of the present disclosure may include twenty-fourth to twenty-sixth TFTs T24 to T26 and a coupling capacitor Cc.

The twenty-fourth TFT T24 (or a first pull-up TFT) may transfer the odd-numbered scan clock sCLKo to the $i^{th}$ gate line GLi through a first output node No1 based on the voltage of the first control node line Q. For example, the twenty-fourth TFT T24 may include a gate electrode connected to the first control node line Q, a first source/drain electrode connected to the first output node No1, and a second source/drain electrode connected to an odd-numbered scan clock line.

The twenty-fifth TFT T25 (or an odd first pull-down TFT) may transfer the third gate common power GVss3 to the $i^{th}$ gate line GLi through the first output node No1 based on the voltage of the second control node line QBo. For example, the twenty-fifth TFT T25 may include a gate electrode connected to the second control node line QBo, a first source/drain electrode connected to the first output node No1, and a second source/drain electrode connected to a third gate common power line.

The twenty-sixth TFT T26 (or an even first pull-down TFT) may transfer the third gate common power GVss3 to the $i^{th}$ gate line GLi through the first output node No1 based on the voltage of the third control node line QBe. For example, the twenty-sixth TFT T26 may include a gate electrode connected to the third control node line QBe, a first source/drain electrode connected to the first output node No1, and a second source/drain electrode connected to a third gate common power line.

The coupling capacitor Cc may be formed between the first control node line Q and the first output node No1. For example, the coupling capacitor Cc may be a parasitic capacitor between a gate electrode of the twenty-fourth TFT T24 and the first output node No1. The coupling capacitor Cc may allow bootstrapping to occur in the first control node line Q based on a phase shift (or variation) of the odd-numbered scan clock sCLKo. Accordingly, when the odd-numbered scan clock sCLKo is shifted from a low voltage level to a high voltage level, the voltage of the first control node line Q may be boosted to a higher voltage by a high voltage level of the odd-numbered scan clock sCLKo based on bootstrapping caused by coupling between the coupling capacitor Cc and the odd-numbered scan clock sCLKo having a high voltage level. For example, as the odd-numbered scan clock sCLKo having a high voltage level is supplied to the second source/drain electrode of the twenty-fourth TFT T24, the voltage of the first control node line Q pre-charged with a voltage level of the forward driving signal FWS by the first node control circuit NCC1 may be boosted to a higher voltage, and thus, the twenty-fourth TFT T24 may be completely turned on and the odd-numbered scan clock sCLKo having a high voltage level may be supplied to, as the $i^{th}$ scan signal SSi, the $i^{th}$ gate line GLi through the first output node No1 and the turned-on twenty-fourth TFT T24 without voltage loss.

The second output buffer circuit OBC2 may output the $i+1^{th}$ scan signal SSi+1 having a voltage level of the even-numbered scan clock sCLKe or a voltage level of the third gate common power GVss3 based on the voltage of each of the first to third control node lines Q, QBo, and QBe.

The second output buffer circuit OBC2 according to an embodiment of the present disclosure may include twenty-seventh to twenty-ninth TFTs T27 to T29.

The twenty-seventh TFT T27 (or a second pull-up TFT) may transfer the even-numbered scan clock sCLKe to the $i+1^{th}$ gate line GLi+1 through a second output node No2 based on the voltage of the first control node line Q. For example, the twenty-seventh TFT T27 may include a gate electrode connected to the first control node line Q, a first source/drain electrode connected to the second output node No2, and a second source/drain electrode connected to an even-numbered scan clock line. The twenty-seventh TFT T27 may be turned on based on the bootstrapped voltage of the first control node line Q, and thus, may transfer the even-numbered scan clock sCLKe having a high voltage level, supplied through an even-numbered scan clock line, to the $i+1^{th}$ gate line GLi+1 as the $i+1^{th}$ scan signal SSi+1 through the second output node No2 without voltage loss.

The twenty-eighth TFT T28 (or an odd second pull-down TFT) may transfer the third gate common power GVss3 to the $i+1^{th}$ gate line GLi+1 through the second output node No2 based on the voltage of the second control node line QBo. For example, the twenty-eighth TFT T28 may include a gate electrode connected to the second control node line QBo, a first source/drain electrode connected to the second output node No2, and a second source/drain electrode connected to the third gate common power line.

The twenty-ninth TFT T29 (or an even second pull-down TFT) may transfer the third gate common power GVss3 to the $i+1^{th}$ gate line GLi+1 through the second output node No2 based on the voltage of the third control node line QBe. For example, the twenty-ninth TFT T29 may include a gate electrode connected to the third control node line QBe, a first source/drain electrode connected to the second output node No2, and a second source/drain electrode connected to the third gate common power line.

The third output buffer circuit OBC3 may output the $i^{th}$ carry signal CSi having a voltage level of the carry clock cCLK or a voltage level of the first gate common power GVss1 based on the voltage of each of the first to third control node lines Q, QBo, and QBe.

The third output buffer circuit OBC3 according to an embodiment of the present disclosure may include thirtieth to thirty-second TFTs T30 to T32.

The thirtieth TFT T30 (or a third pull-up TFT) may output, as the $i^{th}$ carry signal CSi, the carry clock cCLK through a third output node No3 based on the voltage of the first control node line Q. For example, the thirtieth TFT T30 may include a gate electrode connected to the first control node line Q, a first source/drain electrode connected to the third output node No3, and a second source/drain electrode connected to a carry clock line. The thirtieth TFT T30 may be turned on based on the bootstrapped voltage of the first control node line Q and may output, as the $i^{th}$ carry signal CSi, the carry clock cCLK having a high voltage level, supplied through the carry clock line, through the third output node No3 without voltage loss.

The thirty-first TFT T31 (or an odd third pull-down TFT) may output, as the $i^{th}$ carry signal CSi, the first gate common power GVss1 through the third output node No3 based on the voltage of the second control node line QBo. For example, the thirty-first TFT T31 may include a gate electrode connected to the second control node line QBo, a first source/drain electrode connected to the third output node No3, and a second source/drain electrode connected to the first gate common power line.

The thirty-second TFT T32 (or an even third pull-down TFT) may output, as the $i^{th}$ carry signal CSi, the first gate common power GVss1 through the third output node No3 based on the voltage of the third control node line QBe. For example, the thirty-second TFT T32 may include a gate electrode connected to the third control node line QBe, a first source/drain electrode connected to the third output node No3, and a second source/drain electrode connected to the first gate common power line.

Alternatively, the coupling capacitor Cc may be formed between the first control node line Q and the third output node No3. Furthermore, the coupling capacitor Cc may be formed in at least one of a region between the first control node line Q and the first output node No1, a region between the first control node line Q and the second output node No2, and a region between the first control node line Q and the third output node No3.

The second sensing control circuit SCC2 may be implemented to discharge the voltage of each of the second control node line QBo and the third control node line QBe in response to the voltage of the fourth control node line Qm and the external sensing control signal Scs.

The second sensing control circuit SCC2 according to an embodiment of the present disclosure may include a first node discharging circuit NDC1 and a second node discharging circuit NDC2.

The first node discharging circuit NDC1 may discharge the voltage of the second control node line QBo in response to the voltage of the fourth control node line Qm and the external sensing control signal Scs. As an embodiment, the first node discharging circuit NDC1 may supply the first gate common power GVss1 to the second control node line QBo in response to the voltage of the fourth control node line Qm having a high voltage level and the external sensing control signal Scs having a high voltage level, and thus, may discharge the voltage of the second control node line QBo to the first gate common power line or may reset the voltage of the second control node line QBo to the first gate common power GVss1.

The first node discharging circuit NDC1 according to an embodiment of the present disclosure may include a fortieth TFT T40 and a forty-first TFT T41.

The fortieth TFT T40 may transfer the first gate common power GVss1 to the forty-first TFT T41 in response to the voltage of the fourth control node line Qm. As an embodiment, the fortieth TFT T40 may be turned on based on a high voltage level of the fourth control node line Qm and may form a current path between the forty-first TFT T41 and the first gate common power GVss1.

The forty-first TFT T41 may electrically connect the second control node line QBo to the fortieth TFT T40 in response to the external sensing control signal Scs. As an embodiment, the forty-first TFT T41 may be turned on based on the external sensing control signal Scs having a high voltage level and may form a current path between the second control node line QBo and the fortieth TFT T40. The forty-first TFT T41 may be turned on based on the external sensing control signal Scs having a high voltage level in a state where the fortieth TFT T40 is turned on based on a high voltage level of the fourth control node line Qm, and thus, the voltage of the second control node line QBo may be discharged to the first gate common power line or may be reset to the first gate common power GVss1 through each of the forty-first TFT T41 and the fortieth TFT T40.

The second node discharging circuit NDC2 may discharge the voltage of the third control node line QBe in response to the voltage of the fourth control node line Qm and the external sensing control signal Scs. As an embodiment, the second node discharging circuit NDC2 may supply the first gate common power GVss1 to the third control node line QBe in response to the voltage of the fourth control node line Qm having a high voltage level and the external sensing control signal Scs having a high voltage level, and thus, may discharge the voltage of the third control node line QBe to the first gate common power line or may reset the voltage of the third control node line QBe to the first gate common power GVss1

The second node discharging circuit NDC2 according to an embodiment of the present disclosure may include a forty-second TFT T42 and a forty-third TFT T43.

The forty-second TFT T42 may transfer the first gate common power GVss1 to the forty-third TFT T43 in response to the voltage of the fourth control node line Qm. As an embodiment, the forty-second TFT T42 may be turned on based on a high voltage level of the fourth control node line Qm and may form a current path between the forty-third TFT T43 and the first gate common power GVss1.

The forty-third TFT T43 may electrically connect the third control node line QBe to the forty-second TFT T42 in response to the external sensing control signal Scs. As an embodiment, the forty-third TFT T43 may be turned on based on the external sensing control signal Scs having a high voltage level and may form a current path between the third control node line QBe and the forty-second TFT T42. The forty-third TFT T43 may be turned on based on the external sensing control signal Scs having a high voltage level in a state where the forty-second TFT T42 is turned on based on a high voltage level of the fourth control node line Qm, and thus, the voltage of the third control node line QBe may be discharged to the first gate common power line or may be reset to the first gate common power GVss1 through each of the forty-third TFT T43 and the forty-second TFT T42.

Alternatively, the second sensing control circuit SCC2 may be omitted together with the first sensing control circuit SCC1. That is, each of the first sensing control circuit SCC1 and the second sensing control circuit SCC2 may be a circuit which is used for sensing a characteristic value of a driving TFT disposed in a subpixel of a pixel based on an external sensing mode of the pixel, and when the pixel is not driven in the external sensing mode, each of the first sensing control circuit SCC1 and the second sensing control circuit SCC2 may be an undesired element and thus may be omitted.

The first to forty-third TFTs T1 to T43 illustrated in FIGS. 10 and 11 may be dispersively disposed (or divisionally disposed, or distributedly located) at one horizontal line of the display area AA and may be connected to one another through the $i^{th}$ branch network BNi, and thus, may configure the plurality of branch circuits 1511 to 151n illustrated in FIG. 8. For example, each of the stage circuit parts 1501 to 150m may include first to $n^{th}$ (where n is 43) branch circuits 1511 to 151n where one of the first to forty-third TFTs T1 to T43 is disposed or provided, but embodiments of the present disclosure are not limited thereto and each of the plurality of branch circuits 1511 to 151n may be implemented with at least one of the first to forty-third TFTs T1 to T43 based on the number of pixels disposed in one horizontal line.

Additionally, in the stage circuit part 150i illustrated in FIGS. 9 to 11, when the first switching TFT Tsw1 and the second switching TFT Tsw2 disposed in the pixel circuit PC of each of the plurality of subpixels SP1 to SP4 illustrated in FIG. 4 are turned on based on different first and second scan signals, the $i^{th}$ scan signal SSi may be used as a first scan signal supplied through a first gate line of the odd-numbered gate line GLo and the i+1$^{th}$ scan signal SSi+1 may be used as the first scan signal supplied through a first gate line of the even-numbered gate line GLe. Therefore, the output buffer circuit OBC of the stage circuit part 150i illustrated in FIGS. 9 to 11 may further include a fourth output buffer circuit and a fifth output buffer circuit.

The fourth output buffer circuit may be implemented to output a second scan signal to a second gate line of the odd-numbered gate line GLo, and the fifth output buffer circuit may be implemented to output the second scan signal to a second gate line of the even-numbered gate line GLe.

The fourth output buffer circuit according to an embodiment of the present disclosure may output an $i^{th}$ second scan signal having a voltage level of a second scan odd-numbered scan clock or a voltage level of the third gate common power GVss3 based on the voltage of each of the first to third control node lines Q, QBo, and QBe. Except for that the fourth output buffer circuit outputs the $i^{th}$ second scan signal based on the second scan odd-numbered scan clock, the fourth output buffer circuit may include three TFTs which are substantially the same as those of the first output buffer circuit OBC1 illustrated in FIG. 11, and thus, its repetitive description is omitted.

The fifth output buffer circuit according to an embodiment of the present disclosure may output an i+1$^{th}$ second scan signal having a voltage level of a second scan even-numbered scan clock or a voltage level of the third gate common power GVss3 based on the voltage of each of the first to third control node lines Q, QBo, and QBe. Except for that the fifth output buffer circuit outputs the i+1$^{th}$ second scan signal based on the second scan even-numbered scan clock, the fifth output buffer circuit may include three TFTs which are substantially the same as those of the second output buffer circuit OBC2 illustrated in FIG. 11, and thus, its repetitive description is omitted.

In the i$^{th}$ stage circuit part 150i illustrated in FIGS. 9 to 11, the odd-numbered scan clock sCLKo may be referred to as a first scanning odd-numbered scan clock, and the even-numbered scan clock sCLKe may be referred to as a first scanning even-numbered scan clock. For example, a first scanning scan clock and a second scanning scan clock may have the same phase or different phases. Also, the first scanning scan clock and the second scanning scan clock may have the same clock width or different clock widths.

In the i$^{th}$ stage circuit part 150i illustrated in FIGS. 9 to 11, each of the third control node line QBe, the fourth node control circuit NCC4 controlling the voltage of the third control node line QBe, a second node discharging circuit NDC2, and the second output buffer circuit OBC2 may be omitted depending on the driving manner (or method) of the gate driving circuit 150.

Figure 12:
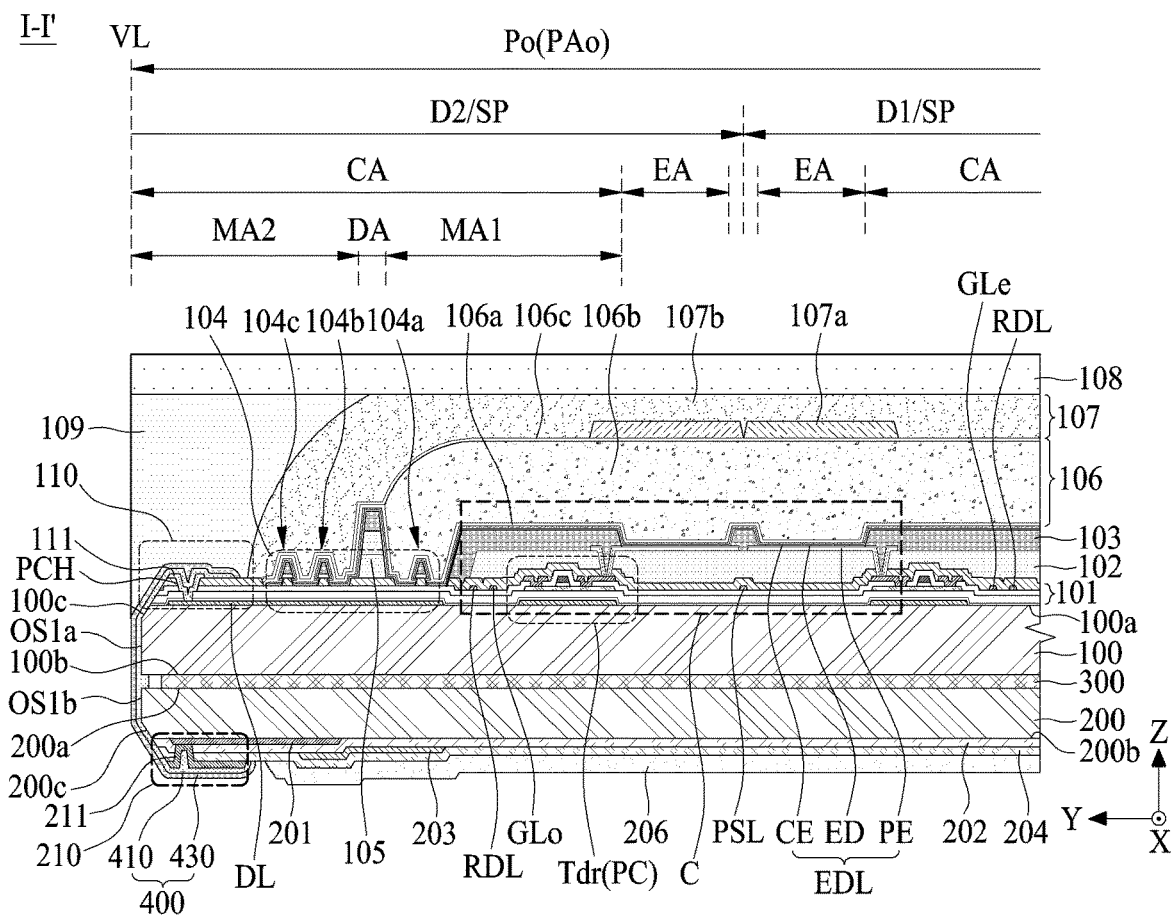
FIG. 12 is a cross-sectional view taken along line I-I' illustrated in FIG. 5.
Figure 13:
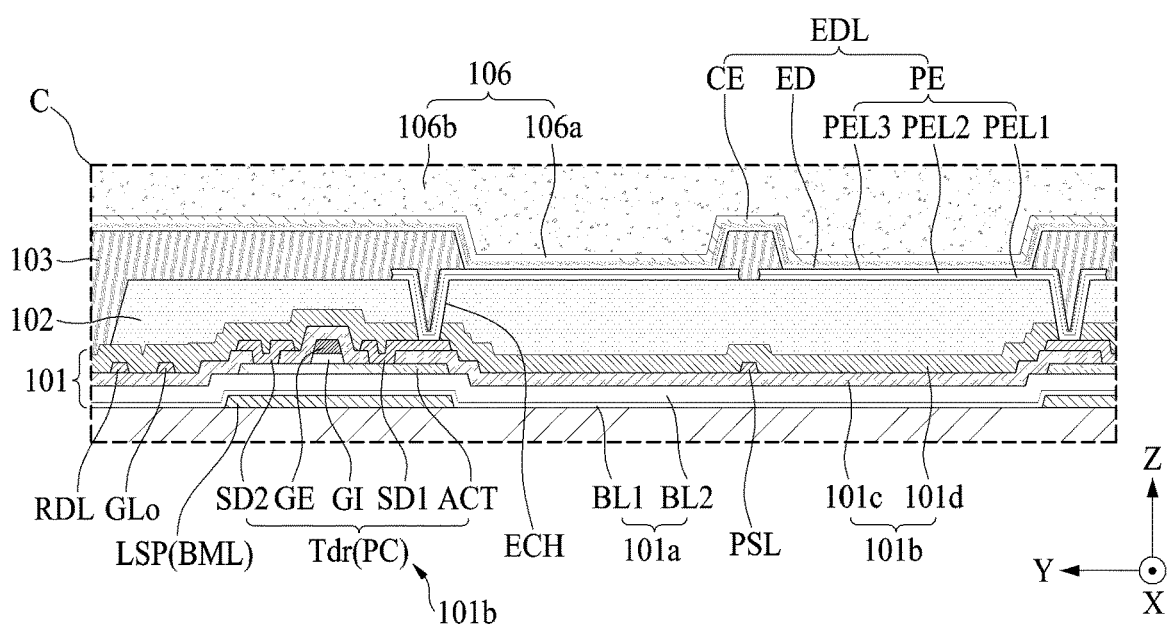
FIG. 13 is an enlarged view of a region 'C' illustrated in FIG. 12.
Figure 14:
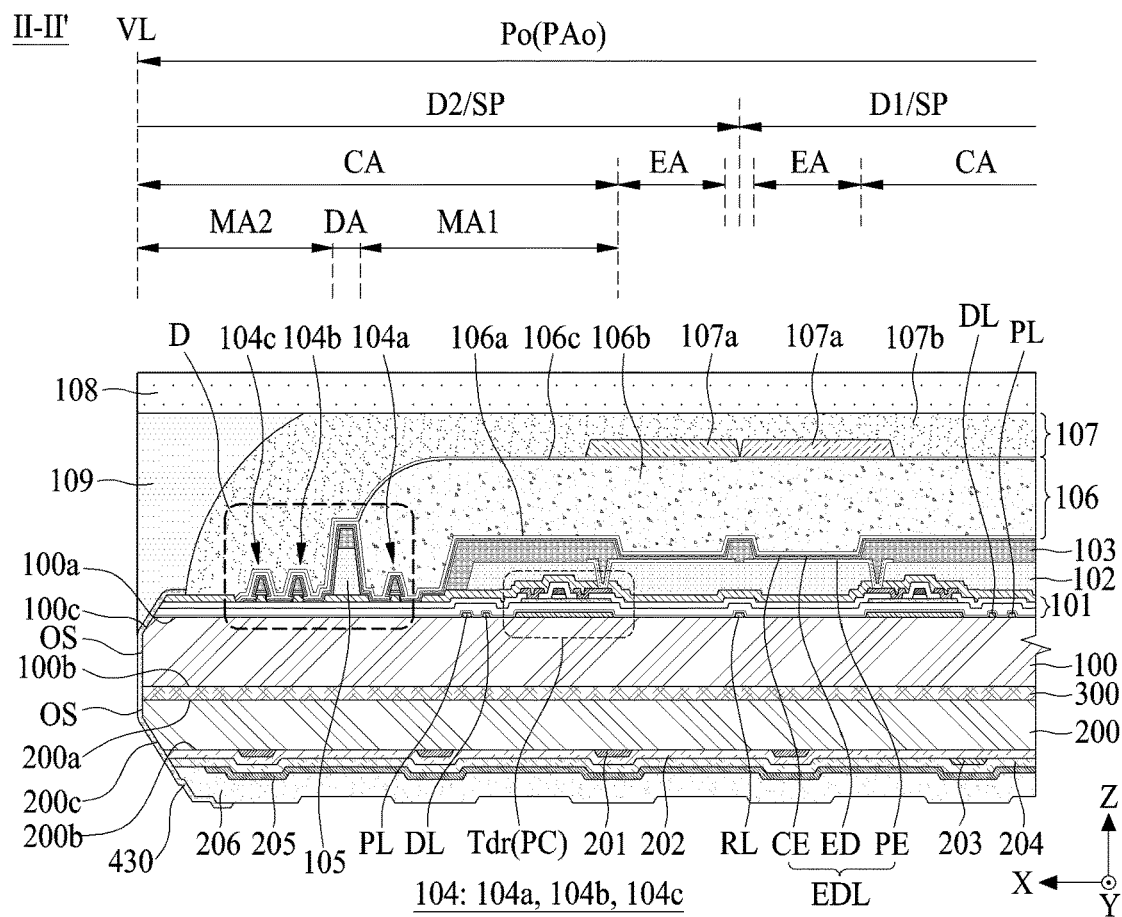
FIG. 14 is a cross-sectional view taken along line II-II' illustrated in FIG. 5.
Figure 15:
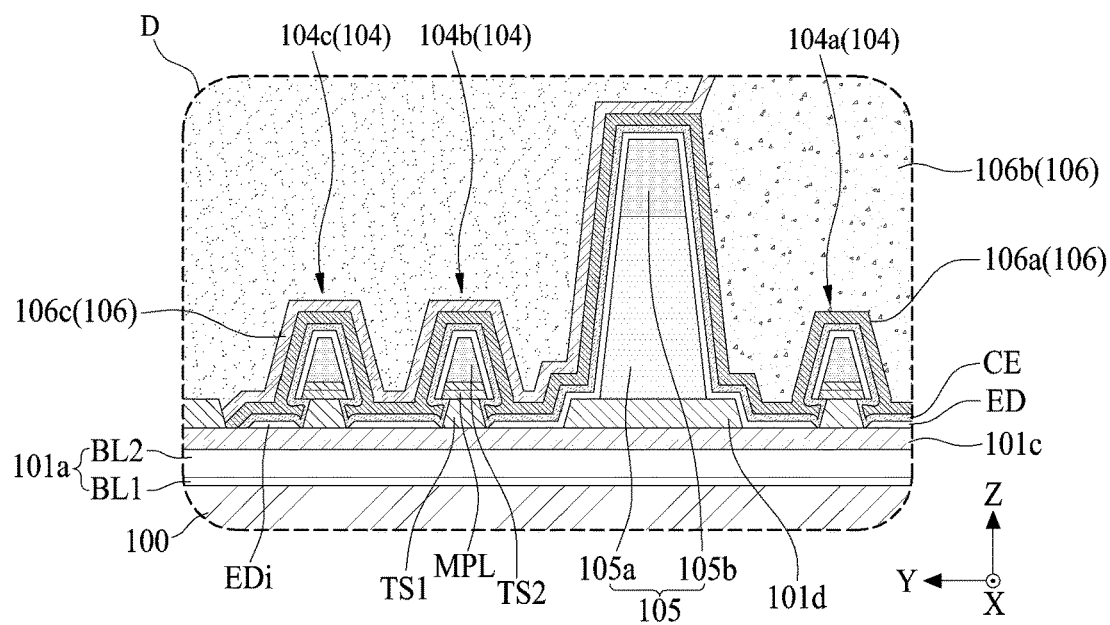
FIG. 15 is an enlarged view of a region 'D' illustrated in FIG. 14.

FIG. 12 is a cross-sectional view taken along line I-I' illustrated in FIG. 5, FIG. 13 is an enlarged view of a region 'C' illustrated in FIG. 12, FIG. 14 is a cross-sectional view taken along line II-II' illustrated in FIG. 5, and FIG. 15 is an enlarged view of a region 'D' illustrated in FIG. 14.

Referring to FIGS. 5 and 12 to 15, a light emitting display apparatus according to an embodiment of the present disclosure may include a first substrate 100, a second substrate 200, a coupling member 300, and a routing portion 400.

The first substrate 100 according to an embodiment of the present disclosure may include a circuit layer 101, a planarization layer 102, a light emitting device layer EDL, a bank 103, and a first pad part 110.

The circuit layer 101 may be disposed over the first substrate 100. The circuit layer 101 may be referred to as a pixel array layer or a TFT array layer.

The circuit layer 101 according to an embodiment of the present disclosure may include a buffer layer 101a and a circuit array layer 101b.

The buffer layer 101a may prevent materials, such as hydrogen included in the first substrate 100, from being diffused to the circuit array layer 101b in a high temperature process of a process of manufacturing a TFT. Also, the buffer layer 101a may prevent external water or moisture from penetrating into the light emitting device layer EDL. The buffer layer 101a according to an embodiment of the present disclosure may include silicon oxide (SiOx), silicon nitride (SiNx), silicon oxynitride (SiON), or a multilayer thereof, but embodiments of the present disclosure are not limited thereto. For example, the buffer layer 101a may include a first buffer layer BL1 which includes SiNx and is disposed on the first substrate 100 and a second buffer layer BL2 which includes SiOx and is disposed on the first buffer layer BL1.

The circuit array layer 101b may include a pixel circuit PC which includes a driving TFT Tdr disposed in each of a plurality of pixel areas PA over the buffer layer 101a.

The driving TFT Tdr disposed in a circuit area of the each pixel area PA may include an active layer ACT, a gate insulation layer GI, a gate electrode GE, an interlayer insulation layer 101c, a first source/drain electrode SD1, a second source/drain electrode SD2, and a passivation layer 101d.

The active layer ACT may be disposed on the buffer layer 101a in each pixel area PA. The active layer ACT may include a channel area, overlapping the gate electrode GE, and a first source/drain area and a second source/drain area parallel to each other between adjacent channel areas. The active layer ACT may have conductivity in a conductivity process, and thus, may be used as a bridge line of a jumping structure which directly connects lines in the display area AA or electrically connects lines disposed on different layers.

The gate insulation layer GI may be disposed on the channel area of the active layer ACT. The gate insulation layer GI may insulate the active layer ACT from the gate electrode GE.

The gate electrode GE may be disposed on the gate insulation layer GI and connected to the gate line. The gate electrode GE may overlap the channel area of the active layer ACT with the gate insulation layer GI therebetween.

The interlayer insulation layer 101c may be disposed at the first substrate 100 to cover the gate electrode GE and the active layer ACT. The interlayer insulation layer 101c may electrically insulate (or isolate) the gate electrode GE and the source/drain electrodes SD1 and SD2.

The first source/drain electrode SD1 may be disposed on the interlayer insulation layer 101c overlapping the first source/drain area of the active layer ACT and may be electrically connected to the first source/drain area of the active layer ACT through a first source/drain contact hole disposed in the interlayer insulation layer 101c. For example, the first source/drain electrode SD1 may be a source electrode of the driving TFT Tdr, and the first source/drain area of the active layer ACT may be a source area.

The second source/drain electrode SD2 may be disposed on the interlayer insulation layer 101c overlapping the second source/drain area of the active layer ACT and may be electrically connected to the second source/drain area of the active layer ACT through a second source/drain contact hole disposed in the interlayer insulation layer 101c. For example, the second source/drain electrode SD2 may be a drain electrode of the driving TFT Tdr, and the second source/drain area of the active layer ACT may be a drain area.

The passivation layer 101d may be disposed over the first substrate 100 to cover the pixel circuit PC including the driving TFT Tdr.

According to an embodiment of the present disclosure, when the interlayer insulation layer 101c is not disposed at the periphery portion of the first substrate 100, the passivation layer 101d disposed at the periphery portion of the first substrate 100 may directly contact the buffer layer 101a. For example, the passivation layer 101d may be referred to as a protection layer, a circuit protection layer, an insulation layer, a circuit insulation layer, or the like. For example, the passivation layer 101d may be formed of an inorganic insulating material, but embodiments of the present disclosure are not limited thereto.

Each of first and second switching TFT Tsw1 and Tsw2 configuring the pixel circuit PC may be formed with the driving TFT Tdr, and thus, their detailed descriptions are omitted.

The circuit layer 101 according to an embodiment of the present disclosure may further include a lower metal layer BML which is disposed between the first substrate 100 and the buffer layer 101a.

The lower metal layer BML may further include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the first substrate 100 and the active layer ACT. The light blocking pattern LSP may block light which is incident on the active layer ACT through the first substrate 100, thereby preventing or minimizing a threshold voltage variation of each TFT caused by external light. Optionally, the light blocking pattern LSP may be electrically connected to the first source/drain electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized, reduced or prevented.

The lower metal layer BML may be used as a line disposed in parallel with each other of the gate line GL, the data line DL, the pixel driving power line PL, the pixel common voltage line CVL, and the reference voltage line RL. For example, the lower metal layer BML may be used as a line (or a metal layer) disposed in parallel to the second direction Y of the pixel driving lines DL, GL, PL, CVL, RL, and GCL disposed at the first substrate 100.

The planarization layer 102 may be disposed over the first substrate 100 and may provide a flat surface over the circuit layer 101. The planarization layer 102 may cover the circuit layer 101 including the driving TFT Tdr disposed at each of the plurality of pixel areas PA. The planarization layer 102 according to an embodiment of the present disclosure may be formed of an organic insulating material, but embodiments of the present disclosure are not limited thereto. The planarization layer 102 according to an embodiment of the present disclosure may be formed to cover the remaining circuit layer 101 except a periphery portion of the passivation layer 101d disposed at the first substrate 100. For example, the planarization layer 102 may be disposed between the passivation layer 101d and the light emitting device layer EDL or disposed under the light emitting device layer EDL.

The light emitting device layer EDL may be disposed over the planarization layer 102. The light emitting device layer EDL according to an embodiment of the present disclosure may include a pixel electrode PE, a self-emitting device ED, and a common electrode CE.

The pixel electrode PE may be referred to as an anode electrode, a reflective electrode, a lower electrode, an anode, or a first electrode, of the self-emitting device ED.

The pixel electrode PE may be disposed over the planarization layer 102 overlapping an emission area EA of each of the plurality of subpixel SP in the first substrate 100. The pixel electrode PE may be patterned in an island shape and disposed in each subpixel SP, and may be electrically coupled to the first source/drain electrode SD1 of the driving TFT Tdr of a corresponding pixel circuit PC. For example, one side of the pixel electrode PE may extend onto the first source/drain electrode SD1 of the driving TFT Tdr and may be electrically coupled to the first source/drain electrode SD1 of the driving TFT Tdr through an electrode contact hole ECH provided in the planarization layer 102.

The pixel electrode PE may include a metal material which is low in work function and is good in reflective efficiency.

The pixel electrode PE according to an embodiment of the present disclosure may have a two-layer structure including a first pixel electrode layer (or a first metal layer) PEL1 and a second pixel electrode layer (or a second metal layer) PEL2. The first and second pixel electrode layers PEL1 and PEL2 may be sequentially deposited over the planarization layer 102 and then simultaneously patterned, but embodiments of the present disclosure are not limited thereto.

The first pixel electrode layer PEL1 may disposed over the planarization layer 102. The second pixel electrode layer PEL2 may disposed (or stacked) on the first pixel electrode layer PEL1. For example, the first pixel electrode layer PEL1 may act as an adhesive layer corresponding to the planarization layer 102 and may act as a secondary electrode of the self-emitting device ED, and moreover, may include indium tin oxide (ITO) or indium zinc oxide (IZO), but embodiments of the present disclosure are not limited thereto. For example, the second pixel electrode layer PEL2 may act as a reflector and may perform a function of decreasing a resistance of the pixel electrode PE, and moreover, may include one material of aluminum (Al), silver (Ag), molybdenum (Mo), titanium (Ti), and a Mo—Ti alloy (MoTi), but embodiments of the present disclosure are not limited thereto. For example, the pixel electrode PE according to an embodiment of the present disclosure may be formed in a two-layer structure of ITO/MoTi or IZO/MoTi.

The pixel electrode PE according to another embodiment of the present disclosure may have a three-layer structure including a first pixel electrode layer PEL1, a second pixel electrode layer PEL2 on the first pixel electrode layer PEL1, and a third pixel electrode layer (or a third metal layer) PEL3 on the second pixel electrode layer PEL2. The third pixel electrode layer PEL3 may act as an electrode of the self-emitting device ED and may include ITO or IZO. For example, the pixel electrode PE according to another embodiment of the present disclosure may be formed in a three-layer structure of IZO/MoTi/ITO or ITO/MoTi/ITO.

The pixel electrode PE according to another embodiment of the present disclosure may have a four-layer structure including a first pixel electrode layer PEL1, a second pixel electrode layer PEL2 on the first pixel electrode layer PEL1, a third pixel electrode layer (or a third metal layer) PEL3 on the second pixel electrode layer PEL2, a fourth pixel electrode layer (or a fourth metal layer) on the third pixel electrode layer PEL3.

In the pixel electrode PE of the four-layer structure, the first pixel electrode layer may act as the adhesive layer corresponding to the planarization layer 102 and may act as the secondary electrode of the self-emitting device ED, and moreover, may include one or more material of ITO, Mo, and MoTi. The second pixel electrode layer may act a function of decreasing a resistance of the pixel electrode PE and may include Cu. The third pixel electrode layer may act as a reflector and may include one or more material of Al, Ag, Mo, Ti, and MoTi. The fourth pixel electrode layer may act as an electrode of the self-emitting device ED and may include ITO or IZO. For example, the pixel electrode PE according to another embodiment of the present disclosure may be formed in a four-layer structure of ITO/Cu/MoTi/ITO.

The pixel electrode PE according to another embodiment of the present disclosure may have a five-layer structure including a first pixel electrode layer made of ITO, a second pixel electrode layer made of MoTi, a third pixel electrode layer made of ITO, a fourth pixel electrode layer made of Ag, and a fifth pixel electrode layer made of ITO.

The self-emitting device ED may be disposed over the first substrate 100. The self-emitting device ED may be formed over the pixel electrode PE and may directly contact the pixel electrode PE. The pixel electrode PE may be disposed under (or below) the self-emitting device ED. For example, the pixel electrode PE may be disposed between the planarization layer 102 and the self-emitting device ED.

The self-emitting device ED according to an embodiment of the present disclosure may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). The self-emitting device ED according to an embodiment of the present disclosure may include an organic light emitting device, or may include a stacked or a combination structure of an organic light emitting device and a quantum dot light emitting device. For example, the self-emitting device ED according to another embodiment of the present disclosure may include an organic light emitting layer, or may include a stacked or a combination structure of an organic light emitting layer and a quantum dot light emitting layer.

The organic light emitting device according to an embodiment of the present disclosure may include two or more organic light emitting parts for emitting white light (or blue light). For example, the organic light emitting device may include a first organic light emitting part and a second organic light emitting part for emitting white light based on a combination of first light and second light. For example, the first organic light emitting part may include at least one or more of a blue light emitting layer, a green light emitting layer, a red light emitting layer, a yellow light emitting layer, and a yellow-green light emitting layer. The second organic light emitting part may include at least one or more of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device according to an embodiment of the present disclosure may further include at least one or more function layers for enhancing emission efficiency and/or lifetime. For example, the function layer may be disposed upper and/or under a light emitting layer.

The common electrode CE may be disposed over the display area AA of the first substrate 100 and may be electrically coupled to the self-emitting device ED each of the plurality of pixels P. For example, the common electrode CE may be disposed over the remaining display area AA of the first substrate 100 except for the first pad part 110 of the first substrate 100.

The common electrode CE may be referred to as a cathode electrode, a transparent electrode, an upper electrode, a cathode, or a second electrode of the self-emitting device ED. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

The common electrode CE according to an embodiment of the present disclosure may be formed in a single-layer structure or a multi-layer structure, which includes at least one material of graphene and a transparent conductive material which is relatively high in work function. For example, the common electrode CE may include metal oxide such as ITO or IZO, or may include a combination of oxide and metal such as ZnO:Al or $SnO_2$:Sb.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank 103 may be disposed over the planarization layer 102 to define (e.g., laterally surround) the pixel areas PA over the first substrate 100. The bank 103 may be disposed over the planarization layer 102 to cover a periphery portion of the pixel electrode PE. The bank 103 may define (e.g., laterally surround) the emission area EA (or an opening portion) of each of the plurality of subpixels SP and may electrically isolate the pixel electrodes PE disposed in adjacent subpixels SP. The bank 103 may be formed to cover the electrode contact hole ECH disposed in each of the plurality of pixel areas PA. The bank 103 may be covered by the self-emitting device ED of the light emitting device layer EDL. For example, the self-emitting device ED may be disposed over the bank 103 as well as over the pixel electrode PE of each of the plurality of subpixels SP.

The bank 103 according to an embodiment of present disclosure may be a transparent bank including a transparent material or a black bank (or an opaque bank) including a black pigment.

The first pad part 110 may be disposed at one periphery portion of the first substrate 100 and may be electrically coupled to the pixel driving lines DL, GL, PL, CVL, RL, and GCL in a one-to-one relationship.

The first pad part 110 according to an embodiment of the present disclosure may include a plurality of first pads 111. The plurality of first pads 111 may be divided (or classified) into first data pads DP1, first gate pads GP1, first pixel driving power pads PPP1, first reference voltage pads RVP1, and first pixel common voltage pads CVP1 as described with reference to FIGS. 3 and 4, and thus, their repetitive descriptions are omitted.

Each of the plurality of first pads 111 may be electrically coupled to a corresponding line of the pixel driving lines DL, GL, PL, CVL, RL, and GCL through a pad contact hole PCH passing through the passivation layer 101d, the interlayer insulation layer 101c, and the buffer layer 101a. Each of the plurality of first pads 111 according to an embodiment of the present disclosure may include the same material as the pixel electrode PE and may be formed together with the pixel electrode PE. According to another embodiment of the present disclosure, each of the plurality of first pads 111 may include the same material as a source/drain electrode of a TFT and may be formed together with the source/drain electrode of the TFT.

The light emitting display apparatus or the first substrate 100 according to an embodiment of the present disclosure may further include a device isolation portion 104, a dam portion 105, and an encapsulation layer 106.

Referring to FIGS. 12, 14, and 15, the device isolation portion 104 according to an embodiment of the present disclosure may be disposed at a periphery portion of the first substrate 100 or a periphery portion of an outermost pixel. For example, the outermost pixels disposed at the periphery portion of the first substrate 100 may include the device isolation portion 104, and thus may be implemented to have a configuration or a structure which differs from an inner pixel. In the following description, the device isolation portion 104 may be referred to as an isolation portion 104.

The isolation portion 104 may be implemented to isolate (or disconnect) the self-emitting device ED. The isolation portion 104 may be implemented to prevent the penetration of water or moisture in a lateral direction of the first substrate 100 to prevent the self-emitting device ED from being degraded by the lateral penetration of water or moisture. The isolation portion 104 may isolate (or disconnect) the self-emitting device ED of the light emitting device layer EDL at least once, at a position near the dam portion 105, and thus, may prevent the lateral penetration of water or moisture. For example, the isolation portion 104 may be an isolation region, an isolation line, a disconnection region, or a disconnection line, of the self-emitting device ED.

The isolation portion 104 may be implemented over the interlayer insulation layer 101c in the first substrate 100 to surround the display area AA. For example, the isolation portion 104 may be implemented in a closed loop line shape on the interlayer insulation layer 101c to surround the display area AA in one-dimensionally.

The isolation portion 104 according to an embodiment of the present disclosure may include a plurality of device isolation patterns 104a to 104d disposed over the interlayer insulation layer 101c in the outermost pixels. For example, the isolation portion 104 may include first to third device isolation patterns 104a, 104b, and 104c implemented in parallel to each other to have a closed loop line shape. In the following description, the device isolation pattern may be referred to as an isolation pattern.

Each of the first to third isolation patterns 104a, 104b, and 104c according to an embodiment of the present disclosure may include a first trench structure TS1, a metal pattern layer MPL, and a second trench structure TS2.

The first trench structure TS1 may be implemented by the passivation layer 101d. The first trench structure TS1 may be formed by a patterning process performed on the passivation layer 101d disposed at the outermost pixels. For example, the first trench structure TS1 may be formed by a patterning process performed on the passivation layer 101d using an etching process. For example, the first trench structure TS1 may be referred to as a first isolation structure, a first taper structure, or the like.

A lateral surface (or side surface) of the first trench structure TS1 according to an embodiment of the present disclosure may be implemented in an inclined structure or a forward tapered structure. For example, a cross-sectional surface of the first trench structure TS1 taken along a width direction may have a cross-sectional structure having a trapezoid shape where an upper side is narrower than a lower side.

The metal pattern layer MPL may be disposed over the first trench structure TS1. The metal pattern layer MPL may have at least two-layer structure which is the same as the pixel electrode PE. For example, the metal pattern layer MPL may include a first metal layer which is formed together with a first pixel electrode layer PEL1 of a pixel electrode PE and directly contacts the top surface of the first trench structure TS1, and a second metal layer which is formed together with a second pixel electrode layer PEL2 of the pixel electrode PE and is disposed (or stacked) over the first metal layer. For example, in the metal pattern layer MPL, the first metal layer may be an ITO material, and the second metal layer may be a molybdenum-titanium alloy (MoTi), but embodiments of the present disclosure are not limited thereto.

The metal pattern layer MPL may have a width which is wider than the top surface of the first trench structure TS1. A lateral surface of the metal pattern layer MPL may be implemented in an inclined structure or a forward tapered structure. For example, a cross-sectional surface of the metal pattern layer MPL taken along a width direction may have a cross-sectional structure having the same trapezoid shape as the first trench structure TS1. With respect to the width direction, each of one side periphery portion and the other side periphery portion of the metal pattern layer MPL may protrude to the outside of the lateral surface of the first trench structure TS1.

The lateral surface of the first trench structure TS1 may have an undercut structure with respect to the metal pattern layer MPL. For example, a boundary portion between the first trench structure TS1 and the metal pattern layer MPL or an upper lateral surface (or upper side surface) of the first trench structure TS1 may have an undercut structure with respect to the metal pattern layer MPL. Accordingly, the metal pattern layer MPL may have an eaves structure with respect to the first trench structure TS1. It should be understood that "eaves structure" includes the meaning of an overhang portion. For example, as shown in FIG. 15, right and left ends of the metal pattern layer MPL along the Y-axis direction overhang (e.g., extend past) an upper surface and sidewalls of the first trench structure TS1.

The second trench structure TS2 may be disposed over the metal pattern layer MPL. For example, the second trench structure TS2 may be referred to as a second isolation structure, a second tapered structure, or the like.

The second trench structure TS2 may include an organic insulating material. The second trench structure TS2 according to an embodiment of the present disclosure may include the same material as the bank 103, but embodiments of the present disclosure are not limited thereto.

A lower surface of the second trench structure TS2 may have the same width as a top surface of the metal pattern layer MPL. In the second trench structure TS2, the top surface may have the same width as the lower surface or may have a narrower width. For example, a side surface of the second trench structure TS2 may be implemented in an inclined structure or a forward tapered structure.

As described above, the isolation portion 104 including the first to third isolation patterns 104a, 104b, and 104c may isolate (or disconnect) the self-emitting device ED, or may isolate (or disconnect) the self-emitting device ED and the common electrode CE. For example, the self-emitting device ED formed (or deposited) over the isolation portion 104 may be automatically isolated (or disconnected) in performing a deposition process by the undercut structure (or the eaves structure) of each of the first to third isolation patterns 104a, 104b, and 104c, without a separate isolation process. Accordingly, the self-emitting device ED may include an isolation region isolated by the isolation portion 104.

According to an embodiment of the present disclosure, a deposition material of the self-emitting device ED made of the organic light emitting device may have linearity, and thus, may not be deposited at the lateral surface of the first trench structure TS1 covered by the metal pattern layer MPL based on the undercut structure (or the eaves structure) of each of the first to third isolation patterns 104a, 104b, and 104c. Therefore, the self-emitting device ED formed (or deposited) over the isolation portion 104 may be isolated (or disconnected) between the first trench structure TS1 and the metal pattern layer MPL of each of the first to third isolation patterns 104a, 104b, and 104c. Thus, the self-emitting device ED may be automatically isolated (or disconnected) by the first to third isolation patterns 104a, 104b, and 104c of the isolation portion 104 in performing a deposition process, and thus, a separate patterning process of isolating (or disconnecting) the self-emitting device ED may be omitted. Accordingly, the self-emitting device ED disposed over the first substrate 100 may be isolated (or disconnected) at a periphery portion of the first substrate 100, and thus, a lateral water penetration path of the first substrate 100 may be blocked by the first to third isolation patterns 104a, 104b, and 104c of the isolation portion 104.

Optionally, the common electrode CE disposed over the self-emitting device ED may be automatically isolated (or disconnected) by the first to third isolation patterns 104a, 104b, and 104c of the isolation portion 104 in performing a deposition process based on deposition, or may be formed to surround all of the isolated island-shaped self-emitting devices EDi and the first to third isolation patterns 104a, 104b, and 104c of the isolation portion 104 in performing a deposition process based on deposition.

Referring to FIGS. 12, 14, and 15, the dam portion 105 according to an embodiment of the present disclosure may be disposed at the periphery portion of the first substrate 100 or the periphery portion of an outermost pixel. For example, the outermost pixels disposed at the periphery portion of the first substrate 100 may further include the dam portion 105, and thus may be implemented to have a configuration or a structure which differs from an inner pixel.

The dam portion 105 may be disposed over the circuit layer 101 of the periphery portion of the first substrate 100 or the periphery portion of an outermost pixel to have a closed loop line shape. For example, the dam portion 105 may be disposed over the passivation layer 101d of the circuit layer 101 to have a closed loop line shape which surrounds the display area AA. The dam portion 105 may prevent the spread or overflow of the encapsulation layer 106 disposed over the first substrate 100 to cover the display area AA.

The dam portion 105 may be disposed between two adjacent isolation patterns of the plurality of isolation patterns 104a, 104b, and 104c. For example, the dam portion 105 may be implemented in a closed loop line shape to surround the first isolation pattern 104a and may be implemented to be surrounded by the second and third isolation patterns 104b and 104c. For example, the dam portion 105 may be disposed between the first isolation pattern 104a and the second isolation pattern 104b of the isolation portion 104.

The dam portion 105 according to an embodiment of the present disclosure may include the same material together with the planarization layer 102. The dam portion 105 may have the same height (or thickness) as the planarization layer 102, or may have a height which is higher than the planarization layer 102. For example, a height (or thickness) of the dam portion 105 may be twice a height (or thickness) of the planarization layer 102.

The dam portion 105 according to another embodiment of the present disclosure may include a first dam pattern (or a lower dam) 105a which is formed of the same material together with the planarization layer 102, and a second dam pattern (or an upper dam) 105b which is stacked on the first dam pattern 105a and includes the same material as the bank 103. The first dam pattern 105a may have the same height (or thickness) as the planarization layer 102, or may have a height which is higher than the planarization layer 102. For example, a height (or thickness) of the first dam pattern 105a may be twice a height (or thickness) of the planarization layer 102.

Referring to FIGS. 12 to 15, the encapsulation layer 106 according to an embodiment of the present disclosure may be disposed over a remaining portion, other than an outermost periphery portion including the first pad part 110, of the first substrate 100 and may be implemented to cover the light emitting device layer EDL. For example, the encapsulation layer 106 may be implemented to surround all of the front surface and lateral surfaces of the light emitting device layer EDL, and thus, may prevent oxygen or water (or moisture) from penetrating into the light emitting device layer EDL, thereby improving the reliability of the light emitting device layer EDL by oxygen or water (or moisture).

The encapsulation layer 106 according to an embodiment of the present disclosure may include first to third encapsulation layers 106a to 106c.

The first encapsulation layer 106a may be implemented to prevent oxygen or water from penetrating into the light emitting device layer EDL. The first encapsulation layer 106a may be disposed over the common electrode CE and may surround the light emitting device layer EDL. Therefore, all of a front surface and lateral surfaces of the light emitting device layer EDL may be surrounded by the first encapsulation layer 106a. The first encapsulation layer 106a according to an embodiment of the present disclosure may include an inorganic insulating material.

When the self-emitting device ED and the common electrode CE are isolated by the isolation portion 104, the first encapsulation layer 106a may surround an isolation surface (or a disconnection surface) of the self-emitting device ED and the common electrode CE isolated by the isolation portion 104. For example, the first encapsulation layer 106a may be filled (or buried) into an isolation space of the self-emitting device ED and the common electrode CE formed by an isolation structure (or an undercut structure) of the isolation portion 104 to seal or fully surround the isolation portion 104, and thus, may fully surround or cover each of the isolated self-emitting device ED and common electrode CE, thereby fundamentally (or completely) preventing the lateral penetration of water (or moisture).

The second encapsulation layer 106b may be implemented on the first encapsulation layer 106a to have a thickness which is relatively thicker than the first encapsulation layer 106a. The second encapsulation layer 106b may have a thickness for fully cover particles (or an undesired material or an undesired structure element) which is or may be on the first encapsulation layer 106a. The second encapsulation layer 106b may spread to the periphery portion of the first substrate 100 due to a relatively thick thickness, but the spread of the second encapsulation layer 106b may be blocked by the dam portion 105. The second encapsulation layer 106b may be referred to as a particle cover layer. The second encapsulation layer 106b according to an embodiment of the present disclosure may include an organic insulating material or a liquid organic insulating material.

The third encapsulation layer 106c may be implemented to primarily prevent oxygen or water from penetrating into the light emitting device layer EDL. The third encapsulation layer 106c may be implemented to surround all of the second encapsulation layer 106b disposed inside from the dam portion 105 and the first encapsulation layer 106a disposed outside from the dam portion 105. The third encapsulation layer 106c according to an embodiment of the present disclosure may include an inorganic insulating material which is the same as or different from the first encapsulation layer 106a.

The light emitting display apparatus or the first substrate 100 according to an embodiment of the present disclosure may further include a first margin area MA1, a second margin area MA2, and a dam area DA.

The first margin area MA1 may be disposed between an emission area EA of the outermost pixel Po and the dam portion 105. The first margin area MA1 may be configured to have a first width between an end of the emission area EA (or the bank 103) of the outermost pixel Po and the dam portion 105 based on the reliability margin of the light emitting device layer EDL caused by lateral water penetration of water or moisture or moisture. Accordingly, the dam portion 105 may be implemented to be spaced apart from the end of the emission area EA by the first width of the first margin area MA1 with respect to the first direction X.

The second margin area MA2 may be disposed between the outer surface OS of the first substrate 100 and the dam portion 105. The second margin area MA2 may be configured to have a second width between the outer surface OS of the first substrate 100 and the dam portion 105 based on the reliability margin of the light emitting device layer EDL caused by lateral water penetration of water or moisture or moisture. Accordingly, the dam portion 105 may be implemented to be spaced apart from the outer surface OS of the first substrate 100 by the second width of the second margin area MA2 with respect to the first direction X. For example, the second margin area MA2 may be an area including the first pad part 110 and the second and third isolation patterns 104b and 104c.

The dam area DA may be disposed between the first margin area MA1 and the second margin area MA2. The dam area DA may be configured to have a third width corresponding to a width of a lowermost bottom surface (or a bottom surface) of the dam portion 105. For example, the dam area DA may be an area including the dam portion 105.

With respect to the first direction X, a width of each of the first margin area MA1, the second margin area MA2, and the dam area DA may be implemented so that a second interval D2 between a center portion of the outermost pixel and the outer surface OS of the first substrate 100 is half or less of a pixel pitch (a first interval D1) between two adjacent pixel areas PA.

Referring again to FIGS. 12 to 14, the light emitting display apparatus or the first substrate 100 according to an embodiment of the present disclosure may further include a wavelength conversion layer 107 disposed over the encapsulation layer 106.

The wavelength conversion layer 107 may convert a wavelength of light which is incident thereon from an emission area of each pixel area PA. For example, the wavelength conversion layer 107 may convert white light (or blue light), which is incident thereon from the emission area, into color light corresponding to the subpixel SP or may transmit only color light corresponding to the subpixel SP. For example, the wavelength conversion layer 107 may include at least one of a wavelength conversion member and a color filter layer.

The wavelength conversion layer 107 according to an embodiment of the present disclosure may include a plurality of wavelength conversion members 107a and a protection layer 107b.

The plurality of wavelength conversion members 107a may be disposed over the encapsulation layer 106 disposed at the emission area EA of each of the plurality of subpixels SP. For example, each of the plurality of wavelength conversion members 107a may be implemented to have the same size as or wider than the emission area EA of each subpixel SP.

The plurality of wavelength conversion members 107a according to an embodiment of the present disclosure may be divided (or classified) into a red light filter which converts white light into red light, a green light filter which converts white light into green light, and a blue light filter which converts white light into blue light. For example, the red light filter (or a first light filter) may be disposed over the encapsulation layer 106 in the emission area EA of the red subpixel SP, the green light filter (or a second light filter) may be disposed over the encapsulation layer 106 in the emission area EA of the green subpixel SP, and the blue light filter (or a third light filter) may be disposed over the encapsulation layer 106 in the emission area EA of the blue subpixel SP.

The plurality of wavelength conversion members 107a according to another embodiment of the present disclosure may be disposed over the encapsulation layer 106 of each subpixel SP. For example, each of the plurality of wavelength conversion members 107a may be disposed over the encapsulation layer 106 to overlap the entire corresponding subpixel SP.

The plurality of wavelength conversion members 107a according to another embodiment of the present disclosure may be implemented to overlap each other at the encapsulation layer 106 overlapped with the circuit area CA (or the non-emission area) except for the emission area EA of each subpixel SP. For example, two or more wavelength conversion members 107a having different colors are disposed at the encapsulation layer 106 overlapping the circuit area CA (or non-emission area) except for the emission area EA of each subpixel SP. The two or more wavelength conversion members 107a disposed at the encapsulation layer 106 overlapping the circuit area CA (or non-emission area) may act as a function of a light blocking pattern which prevents color mixture between adjacent subpixels SP or between adjacent pixels P.

The protection layer 107b may be implemented to cover the wavelength conversion members 107a and to provide a flat surface over the wavelength conversion members 107a. The protection layer 107b may be disposed to cover the wavelength conversion members 107a and the encapsulation layer 106 where the wavelength conversion members 107a are not disposed. The protection layer 107b according to an embodiment of the present disclosure may include an organic insulating material. Alternatively, the protection layer 107b may further include a getter material for adsorbing water and/or oxygen.

Optionally, the wavelength conversion layer 107 according to another embodiment of the present disclosure may include two or more layers wavelength conversion members 107a disposed over the encapsulation layer 106 overlapping the circuit area CA (or non-emission area) except for the emission area EA in each subpixel SP. The two or more layers wavelength conversion members 107a may act as a function of the light blocking pattern.

Alternatively, the wavelength conversion layer 107 may be changed to a wavelength conversion sheet having a sheet form and may be disposed over the encapsulation layer 106. In this case, the wavelength conversion sheet (or a quantum dot sheet) may include the wavelength conversion members 107a disposed between a pair of films. For example, when the wavelength conversion layer 107 includes a quantum dot which re-emits colored light set in a subpixel, the light emitting device layer EDL of a subpixel SP may be implemented to emit white light or blue light.

Referring to FIGS. 12 to 14, the light emitting display apparatus or the first substrate 100 according to an embodiment of the present disclosure may further include a functional film 108.

The functional film 108 may be disposed over the wavelength conversion layer 107. For example, the functional film 108 may be coupled to over the wavelength conversion layer 107 by a transparent adhesive member. The functional film 108 according to an embodiment of the present disclosure may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 10, from traveling to the outside.

The barrier layer may include a material (for example, a polymer material) which is low in water transmission rate, and may primarily prevent the penetration of water or oxygen.

The touch sensing layer may include a touch electrode layer based on a mutual capacitance method or a self-capacitance method, and may output touch data corresponding to a user's touch through the touch electrode layer.

The light path control layer may include a stacked structure where a high refraction layer and a low refraction layer are alternately stacked and may change a path of light incident from each pixel P to minimize or reduce a color shift based on a viewing angle.

Referring to FIGS. 12 to 14, the light emitting display apparatus or the first substrate 100 according to an embodiment of the present disclosure may further include a side sealing member 109.

The side sealing member 109 may be formed between the first substrate 100 and the functional film 108 and may cover all of lateral surfaces of the circuit layer 101 and the wavelength conversion layer 107. For example, the side sealing member 109 may cover all of lateral surfaces of each of the circuit layer 101 and the wavelength conversion layer 107 exposed at the outside of the display apparatus, between the functional film 108 and the first substrate 100. Also, the side sealing member 109 may cover a portion of the routing portion 400 coupled to the first pad part 110 of the first substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the first pad part 110 of the first substrate 100 may prevent or minimize or reduce the reflection of external light caused by the first pads 111 disposed in the first pad part 110.

Optionally, the side sealing member 109 may further include a getter material for adsorbing water and/or oxygen.

The light emitting display apparatus or the first substrate 100 according to an embodiment of the present disclosure may further include a first chamfer 100c which is provided at a corner portion between the first surface 100a and the outer surface OS. The first chamfer 100c may reduce or minimize the damage of the corner portion of the first substrate 100 caused by a physical impact applied from the outside and may prevent a disconnection of the routing portion 400 caused by the corner portion of the first substrate 100. For example, the first chamfer 100c may have a 45-degree angle, but embodiments of the present disclosure are not limited thereto. The first chamfer 100c may be implemented by a chamfer process using a cutting wheel, a polishing wheel, a laser, or the like. Accordingly, each of outer surfaces of the pad electrodes 111 of the first pad part 110 disposed to contact the first chamfer 100c may include an inclined surface which is inclined by an angle corresponding to an angle of the first chamfer 100c by removing or polishing a corresponding portion thereof along with the corner portion of the first substrate 100 through the chamfer process. For example, when the first chamfer 100c is formed at an angle of 45 degrees between the outer surface OS and the first surface 100a of the first substrate 100, the outer surfaces (or one ends) of the pad electrodes 111 of the first pad part 110 may be formed at an angle of 45 degrees.

Referring to FIGS. 5 to 7, 12, and 14, the second substrate 200 according to an embodiment of present disclosure may include a second pad part 210, at least one third pad part 230, and a link line part 250 as described with reference to FIGS. 5 and 6, and thus, their repetitive descriptions are omitted or may be brief.

The second substrate 200 according to an embodiment of the present disclosure may include a metal pattern layer and an insulation layer which insulates the metal pattern layer.

The metal pattern layer (or a conductive pattern layer) may include a plurality of metal layers. The metal pattern layer according to an embodiment of the present disclosure may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over a rear surface 200b of a second substrate 200. The first metal layer 201 according to an embodiment of the present disclosure may include a first metal pattern. For example, the first metal layer 201 may be referred to as a first link layer or a link line layer.

The first metal pattern according to an embodiment of the present disclosure may have a two-layer structure (Cu/MoTi) of Cu and MoTi. The first metal pattern may be used as a link line of the link line part 250, and thus, its repetitive descriptions may be omitted.

The first insulation layer 202 may be implemented over the rear surface 200b of the second substrate 200 to cover the first metal layer 201. The first insulation layer 202 according to an embodiment of the present disclosure may include an inorganic insulating material.

The second metal layer 203 may be implemented over the first insulation layer 202. The second metal layer 203 according to an embodiment of the present disclosure may include a second metal pattern. For example, the second metal layer 203 may be referred to as a second link layer, a jumping line layer, or a bridge line layer.

The second metal pattern according to an embodiment of the present disclosure may have a two-layer structure (Cu/MoTi) of Cu and MoTi. The second metal pattern may be used as a plurality of gate link lines of a plurality of link lines in the link line part 250, but embodiments of the present disclosure are not limited thereto. For example, the second metal layer 203 may be used as a jumping line (or a bridge line) for electrically connecting the link lines which are formed of different metal materials on different layers in the link line part 250.

Optionally, a link line (for example, a plurality of first link lines) disposed at the second metal layer 203 may be modified to be disposed at the first metal layer 201, and a link line (for example, a plurality of second link lines) disposed at the first metal layer 201 may be modified to be disposed at the second metal layer 203.

The second insulation layer 204 may be implemented over the rear surface 200b of the second substrate 200 to cover the second metal layer 203. The second insulation layer 204 according to an embodiment of the present disclosure may include an inorganic insulating material.

The third metal layer 205 may be implemented over the second insulation layer 204. The third metal layer 205 according to an embodiment of the present disclosure may include a third metal pattern. For example, the third metal layer 205 may be referred to as a third link layer or a pad electrode layer.

The third metal pattern according to an embodiment of the present disclosure may have a stacked structure of at least two materials of ITO (or IZO), Mo, Ti, and MoTi. For example, the third metal pattern may have a three-layer structure of any one of ITO/Mo/ITO, ITO/MoTi/ITO, IZO/Mo/ITO, or IZO/MoTi/ITO. The third metal pattern may be used as pads 211 of the second pad part 210. For example, the pads 211 of the second pad part 210 formed of the third metal layer 205 may be electrically coupled to the first metal layer 201 through the pad contact holes formed at the first and second insulation layers 202 and 204.

The third insulation layer 206 may be implemented over the rear surface 200b of the second substrate 200 to cover the third metal layer 205. The third insulation layer 206 according to an embodiment of the present disclosure may include an organic material. For example, the third insulation layer 206 may include an insulating material such as photo acrylic or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

Each of the plurality of second pads 211 disposed at the second pad part 210 may be electrically coupled to a link line of a link line part 250 made of the first metal layer 201 or the second metal layer 203 disposed at the rear surface 200b of the second substrate 200, through a second pad contact hole disposed at the first and second insulation layers 202 and 204. For example, the second data pad may be electrically coupled to one end of a data link line 251 through the second pad contact hole disposed at the first and second insulation layers 202 and 204.

Referring to FIGS. 5, 12, and 14, the coupling member 300 according to an embodiment of present disclosure may be disposed between the first substrate 100 and the second substrate 200. The first substrate 100 and the second substrate 200 may be opposite-bonded to each other by the coupling member 300. The coupling member 300 according to an embodiment of the present disclosure may be a transparent adhesive member or a double-sided tape including an optically clear adhesive (OCA), an optically clear resin (OCR), or a pressure sensitive adhesive (PSA). The coupling member 300 according to another embodiment of the present disclosure may include a glass fiber.

The coupling member 300 according to an embodiment of the present disclosure may be disposed at a whole space between the first substrate 100 and the second substrate 200. For example, all of the second surface 100b of the first substrate 100 may be coupled to all of one surface of the coupling member 300, and all of a front surface 200a of the second substrate 200 may be coupled to all of the other surface of the coupling member 300.

The coupling member 300 according to another embodiment of the present disclosure may be disposed in a pattern structure between the first substrate 100 and the second substrate 200. For example, the coupling member 300 may have a line pattern structure or a mesh pattern structure. The mesh pattern structure may further include a bent portion which discharges an air bubble, occurring between the first substrate 100 and the second substrate 200 in a process of bonding the first substrate 100 to the second substrate 200, to the outside.

Referring to FIGS. 5 and 12 to 14, a routing portion 400 according to an embodiment of the present disclosure may include a plurality of routing lines 410 which electrically and respectively connect first pads 111 of a first pad part 110 to second pads 211 of a second pad part 210 and may be the same as the plurality of routing lines 410 described above with reference to FIG. 5, and thus, their repetitive descriptions are omitted.

The light emitting display apparatus or the routing portion 400 according to an embodiment of present disclosure may further include an edge coating layer 430.

The edge coating layer 430 may be implemented to cover the routing portion 400. The edge coating layer 430 may be implemented to cover the plurality of routing lines 410. For example, the edge coating layer 430 may be an edge protection layer or an edge insulation layer.

The edge coating layer 430 according to an embodiment of the present disclosure may be implemented to cover all of the first periphery portion and the first outer surface OS1a of the first substrate 100 and the first periphery portion and the first outer surface OS1b of the second substrate 200 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize or reduce the reflection of external light caused by the plurality of routing lines 410 and the first pads 111 of the first pad part 110. As an embodiment, the edge coating layer 430 may include a light blocking material including black ink. As another embodiment, the edge coating layer 430 may implements (or configures) the outermost surface (or sidewall) of the display apparatus (or the display panel), and thus, may include an impact absorbing material (or substance) or a ductile material so as to prevent the damage of an outer surface OS of each of the first and second substrates 100 and 200. As another embodiment, the edge coating layer 430 may include a mixed material of a light blocking material and an impact absorbing material.

According to an embodiment of the present disclosure, the edge coating layer 430 may be formed to surround one outer surface OS of each of the first and second substrates 100 and 200 on which the routing portion 400 is disposed.

According to another embodiment of the present disclosure, as illustrated in FIGS. 5, 12, and 14, the edge coating layer 430 may be formed to surround all of the other outer surfaces OS as well as the one outer surface OS of each of the first and second substrates 100 and 200 on which the routing portion 400 is disposed. For example, the edge coating layer 430 may be formed to surround all outer surfaces OS of each of the first and second substrates 100 and 200. In this case, the one outer surface OS (or a first outer surface) of each of the first and second substrates 100 and 200 may be surrounded by the plurality of routing lines 410 and the edge coating layer 430. The other outer surfaces OS (or second to fourth outer surfaces), except the one outer surface OS, of each of the first and second substrates 100 and 200 may be surrounded by only the edge coating layer 430. For example, the first outer surface of each of the first and second substrates 100 and 200 may include the plurality of routing lines 410 and the edge coating layer 430, and the second to fourth outer surfaces, except the first outer surface, of each of the first and second substrates 100 and 200 may include only the edge coating layer 430.

According to an embodiment of the present disclosure, when the plurality of routing lines 410 and the edge coating layer 430 disposed at the first outer surface are referred to as a first sidewall structure, and the edge coating layer 430 disposed at the second to fourth outer surfaces are referred to as a second sidewall structure, the first sidewall structure and the second sidewall structure may have different thicknesses (or widths). For example, a thickness (or a width) of the second sidewall structure may be thinner or narrower than a thickness (or a width) of the first sidewall structure by a thickness of the plurality of routing lines 410.

Figure 16:
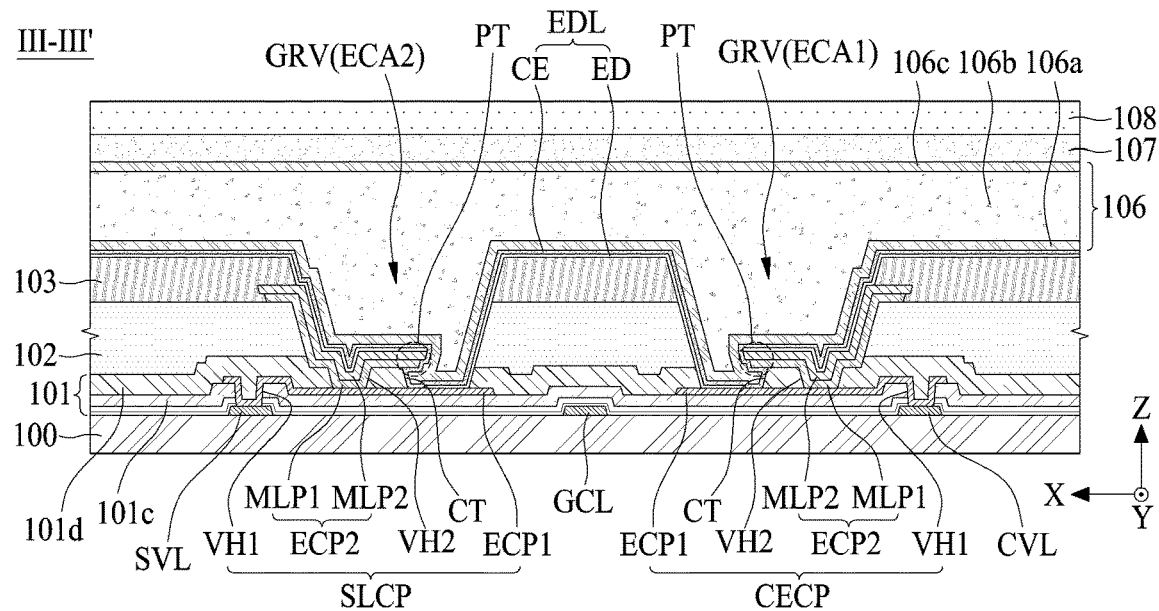
FIG. 16 is a cross-sectional view taken along line III-III' illustrated in FIG. 3.

FIG. 16 is a cross-sectional view taken along line III-III' illustrated in FIG. 3 and is a diagram for describing the common electrode connection portion and the secondary line connection portion illustrated in FIG. 3. In describing FIG. 16, repetitive descriptions of elements which are the same as or correspond to the elements of FIG. 3 are omitted or will be briefly given below.

Referring to FIGS. 3, 12, and 14, each of a plurality of common electrode connection portions CECP according to an embodiment of the present disclosure may be disposed in a first electrode connection area ECA1 between a plurality of pixels P respectively overlapping a plurality of pixel common voltage lines CVL and may electrically connect a common electrode CE to each of the plurality of pixel common voltage lines CVL.

Each of the plurality of common electrode connection portions CECP may include a first electrode connection pattern ECP1, a groove GRV, a second electrode connection pattern ECP2, and a connection trench CT.

With respect to the first direction X, the first electrode connection pattern ECP1 may be disposed over a circuit layer 101 disposed at the first electrode connection area ECA1 between the plurality of pixels P and may be electrically connected (or coupled) to each of the plurality of pixel common voltage lines CVL through a first via hole VH1.

The first electrode connection pattern ECP1 according to an embodiment of the present disclosure may extend long along a first direction X and may be disposed over an interlayer insulation layer 101c of the circuit layer 101 to overlap or intersect with a corresponding pixel common voltage line CVL. The first via hole VH1 may be formed at the interlayer insulation layer 101c disposed at an overlap region between the first electrode connection pattern ECP1 and the pixel common voltage line CVL. The first electrode connection pattern ECP1 may be covered by a passivation layer 101d.

The first electrode connection pattern ECP1 according to an embodiment of the present disclosure may be formed together with a source/drain electrode of a TFT disposed at a pixel. The first electrode connection pattern ECP1 according to another embodiment of the present disclosure may include a metal line layer, directly connected to the pixel common voltage line CVL through the first via hole VH1, and a cover metal layer which covers only a portion of the metal line layer. The cover metal layer (or a clad layer) may prevent the corrosion of the metal line layer.

The groove GRV may be formed to expose a top surface of the circuit layer 101 disposed at the first electrode connection area ECAL. The groove GRV may expose a passivation layer 101d of the circuit layer 101 disposed at the first electrode connection area ECAL. For example, the groove GRV may be formed by a patterning process performed on a portion, disposed at the first electrode connection area ECA1, of a planarization layer 102 covering the circuit layer 101.

The second electrode connection pattern ECP2 may be disposed at the groove GRV and a periphery (or near) of the groove GRV so as to be electrically connected (or coupled) to the first electrode connection pattern ECP1.

The second electrode connection pattern ECP2 according to an embodiment of the present disclosure may be disposed over the planarization layer 102 over the pixel common voltage line CVL and the passivation layer 101d exposed at the first electrode connection area ECA1 and may be electrically connected (or coupled) to the first electrode connection pattern ECP1 through the first via hole VH1 formed at the passivation layer 101d over the first electrode connection pattern ECP1.

The second electrode connection pattern ECP2 according to an embodiment of the present disclosure may be formed together with a pixel electrode PE disposed at a pixel.

According to another embodiment, the second electrode connection pattern ECP2 may include only a metal material which is not damaged or corroded by a patterning process or a trench process of forming the connection trench CT. For example, the second electrode connection pattern ECP2 may include a first metal line pattern MLP1, directly connected (or coupled) to the first electrode connection pattern ECP1 through a second via hole VH2, and a second metal line pattern MLP2 stacked on the first metal line pattern MLP1. For example, the first metal line pattern MLP1 may include indium tin oxide (ITO), and the second metal line pattern MLP2 may include a molybdenum-titanium alloy (MoTi). For example, when the pixel electrode PE is formed in a five-layer structure including a first pixel electrode layer including ITO, a second pixel electrode layer including MoTi, a third pixel electrode layer including ITO, a fourth pixel electrode layer including silver (Ag), and a fifth pixel electrode layer including ITO, the second electrode connection pattern ECP2 may include only the first and second pixel electrode layers, other than the third to fifth pixel electrode layers, of the first to fifth pixel electrode layers of the pixel electrode PE.

The connection trench CT may be formed by a patterning process performed on the passivation layer 101d covering a periphery portion of the first electrode connection pattern ECP1. For example, the connection trench CT may be formed by a patterning process which is performed on the passivation layer 101d after a patterning process is performed on the pixel electrode PE and the second electrode connection pattern ECP2. That is, the connection trench CT may be formed by the same patterning process as a first trench structure material of an isolation portion 104 formed or disposed at an outermost pixel, and thus, its repetitive description is omitted or will be briefly given.

The connection trench CT according to an embodiment of the present disclosure may be formed to expose the passivation layer 101d covering a periphery portion of the first electrode connection pattern ECP1. The connection trench CT may be a lateral surface of the passivation layer 101d disposed between an end of the second electrode connection pattern ECP2 and the periphery portion of the first electrode connection pattern ECP1. For example, the connection trench CT may have an inclined structure or a forward tapered structure, but embodiments of the present disclosure are not limited thereto. Accordingly, the connection trench CT may be an undercut area between the end of the second electrode connection pattern ECP2 and the periphery portion of the first electrode connection pattern ECP1.

The second electrode connection pattern ECP2 may protrude to the outside of the lateral surface of the connection trench CT and may overlap or directly face the periphery portion of the first electrode connection pattern ECP1. The second electrode connection pattern ECP2 may include a protrusion tip PT which protrudes to the outside of the lateral surface of the connection trench CT and faces the first electrode connection pattern ECP1. Therefore, an end portion (or a protrusion tip PT) of each of the first metal line pattern MLP1 and the second metal line pattern MLP2 of the second electrode connection pattern ECP2 may have an eaves structure with reference to the connection trench CT. For example, the protrusion tip PT of the second electrode connection pattern ECP2 may be an eaves structure material corresponding to the connection trench CT. It should be understood that "eaves structure" includes the meaning of an overhang portion. For example, the end portions of the first and second metal line patterns MLP1, MLP2 overhang (e.g., extend past) the upper surface and lateral sidewall of the connection trench CT along the X-axis direction, as shown in FIG. 16.

The second electrode connection pattern ECP2 may be electrically and directly connected to a common electrode CE based on a side contact manner. For example, a deposition material of a self-emitting device ED may have linearity, and thus, may be deposited on a top surface (or an upper surface) of the second electrode connection pattern ECP2 and may not be deposited on a lateral surface and a bottom surface (or a lower surface) of the second electrode connection pattern ECP2. Accordingly, the lateral surface and the bottom surface of the second electrode connection pattern ECP2 may not be covered by the self-emitting device ED and may be exposed at the outside. For example, a lateral surface of the first metal line pattern MLP1 and a lateral surface and a bottom surface of the second metal line pattern MLP2 of the second electrode connection pattern ECP2 may not be covered by the self-emitting device ED and may be exposed at the outside.

The second electrode connection pattern ECP2 may isolate (or disconnect) the self-emitting device ED disposed over the first electrode connection area ECA1. For example, the deposition material of the self-emitting device ED may not be deposited over the lateral surface of the connection trench CT occluded (or covered) by the protrusion tip PT of the second electrode connection pattern ECP2, and thus, may be isolated (or disconnected) at an undercut area by the connection trench CT. Also, the deposition material of the self-emitting device ED deposited over the periphery portion of the first electrode connection pattern ECP1 may be occluded (or covered) by the protrusion tip PT of the second electrode connection pattern ECP2 and may be spaced apart from the lateral surface of the connection trench CT. Accordingly, a portion of the first electrode connection pattern ECP1 which overlaps or is occluded (or covered) by the protrusion tip PT of the second electrode connection pattern ECP2 may not be covered by the deposition material of the self-emitting device ED and may be exposed.

The common electrode CE may be formed over the top surface of the self-emitting device ED and may be deposited over a lateral surface and a bottom surface of the second electrode connection pattern ECP2, and thus, may be electrically and directly connected (or coupled) to the second electrode connection pattern ECP2 based on the side contact manner. For example, the common electrode CE may be formed through a physical deposition process or a chemical deposition process, and at this time, a common electrode material may be deposited over the self-emitting device ED, and moreover, may penetrate into the undercut area by the connection trench CT and may be deposited over the lateral surface and the bottom surface of the second electrode connection pattern ECP2. Therefore, the common electrode CE may be electrically and directly connected (or coupled) to the lateral surface of the first metal line pattern MLP1 and the lateral surface and the bottom surface of the second metal line pattern MLP2 of the second electrode connection pattern ECP2. Accordingly, the common electrode CE may be electrically connected (or coupled) to the pixel common voltage line CVL through the common electrode connection portion CECP even without a process of forming a separate contact hole or a separate contact structure material.

The common electrode CE may be formed to be continued at the undercut area by the connection trench CT without being isolated or disconnected, and thus, may be formed to wholly surround the self-emitting device ED. The common electrode CE according to an embodiment of the present disclosure may penetrate into the undercut area by the connection trench CT and may cover the lateral surface of the connection trench CT, a portion of the first electrode connection pattern ECP1 which is exposed and covered by the protrusion tip PT of the second electrode connection pattern ECP2, and the self-emitting device ED isolated over the first electrode connection pattern ECP1. Therefore, the common electrode CE may be electrically and directly connected (or coupled) to a portion of the first electrode connection pattern ECP1 at an undercut area between the protrusion tip PT of the second electrode connection pattern ECP2 and the first electrode connection pattern ECP1. Accordingly, the common electrode CE may be electrically and directly connected (or coupled) to the protrusion tip PT of the second electrode connection pattern ECP2 and may be directly connected (or coupled) to the first electrode connection pattern ECP1, and thus, an electrical contact area between the common electrode CE and the common electrode connection portion CECP may increase.

Each of a plurality of common electrode connection portions CECP may be surrounded and planarized by an encapsulation layer 106. For example, a first encapsulation layer 106*a* of the encapsulation layer 106 may be disposed over the common electrode CE to surround or cover the common electrode CE. A second encapsulation layer 106*b* of the encapsulation layer 106 may be disposed over the first encapsulation layer 106*a* and may provide a flat surface over the first encapsulation layer 106*a*. Accordingly, a region overlapping the groove GRV formed at each of the plurality of common electrode connection portion CECP may be planarized by the second encapsulation layer 106*b*. The second encapsulation layer 106*b* may be covered by a third encapsulation layer 106*c*.

Each of a plurality of secondary line connection portions SLCP according to an embodiment of the present disclosure may be disposed at a second electrode connection area ECA2 between a plurality of pixels P respectively overlapping a plurality of secondary voltage lines SVL and may electrically connect the common electrode CE to each of the plurality of secondary voltage lines SVL.

Each of the plurality of secondary line connection portions SLCP may include a first electrode connection pattern ECP1, a groove GRV, a second electrode connection pattern ECP2, and a connection trench CT. Except for that each of the plurality of second line connection portions SLCP electrically connects the common electrode CE to a corresponding secondary voltage line of the plurality of secondary voltage lines SVL in the second electrode connection area ECA1 parallel to the first electrode connection area ECA1, each of the plurality of second line connection portions SLCP may be substantially the same as each of the plurality of common electrode connection portions CECP, and thus, like reference numerals refer to like elements and their repetitive descriptions are omitted.

As described above, in the light emitting display apparatus according to the present embodiment, each of pixel common voltage lines CVL disposed in each pixel P of the display area AA may be electrically connected to the common electrode through the common electrode connection portion CECP and the secondary line connection portion SLCP in each pixel P, and thus, a pixel common voltage applied to each pixel P may be uniform, thereby preventing or minimizing a degradation in image quality or luminance non-uniformity caused by the area-based non-uniformity (or deviation) of the pixel common voltage applied to each pixel P.

Figure 17:
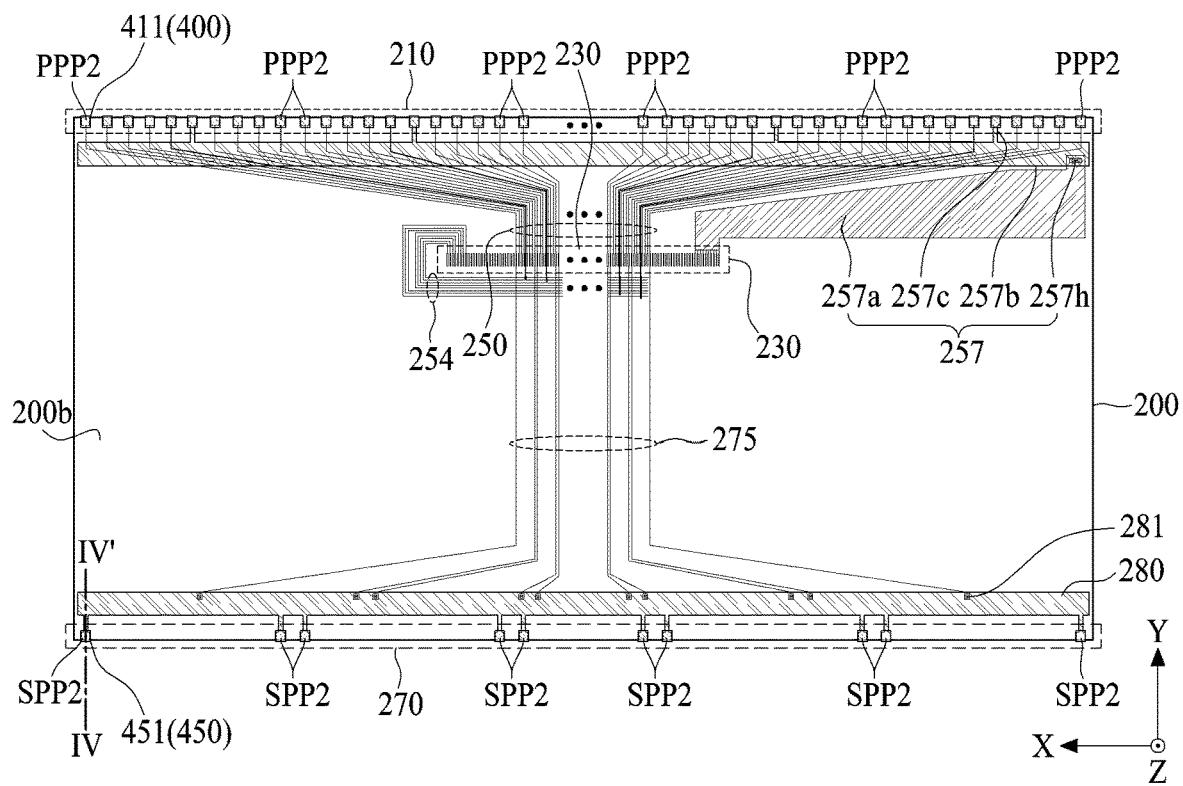
FIG. 17 is a diagram illustrating a second substrate of a light emitting display apparatus according to another embodiment of the present disclosure.
Figure 18:
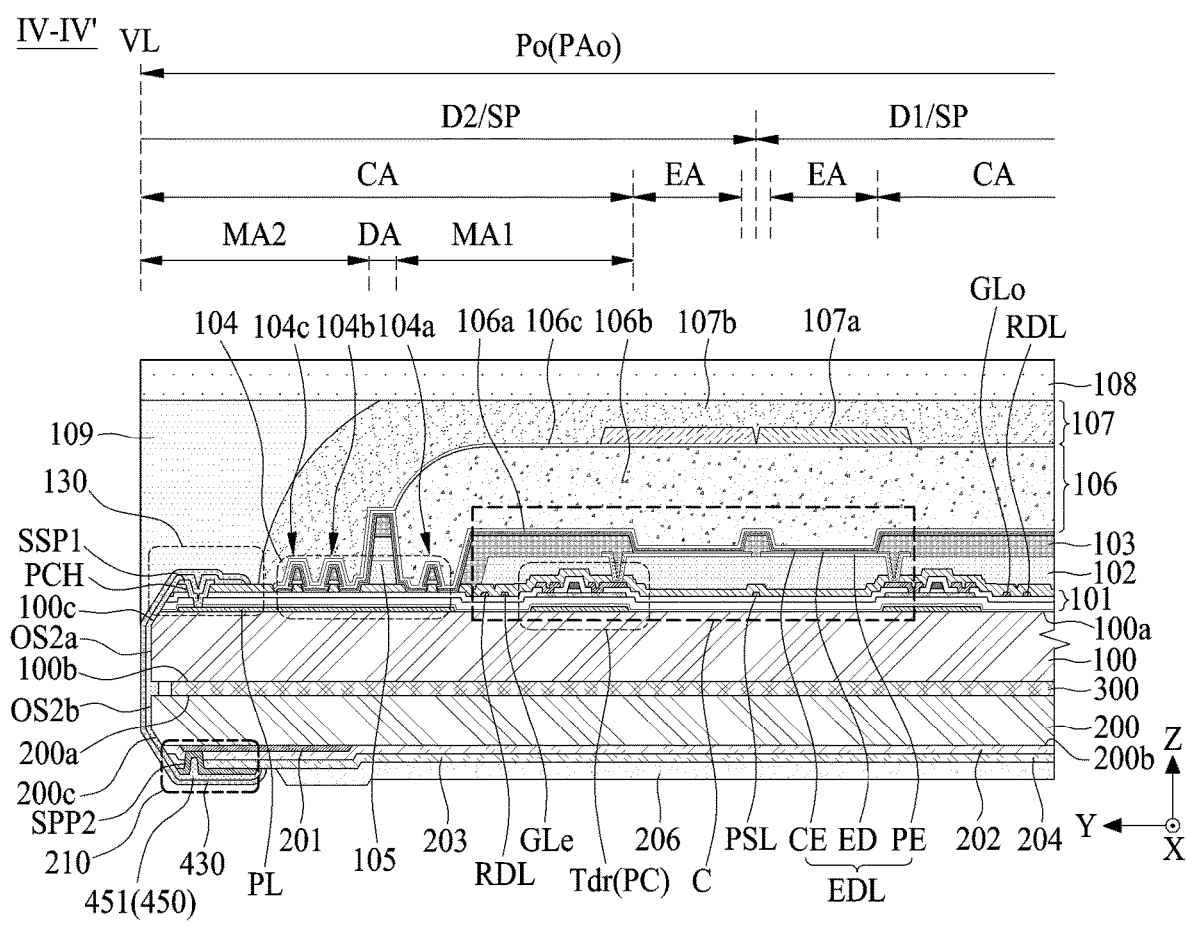
FIG. 18 is a cross-sectional view taken along line IV-IV' illustrated in FIG. 17.

FIG. 17 is a diagram illustrating a second substrate of a light emitting display apparatus according to another embodiment of the present disclosure, and FIG. 18 is a cross-sectional view taken along line IV-IV' illustrated in FIG. 17. FIGS. 17 and 18 illustrate an embodiment implemented by modifying a supply structure of a pixel driving power of the light emitting display apparatus described above with reference to FIGS. 1 to 16. Hereinafter, therefore, repetitive descriptions of elements other than a supply structure of a pixel driving power and elements relevant thereto are omitted or will be briefly given below.

Referring to FIGS. 17 and 18, the light emitting display apparatus according to another embodiment of the present disclosure may further include a secondary pad part 130, a second secondary pad part 270, a plurality of secondary pixel driving power link lines 275, and a secondary routing portion 450. For example, the second secondary pad part may be referred to as an additional pad part or an auxiliary pad part, or the like. For example, the secondary pixel driving power link line may be referred to as an additional pixel driving power link line or an auxiliary pixel driving power link line, or the like. For example, the secondary routing portion may be referred to as an additional routing portion or an auxiliary routing portion, or the like.

The first secondary pad part 130 may include a plurality of outermost pixels Po which are disposed at a second periphery portion (or the other periphery portion), which is parallel to a first periphery portion (or one periphery portion), of a first surface of a first substrate 100.

The first secondary pad part 130 according to an embodiment of the present disclosure may include a plurality of first secondary pixel driving power pads (or first secondary pads) SPP1.

Each of the plurality of first secondary pixel driving power pads SPP1 may be individually (or a one-to-one relationship) connected (or coupled) to the other end of a corresponding pixel driving power line PL of a plurality of pixel driving power lines PL disposed over the first substrate 100. Except for that each of the plurality of first secondary pixel driving power pads SPP1 is connected (or coupled) to the other end of a corresponding pixel driving power line PL of the plurality of pixel driving power lines PL, each of the plurality of first secondary pixel driving power pads SPP1 may be implemented or formed in the same structure as that of each of a plurality of first pixel driving power pads PPP1, and thus, their repetitive descriptions are omitted.

The second secondary pad part 270 may be disposed at the other periphery portion (or a second rear periphery portion) of a rear surface 200b of a second substrate 200 overlapping the first secondary pad part 130 disposed over a front surface of the first substrate 100.

The second secondary pad part 270 according to an embodiment of the present disclosure may include a plurality of second secondary pixel driving power pads (or second secondary pads) SPP2.

Each of the plurality of second secondary pixel driving power pads SPP2 may be disposed at the other periphery portion of the rear surface 200b of a second substrate 200 overlapping a corresponding first secondary pixel driving power pad SPP1 of the plurality of first secondary pixel driving power pads SPP1 disposed over the front surface of the first substrate 100. Except for that each of the plurality of second secondary pixel driving power pads SPP2 is disposed at the second rear periphery portion of a second substrate 200, each of the plurality of second secondary pixel driving power pads SPP2 may be implemented or formed in the same structure as that of each of a plurality of second pixel driving power pads PPP2, and thus, their detailed descriptions are omitted.

The plurality of secondary pixel driving power link lines (or secondary link lines) 275 may be disposed over the rear surface 200b of the second substrate 200 and may electrically connect (or couple) the third pad part 250 to the second secondary pad part 270. The plurality of secondary pixel driving power link lines 275 may individually (or a one-to-one relationship) connect (or couple) each of third pixel driving power pads of the third pad part 250 to a corresponding second secondary pixel driving power pad SPP2 of the second secondary pixel driving power pads SPP2. Except for that the third pixel driving power pads are electrically connected (or coupled) to the second secondary pixel driving power pads SPP2, the secondary pixel driving power link lines 275 may be the same as the pixel driving power link lines 255, and thus, their repetitive descriptions are omitted.

The secondary routing portion 450 may be disposed to surround a second outer surface OS2a, which is parallel to a first outer surface OS1a, of the first substrate 100 and a second outer surface OS2b, which is parallel to a first outer surface OS1b, of the second substrate 200 and may individually (or a one-to-one relationship) connect (or couple) the first secondary pixel driving power pads SPP1 to the second secondary pixel driving power pads SPP2.

The secondary routing portion 450 according to an embodiment of the present disclosure may include a plurality of secondary pixel power routing lines (or secondary routing lines) 451.

Each of the plurality of secondary pixel power routing lines 451 may be disposed to surround the second outer surface OS2a of the first substrate 100 and the second outer surface OS2b of the second substrate 200 and may individually (or a one-to-one relationship) connect (or couple) the first secondary pixel driving power pads SPP1 to the second secondary pixel driving power pads SPP2. Except for that each of the plurality of secondary pixel power routing lines 451 is disposed to surround the second outer surface OS2a of the first substrate 100 and the second outer surface OS2b of the second substrate 200, each of the plurality of secondary pixel power routing lines 451 may be the same as the pixel power routing line 411, and thus, their descriptions are omitted.

According to an embodiment of the present disclosure, a pixel driving power supplied from a driving circuit part to the third pixel driving power pads of the third pad part 250 may be supplied to one side of each of the pixel driving power lines PL through the pixel driving power link lines 255, the second pixel driving power pads PPP2, the pixel power routing lines 411, and the first pixel driving power pads PPP1, and simultaneously, may be supplied to the other side of each of the pixel driving power lines PL through the secondary pixel driving power link lines 275, the second secondary pixel driving power pads SPP2, the secondary pixel power routing lines 451, and the first secondary pixel driving power pads SPP1.

The light emitting display apparatus according to another embodiment of the present disclosure may further include a pixel driving power common line 280 which is disposed at a second rear periphery portion of the second substrate 200.

The pixel driving power common line (or a secondary common line) 280 may be disposed at the second rear periphery portion of the second substrate 200 so as to be adjacent to the second secondary pad part 270. The pixel driving power common line 280 according to an embodiment of the present disclosure may be disposed in parallel with a first direction X and may be connected to each of the second secondary pixel driving power pads SPP2. For example, the pixel driving power common line 280 may have a bar shape having a relatively wide size (or area) so as to minimize or reduce the voltage drop of the pixel driving power. For example, the pixel driving power common line 280 may be formed together with a second common link line 257b of the pixel common power link line 257.

The pixel driving power common line 280 according to an embodiment of the present disclosure may include a plurality of protrusion lines which are electrically and respectively connected (or coupled) to the second secondary pixel driving power pads SPP2. For example, each of the second secondary pixel driving power pads SPP2 may be a protrusion line which protrudes from the pixel driving power common line 280.

The pixel driving power common line 280 may overlap end portions of the secondary pixel driving power link lines 275 and may be connected to the end portions of the secondary pixel driving power link lines 275 through line contact holes 281 in common. Therefore, the pixel driving power supplied from the driving circuit part to the third pixel driving power pads of the third pad part 250 may be supplied to the one side of each of the pixel driving power lines PL through the pixel driving power link lines 255, the second pixel driving power pads PPP2, the pixel power routing lines 411, and the first pixel driving power pads PPP1, and simultaneously, may be supplied to the other side of each of the pixel driving power lines PL through the secondary pixel driving power link lines 275, the pixel driving power common line 280, the second secondary pixel driving power pads SPP2, the secondary pixel power routing lines 451, and the first secondary pixel driving power pads SPP1.

In the light emitting display apparatus according to the present embodiment, the pixel driving power may be simultaneously supplied to the one side and the other side of each of the pixel driving power lines PL based on a double feeding scheme, and thus, the voltage drop (IR drop) of the pixel driving power caused by a line resistance of the pixel driving power line PL may be better prevented, reduced or minimized. Accordingly, the light emitting display apparatus according to the present embodiment may better prevent, reduce or minimize an image quality defect caused by a deviation of the pixel driving power supplied to each pixel P provided in a display area AA.

In FIG. 17, the double feeding manner corresponding to the pixel driving power is shown, but embodiments of the present disclosure are not limited thereto and a reference voltage supplied to each pixel may also be simultaneously supplied to one side and the other side of each of reference voltage lines based on a double feeding manner and a pixel common voltage supplied to each pixel may also be simultaneously supplied to one side and the other side of each of pixel common voltage lines based on a double feeding manner. A double feeding manner corresponding to at least one of the reference voltage and the pixel common voltage may be implemented or formed in the same structure as the double feeding manner corresponding to the pixel driving power, and thus, their repetitive descriptions are omitted.

Figure 19:
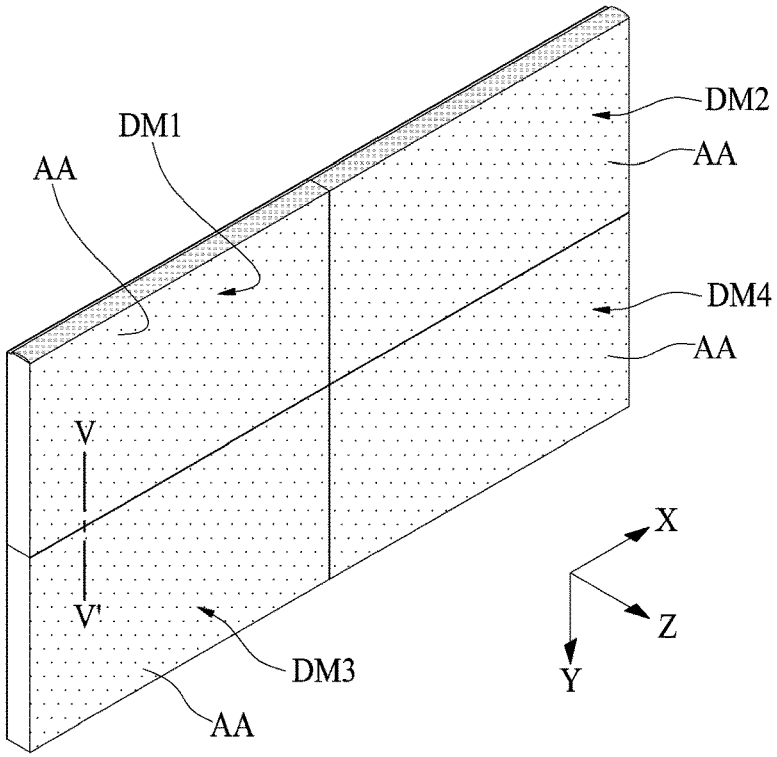
FIG. 19 is a diagram illustrating a multi-screen display apparatus according to an embodiment of the present disclosure.
Figure 20:
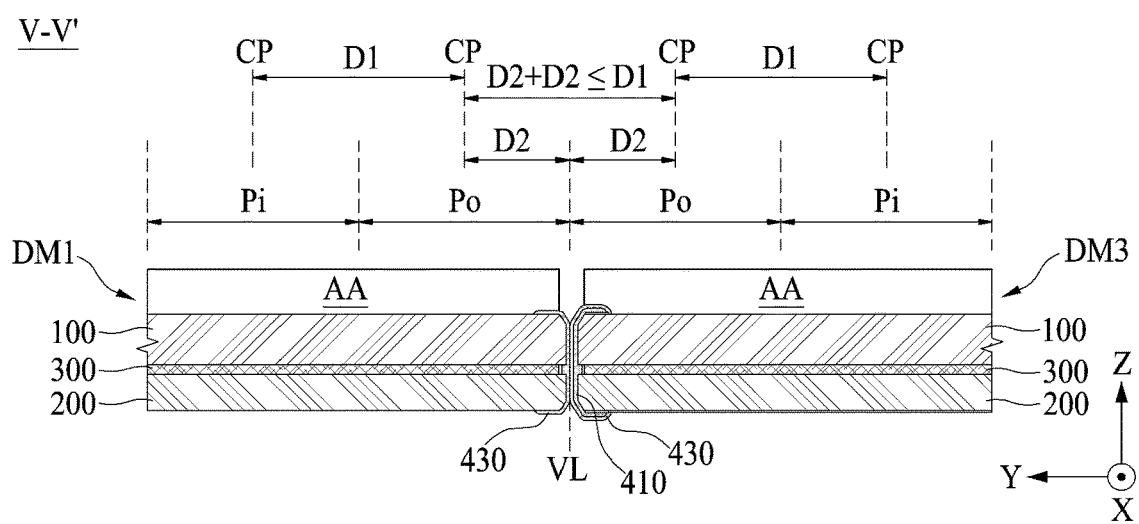
FIG. 20 is a cross-sectional view taken along line V-V' illustrated in FIG. 19.

FIG. 19 is a diagram illustrating a multi-screen display apparatus according to an embodiment of the present disclosure, and FIG. 20 is a cross-sectional view taken along line V-V' illustrated in FIG. 19. FIGS. 19 and 20 illustrate a multi-screen display apparatus implemented by tiling the light emitting display apparatus according to another embodiment of the present disclosure illustrated in FIGS. 1 to 18.

Referring to FIGS. 19 and 20, the multi-screen display apparatus (or a tiling light emitting display apparatus) according to an embodiment of the present disclosure may include a plurality of display devices DM1 to DM4.

The plurality of display devices DM1 to DM4 may each display an individual image or may divisionally display one image. Each of the plurality of display devices DM1 to DM4 may include the light emitting display apparatus according to an embodiment of the present disclosure illustrated in FIGS. 1 to 18, and thus, their repetitive descriptions are omitted or will be briefly given.

The plurality of display devices DM1 to DM4 may be tiled on a separate tiling frame to contact each other at a lateral surface thereof. For example, the plurality of display devices DM1 to DM4 may be tiled to have an N×M form, thereby implementing a multi-screen display apparatus having a large screen. For example, N is a positive integer of 1 or more and M is a positive integer of 2 or more, but embodiments of the present disclosure are not limited thereto, for example, N is a positive integer of 2 or more and M is a positive integer of 1 or more.

Each of the plurality of display devices DM1 to DM4 may not include a bezel area (or a non-display portion) surrounding all of a display area AA where an image is displayed, and may have an air-bezel structure where the display area AA is surrounded by air. For example, in each of the plurality of display devices DM1 to DM4, all of a first surface of a first substrate 100 may be implemented as the display area AA.

According to an embodiment of the present disclosure, in each of the plurality of display devices DM1 to DM4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display devices DM1 to DM4 coupled to (or contacting) each other at lateral surfaces thereof along the first direction X and the second direction Y based on a lateral coupling manner, an interval "D2+D2" between adjacent outermost pixel areas PAo may be equal to or less than the first interval D1 between two adjacent pixels. Referring to FIG. 20, in first and third display devices DM1 and DM3 coupled to (or contacting) each other at lateral surfaces thereof along the second direction Y, the interval "D2+D2" between a center portion CP of an outermost pixel Po of the first display device DM1 and a center portion CP of an outermost pixel Po of the third display device DM3 may be equal to or less than the first interval D1 (or a pixel pitch) between two adjacent pixels disposed at each of the first and third display devices DM1 and DM3.

Therefore, the interval "D2+D2" between center portions CP of outermost pixels Po of two adjacent display devices DM1 to DM4 coupled to (or contacting) each other at lateral surfaces thereof along the first direction X and the second direction Y may be equal to or less than the first interval D1 between two adjacent pixels disposed at each of the display devices DM1 to DM4, and thus, there may be no seam or boundary portion between two adjacent display devices DM1 to DM4, whereby there may be no dark area caused by a boundary portion provided between the display devices DM1 to DM4. As a result, the image displayed on the multi-screen display apparatus in which the plurality of display devices DM1, DM2, DM3, and DM4 are tiled in an N×M form may be displayed continuously without a sense of disconnection (or discontinuity) at boundary portion between the plurality of display devices DM1, DM2, DM3, and DM4.

In FIGS. 19 and 20, it is illustrated that the plurality of display devices DM1 to DM4 are tiled in a 2×2 form, but embodiments of the present disclosure are not limited thereto, and the plurality of display devices DM1 to DM4 may be tiled in an x×1 form, a 1×y form, or an x×y form. For example, in the x×1 form, x may be a natural number greater than or equal to 2, in the 1×y form, y may be a natural number greater than or equal to 2, and in the x×y form, x and y may be natural numbers greater than or equal to 2 and may be equal to or different from each other. For example, in the x×y form, x may be a natural number greater than or equal to 2 and may be equal to y, or x and y may be natural numbers greater than or equal to 2 with y greater or less than x.

As described above, when display area AA of each of the plurality of display devices DM1 to DM4 is one screen and displays one image, a multi-screen display apparatus according to an embodiment of the present disclosure may display an image which is not disconnected and is continuous at a boundary portion between the plurality of display devices DM1 to DM4, and thus, the immersion of a viewer watching an image displayed by the multi-screen display apparatus may be enhanced.

A light emitting display apparatus and multi-screen display apparatus including the same according to an embodiment of the present disclosure will be described below.

A light emitting display apparatus according to an embodiment of the present disclosure may comprise a display area configured to include a plurality of pixels disposed in first to $m^{th}$ horizontal lines parallel to a first direction over a first substrate; a plurality of gate lines disposed at the first to $m^{th}$ horizontal lines of the display area in parallel with the first direction; a plurality of gate control lines disposed between the plurality of pixels along a second direction crossing the first direction; and a gate driving circuit including first to $m^{th}$ stage circuit parts disposed at the display area and selectively coupled to the plurality of gate lines and the plurality of gate control lines, wherein each of the first to $m^{th}$ stage circuit parts may comprise a plurality of branch circuits dispersively disposed between the plurality of pixels along the first direction and selectively coupled to the plurality of gate control lines; and a branch network selectively coupled to the plurality of branch circuits, and wherein each of the branch network of the first stage circuit unit and the branch network of the $m^{th}$ stage circuit unit may be disposed between two adjacent pixels along the second direction.

According to some embodiments of the present disclosure, the branch network of the first stage circuit unit may be disposed between the first and second horizontal lines, and the branch network of the $m^{th}$ stage circuit unit may be disposed between the m-$1^{th}$ and $m^{th}$ horizontal lines.

According to some embodiments of the present disclosure, the branch networks of each of the first to $m^{th}$ stage circuit parts may be divided into first to $m^{th}$ branch networks, and each of a 2k-$1^{th}$ branch network and a $2k^{th}$ branch network of the first to $m^{th}$ branch networks may be disposed between the 2k-$1^{th}$ horizontal line and the $2k^{th}$ horizontal line, and wherein k is a natural number and 2k is equal to or less than m.

According to some embodiments of the present disclosure, a region between the 4n-$2^{th}$ horizontal line and the 4n-$1^{th}$ horizontal line of the first to $m^{th}$ horizontal lines may be non-disposition region of the branch network, and n is a natural number and 4n is less than m.

According to some embodiments of the present disclosure, the light emitting display apparatus may further comprise a plurality of pixel common voltage lines disposed parallel to the second direction and disposed between the plurality of pixels along the first direction, a common electrode disposed over the display area, and a plurality of common voltage connection portions electrically and respectively coupling the plurality of pixel common voltage lines to the common electrode.

According to some embodiments of the present disclosure, each of the first to $m^{th}$ horizontal lines may be divided into a first region and a second region with respect to the second direction, the branch network may be disposed at one region of the first region and the second region, and the common voltage connection portion may be disposed at the other region of the first region and the second region.

According to some embodiments of the present disclosure, a common electrode connection portion disposed at the 2k-$1^{th}$ horizontal line of the first to $m^{th}$ horizontal lines may be disposed at the first region of the branch network, and a common electrode connection portion disposed at the $2k^{th}$ horizontal line of the first to $m^{th}$ horizontal lines may be disposed at the second region of the branch network.

According to some embodiments of the present disclosure, a region between the 4n-$3^{th}$ horizontal line and the 4n-$2^{th}$ horizontal line of the first to $m^{th}$ horizontal lines may be a disposition region of the branch network and a non-disposition region of the common electrode connection portion, a region between the 4n-$2^{th}$ horizontal line and the 4n-$1^{th}$ horizontal line of the first to $m^{th}$ horizontal lines may be a non-disposition region of the branch network and a disposition region of the common electrode connection portion, and a region between the 4n-$1^{th}$ horizontal line and the $4n^{th}$ horizontal line of the first to $m^{th}$ horizontal lines may be a disposition region of the branch network and a non-disposition region of the common electrode connection portion, and n is a natural number and 4n is equal to or less than m.

According to some embodiments of the present disclosure, each of the plurality of common voltage connection portions may comprise a first electrode connection pattern electrically coupled to the pixel common voltage line, a passivation layer covering the first electrode connection pattern, a second electrode connection pattern disposed over the passivation layer and electrically coupled to the first electrode connection pattern, and a connection trench including an undercut area formed by removing the passivation layer between an end portion of the second electrode connection pattern and the first electrode connection pattern, and the common electrode may be electrically coupled to a lateral surface and a bottom surface of the end portion of the second electrode connection pattern.

According to some embodiments of the present disclosure, the end portion of the second electrode connection pattern may have an eaves structure with respect to the connection trench, and the common electrode may be electrically coupled to the first electrode connection pattern at the undercut area.

According to some embodiments of the present disclosure, the light emitting display apparatus may further comprise a plurality of secondary voltage lines disposed in parallel with the plurality of pixel common voltage lines with each of the plurality of gate control lines therebetween, a line connection pattern electrically coupling adjacent pixel common voltage lines and secondary voltage lines, and a plurality of secondary line connection portions disposed in parallel with the plurality of common voltage connection portions to electrically couple each of the plurality of secondary voltage lines to the common electrode.

According to some embodiments of the present disclosure, the light emitting display apparatus may further comprise a first pad part disposed at one periphery portion of the first substrate, a second substrate coupled to a rear surface of the first substrate by a coupling member, a second pad part disposed at a rear surface of the second substrate to overlap the first pad part, a third pad part disposed at the rear surface of the first substrate and electrically coupled to the second pad part, a driving circuit part coupled to the third pad part, and a routing portion disposed at a first outer surface of each of the first and second substrates and electrically coupled to the first pad part and the second pad part.

According to some embodiments of the present disclosure, the light emitting display apparatus may further comprise a first secondary pad part disposed at the other periphery portion parallel to the one periphery portion of the first substrate, a second secondary pad part disposed at the rear surface of the second substrate to overlap the first secondary pad and electrically coupled to the third pad part, and a secondary routing portion disposed at a second outer surface parallel to the first outer surface of each of the first and second substrates and electrically coupled to the first secondary pad part and the second secondary pad part.

According to some embodiments of the present disclosure, the light emitting display apparatus may further comprise a plurality of pixel driving power lines disposed at the display area of the first substrate and coupled to each of the plurality of pixels, one portion of each of the plurality of pixel driving power lines may be electrically coupled to the first pad part, and the other portion of each of the plurality of pixel driving power lines may be electrically coupled to the first secondary pad part.

According to some embodiments of the present disclosure, the driving circuit part may supply a pixel driving power to the third pad part, and the pixel driving power may be supplied to the one portion of each of the plurality of pixel driving power lines through the third pad part, the second pad part, the routing portion, and the first pad part, and may be supplied to the other portion of each of the plurality of pixel driving power lines through the third pad part, the second secondary pad part, the secondary routing portion, and the first secondary pad part.

According to some embodiments of the present disclosure, the light emitting display apparatus may further comprise a plurality of secondary link lines disposed at the rear surface of the second substrate and electrically coupled between the third pad part and the second secondary pad part.

According to some embodiments of the present disclosure, the light emitting display apparatus may further comprise a secondary common line disposed at the rear surface of the second substrate and electrically coupled to the second secondary pad part, and a plurality of secondary link lines disposed at the rear surface of the second substrate and electrically coupled between the third pad part and the secondary common line.

According to some embodiments of the present disclosure, a size of the display area may be the same as a size of the first substrate, or a distance between a center portion of an outermost pixels of the plurality of pixels and an outer surface of the first substrate may be half or less of a pixel pitch, and the pixel pitch may be a distance between center portions of two adjacent pixels to each other.

A multi-screen display apparatus according to some embodiments of the present disclosure may comprise a plurality of display devices disposed along at least one direction of a first direction and a second direction crossing the first direction, each of the plurality of display devices may comprise a light emitting display apparatus, and the light emitting display apparatus according to an embodiment of the present disclosure may comprise a display area configured to include a plurality of pixels disposed in first to $m^{th}$ horizontal lines parallel to the first direction over a first substrate; a plurality of gate lines disposed at the first to $m^{th}$ horizontal lines of the display area in parallel with the first direction; a plurality of gate control lines disposed between the plurality of pixels along the second direction; and a gate driving circuit including first to $m^{th}$ stage circuit parts disposed at the display area and selectively coupled to the plurality of gate lines and the plurality of gate control lines, wherein each of the first to $m^{th}$ stage circuit parts may comprise a plurality of branch circuits dispersively disposed between the plurality of pixels along the first direction and selectively coupled to the plurality of gate control lines; and a branch network selectively coupled to the plurality of branch circuits, and wherein each of the branch network of the first stage circuit unit and the branch network of the $m^{th}$ stage circuit unit may be disposed between two adjacent pixels along the second direction.

According to some embodiments of the present disclosure, in a first display device and a second display device adjacent along at least one direction of the first direction and the second direction, a distance between a center portion of an outermost pixel of the first display device and a center portion of an outermost pixel of the second display device may be less than or equal to a pixel pitch, and the pixel pitch may be a distance between center portions of pixels adjacent along at least one direction of the first direction and the second direction.

The light emitting display apparatus according to the present disclosure may be applied to all electronic devices including a display panel. For example, the light emitting display apparatus according to the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, notebook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus comprising:
a display area including a plurality of pixels disposed in first to $m^{th}$ horizontal lines parallel to a first direction over a first substrate;
a plurality of gate lines disposed at the first to $m^{th}$ horizontal lines of the display area in parallel with the first direction;
a plurality of gate control lines disposed between the plurality of pixels along a second direction crossing the first direction; and
a gate driving circuit including first to $m^{th}$ stage circuit parts disposed at the display area and selectively coupled to the plurality of gate lines and the plurality of gate control lines,
wherein each of the first to $m^{th}$ stage circuit parts includes:
a plurality of branch circuits dispersively disposed between the plurality of pixels along the first direction and selectively coupled to the plurality of gate control lines; and
a branch network selectively coupled to the plurality of branch circuits, and
wherein each of the branch network of the first stage circuit unit and the branch network of the $m^{th}$ stage circuit unit is disposed between two adjacent pixels along the second direction.

2. The light emitting display apparatus of claim 1, wherein the branch network of the first stage circuit unit is disposed between the first and second horizontal lines, and
wherein the branch network of the $m^{th}$ stage circuit unit is disposed between the $m-1^{th}$ and $m^{th}$ horizontal lines.

3. The light emitting display apparatus of claim 1, wherein the branch networks of each of the first to $m^{th}$ stage circuit parts are divided into first to $m^{th}$ branch networks, and
wherein each of a $2k-1^{th}$ branch network and a $2k^{th}$ branch network of the first to $m^{th}$ branch networks is disposed between the $2k-1^{th}$ horizontal line and the $2k^{th}$ horizontal line, k being a natural number and 2k being equal to or less than m.

4. The light emitting display apparatus of claim 1, wherein a region between a 4n-2th horizontal line and a $4n-1^{th}$ horizontal line of the first to $m^{th}$ horizontal lines is a non-disposition region of the branch network, n being a natural number and 4n being less than m.

5. The light emitting display apparatus of claim 1, further comprising:
a plurality of pixel common voltage lines disposed parallel to the second direction and disposed between the plurality of pixels along the first direction;
a common electrode disposed over the display area; and
a plurality of common voltage connection portions electrically and respectively coupling the plurality of pixel common voltage lines to the common electrode.

6. The light emitting display apparatus of claim 5, wherein each of the first to $m^{th}$ horizontal lines is divided into a first region and a second region with respect to the second direction,
wherein the branch network is disposed at one region of the first region and the second region, and
wherein the common voltage connection portion is disposed at the other region of the first region and the second region.

7. The light emitting display apparatus of claim 6, wherein a common electrode connection portion disposed at a $2k-1^{th}$ horizontal line of the first to $m^{th}$ horizontal lines is disposed at the first region of the branch network, and
wherein a common electrode connection portion disposed at a $2k^{th}$ horizontal line of the first to $m^{th}$ horizontal lines is disposed at the second region of the branch network.

8. The light emitting display apparatus of claim 7, wherein a region between a $4n-3^{th}$ horizontal line and a $4n-2^{th}$ horizontal line of the first to $m^{th}$ horizontal lines is a disposition region of the branch network and a non-disposition region of the common electrode connection portion,
wherein a region between the $4n-2^{th}$ horizontal line and a $4n-1^{th}$ horizontal line of the first to $m^{th}$ horizontal lines is a non-disposition region of the branch network and a disposition region of the common electrode connection portion, and
wherein a region between the $4n-1^{th}$ horizontal line and a $4n^{th}$ horizontal line of the first to $m^{th}$ horizontal lines is a disposition region of the branch network and a non-disposition region of the common electrode connection portion.

9. The light emitting display apparatus of claim 6, wherein each of the plurality of common voltage connection portions comprises:
a first electrode connection pattern electrically coupled to the pixel common voltage line;
a passivation layer covering the first electrode connection pattern;
a second electrode connection pattern disposed over the passivation layer and electrically coupled to the first electrode connection pattern; and a connection trench including an undercut area formed by removing the passivation layer between an end portion of the second electrode connection pattern and the first electrode connection pattern, and wherein the common electrode is electrically coupled to a lateral surface and a bottom surface of the end portion of the second electrode connection pattern.

10. The light emitting display apparatus of claim 9, wherein the end portion of the second electrode connection pattern has an eaves structure with respect to the connection trench, and wherein the common electrode is electrically coupled to the first electrode connection pattern at the undercut area.

11. The light emitting display apparatus of claim 5, further comprising:
a plurality of secondary voltage lines disposed in parallel with the plurality of pixel common voltage lines with each of the plurality of gate control lines therebetween;
a line connection pattern electrically coupling adjacent pixel common voltage lines and secondary voltage lines; and
a plurality of secondary line connection portions disposed in parallel with the plurality of common voltage connection portions to electrically couple each of the plurality of secondary voltage lines to the common electrode.

12. The light emitting display apparatus of claim 1, further comprising:
a first pad part disposed at one periphery portion of the first substrate;
a second substrate coupled to a rear surface of the first substrate by a coupling member;
a second pad part disposed at a rear surface of the second substrate to overlap the first pad part;
a third pad part disposed at the rear surface of the first substrate and electrically coupled to the second pad part;
a driving circuit part coupled to the third pad part; and
a routing portion disposed at a first outer surface of each of the first and second substrates and electrically coupled to the first pad part and the second pad part.

13. The light emitting display apparatus of claim 12, further comprising:
a first secondary pad part disposed at the other periphery portion parallel to the one periphery portion of the first substrate;
a second secondary pad part disposed at the rear surface of the second substrate to overlap the first secondary pad and electrically coupled to the third pad part; and
a secondary routing portion disposed at a second outer surface parallel to the first outer surface of each of the first and second substrates and electrically coupled to the first secondary pad part and the second secondary pad part.

14. The light emitting display apparatus of claim 13, further comprising a plurality of pixel driving power lines disposed at the display area of the first substrate and coupled to each of the plurality of pixels,
wherein one portion of each of the plurality of pixel driving power lines is electrically coupled to the first pad part, and
wherein the other portion of each of the plurality of pixel driving power lines is electrically coupled to the first secondary pad part.

15. The light emitting display apparatus of claim 14, wherein the driving circuit part supplies a pixel driving power to the third pad part, and
wherein the pixel driving power is supplied to the one portion of each of the plurality of pixel driving power lines through the third pad part, the second pad part, the routing portion, and the first pad part, and is supplied to the other portion of each of the plurality of pixel driving power lines through the third pad part, the second secondary pad part, the secondary routing portion, and the first secondary pad part.

16. The light emitting display apparatus of claim 14, further comprising a plurality of secondary link lines disposed at the rear surface of the second substrate and electrically coupled between the third pad part and the second secondary pad part.

17. The light emitting display apparatus of claim 14, further comprising:
a secondary common line disposed at the rear surface of the second substrate and electrically coupled to the second secondary pad part; and
a plurality of secondary link lines disposed at the rear surface of the second substrate and electrically coupled between the third pad part and the secondary common line.

18. The light emitting display apparatus of claim 1, wherein a size of the display area is the same as a size of the first substrate, or
wherein a distance between a center portion of an outermost pixels of the plurality of pixels and an outer surface of the first substrate is half or less of a pixel pitch, and
wherein the pixel pitch is a distance between center portions of two adjacent pixels to each other.

19. A multi-screen display apparatus comprising:
a plurality of display devices disposed along at least one direction of a first direction and a second direction crossing the first direction,
wherein each of the plurality of display devices includes a light emitting display apparatus, the light emitting display apparatus including:
a display area including a plurality of pixels disposed in first to $m^{th}$ horizontal lines parallel to the first direction over a first substrate;
a plurality of gate lines disposed at the first to $m^{th}$ horizontal lines of the display area in parallel with the first direction;
a plurality of gate control lines disposed between the plurality of pixels along the second direction; and
a gate driving circuit including first to $m^{th}$ stage circuit parts disposed at the display area and selectively coupled to the plurality of gate lines and the plurality of gate control lines,
wherein each of the first to $m^{th}$ stage circuit parts includes:
a plurality of branch circuits dispersively disposed between the plurality of pixels along the first direction and selectively coupled to the plurality of gate control lines; and
a branch network selectively coupled to the plurality of branch circuits, and
wherein each of the branch network of the first stage circuit unit and the branch network of the $m^{th}$ stage circuit unit is disposed between two adjacent pixels along the second direction.

20. The multi-screen display apparatus of claim 19, wherein in a first display device and a second display device adjacent along at least one direction of the first direction and the second direction, a distance between a center portion of an outermost pixel of the first display device and a center portion of an outermost pixel of the second display device is less than or equal to a pixel pitch, and wherein the pixel pitch is a distance between center portions of pixels adjacent along at least one direction of the first direction and the second direction.

* * * * *